(12) United States Patent
Fedigan

(10) Patent No.: US 10,663,519 B2
(45) Date of Patent: May 26, 2020

(54) MOTOR WINDING FAULT DETECTION CIRCUITS AND METHODS TO DETECT MOTOR WINDING FAULTS

(71) Applicant: TEXAS INSTRUMENTS INCORPORATED, Dallas, TX (US)

(72) Inventor: Stephen John Fedigan, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/208,344

(22) Filed: Dec. 3, 2018

(65) Prior Publication Data

US 2019/0107580 A1    Apr. 11, 2019

Related U.S. Application Data

(63) Continuation of application No. 14/755,069, filed on Jun. 30, 2015, now Pat. No. 10,145,897.

(51) Int. Cl.
*G01R 31/34*    (2020.01)

(52) U.S. Cl.
CPC ......... *G01R 31/346* (2013.01); *G01R 31/343* (2013.01)

(58) Field of Classification Search
None
See application file for complete search history.

(56) References Cited

U.S. PATENT DOCUMENTS 5,270,640 A   12/1993 Kohler et al.
5,378,979 A   1/1995  Lombardi
5,917,428 A   6/1999  Discenzo et al.
6,236,227 B1  5/2001  Kliman et al.
10,145,897 B2 * 12/2018 Fedigan ............... G01R 31/343
(Continued)

FOREIGN PATENT DOCUMENTS

CN    101025434 A    8/2007
CN    101927700 A    12/2010
(Continued)

OTHER PUBLICATIONS

Kliman et al., "A New Approach to On-Line Turn Fault Detection in AIC Motors," 1996, 7 pages.
(Continued)

*Primary Examiner* — Steven B Gauthier
(74) *Attorney, Agent, or Firm* — Michael A. Davis, Jr.; Charles A. Brill; Frank D. Cimino

(57) ABSTRACT

An example fault detection circuit includes: a positive sequence voltage calculator to calculate a positive sequence voltage value for a three-phase motor; a positive sequence current calculator to calculate a positive sequence current value for the three-phase motor; an interpolator to calculate an expected negative sequence voltage value based on the positive sequence voltage value, the positive sequence current value, and measured characteristics of the three-phase motor; a negative sequence voltage calculator to calculate a measured negative sequence voltage value for the three-phase motor; and a fault detector to detect that a winding fault exists in the three-phase motor when a difference between the expected negative sequence voltage value and the measured negative sequence voltage value satisfies a threshold.

17 Claims, 34 Drawing Sheets

(56) References Cited

U.S. PATENT DOCUMENTS

| | | |
|---|---|---|
| 2007/0211396 A1 | 9/2007 | Gunji |
| 2010/0320953 A1 | 12/2010 | Yeh et al. |
| 2014/0320148 A1 | 10/2014 | Sharma et al. |
| 2016/0054421 A1 | 2/2016 | Horstmann |

FOREIGN PATENT DOCUMENTS

| | | |
|---|---|---|
| CN | 103782509 A | 5/2014 |
| DE | 69324107 T2 | 9/1999 |
| RU | 2016457 C1 | 7/1994 |

OTHER PUBLICATIONS

Lee et al., "A Robust, On-Line Turn-Fault Detection Technique for Induction Machines Based on Monitoring the Sequence Component Impedance Matrix," May 2003, 8 pages, IEEE Transactions on Power Electronics, vol. 18, No. 3.

Tallam et al., "Stator Winding Turn-Fault Detection for Closed-Loop Induction Motor Drives," May 2003, 5 pages, IEEE Transactions on Industry Applications, vol. 39, No. 3.

Barendse et al., "A New Algorithm for the Detection of Faults in Permanent Magnet Machines," 2006, 6 pages.

Nejjari, "Model-Based Fault Detection Using Adaptive Observer," 2006, 6 pages.

Amaral et al., "Statistic Moment Based Method for the Detection and Diagnosis of Induction Motor Stator Fault," Apr. 12-14, 2007, 5 pages, Powereng 2007, Setubal, Portugal.

Lee et al., "A Phase Variable Simulation Model for Interior PM Synchronous Motor Drives with Stator Turn Faults," 2004, 6 pages.

Khov et al., "Monitoring of Turn Short-Circuit Faults in Stator of PMSM in Closed Loop by On-line Parameter Estimation," 2009, 6 pages.

Wu et al., "Fast Single-Turn Sensitive Stator Interturn Fault Detection of Induction Machines Based on Positive- and Negative-Sequence Third Harmonic Components of Line Currents," May 2010, 10 pages, IEEE Transactions on Industry Applications, vol. 46, No. 3.

Kim, "Simple Online Fault Detecting Scheme for Short-Circuited Turn in a PMSM Through Current Harmonic Monitoring," Jun. 2011, 4 pages, IEEE Transactions on Industrial Electronics, vol. 58, No. 6.

Romeral et al., "Modeling of Surface-Mounted Permanent Magnet Synchronous Motors With Stator Winding Interturn Faults," May 2011, 10 pages, IEEE Transactions on Industrial Electronics, vol. 58, No. 5.

"Productive predictions," ABB review 4/12, Nov. 28, 2012, 6 pages.

Cheng et al., "Detecting and Locating the Stator Turn-to-turn Faults in a Closed-loop Multiplemotor Drive System," 2009, 8 pages.

Cheng et al., "Fault-tolerant Operation Strategy for Claw-pole Generators with Stator Turn-to-turn Short Circuits," 2013, 8 pages.

Cintron-Rivera, "Fault Mitigation in Permanent Magnet Synchronous Motors Under an Internal Turn-to-Turn Failure," 2014, 127 pages.

Gandhi et al., "Recent Advances in Modeling and Online Detection of Stator Interturn Faults in Electrical Motors," May 2011, 12 pages, IEEE Transactions on Industrial Electronics, vol. 58, No. 5.

International Search Report and Written Opinion for PCT/US2016/040576 dated Oct. 27, 2016.

Tallam, et al.; "Stator Winding Turn-Fault Detection for Closed-Loop Induction Motor Drives"; IEEE Transactions on Industry Applications vol. 39. No. 3; May/Jun. 2003; pp. 720-724.

\* cited by examiner

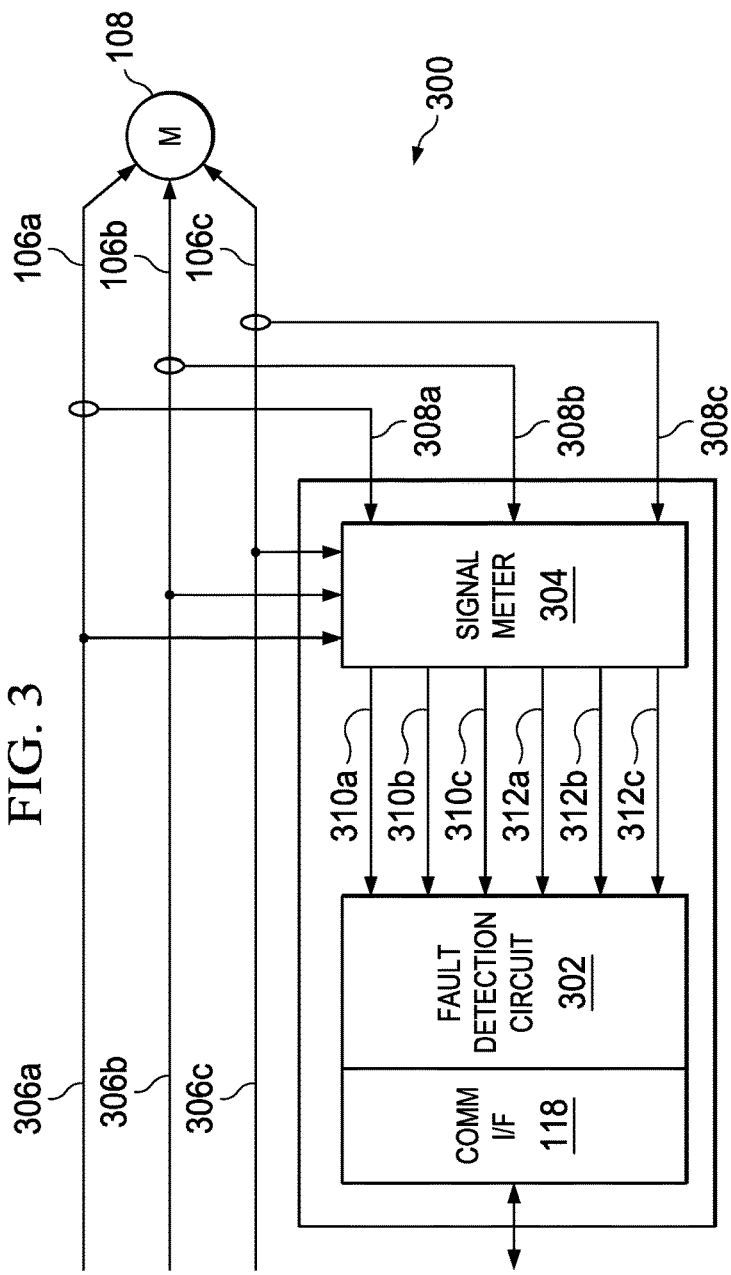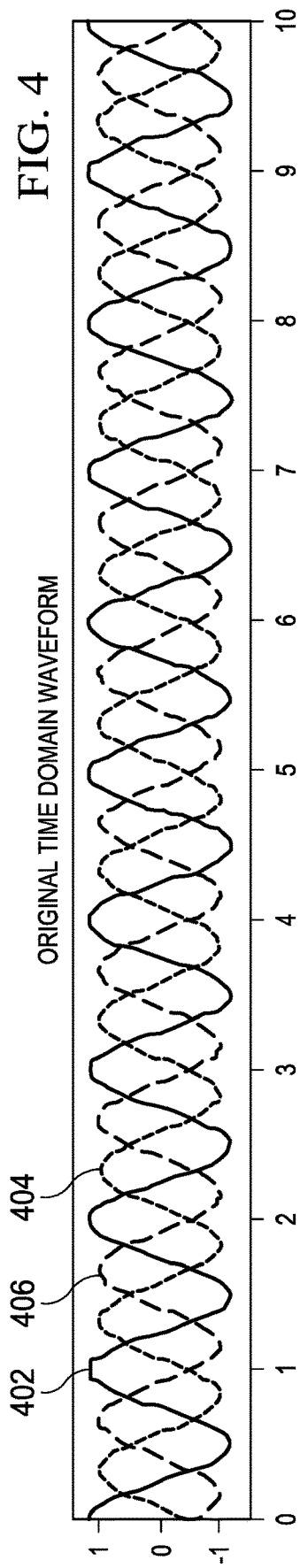

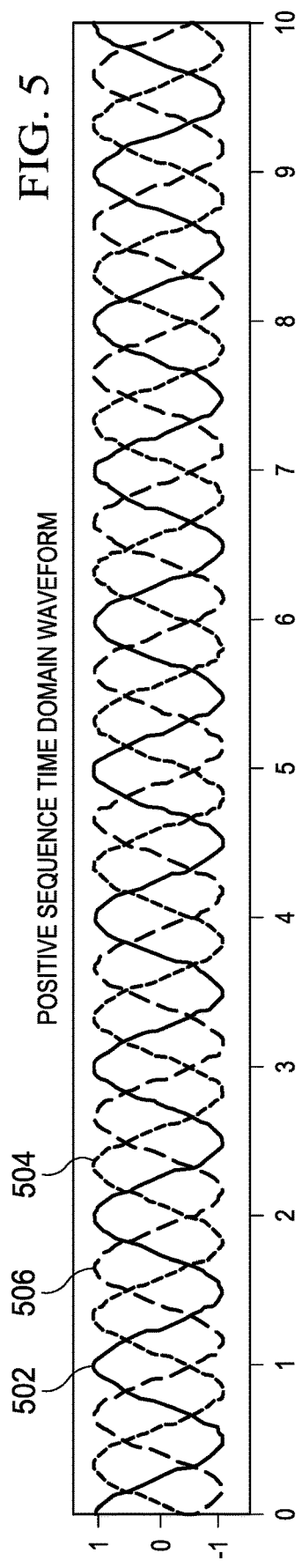
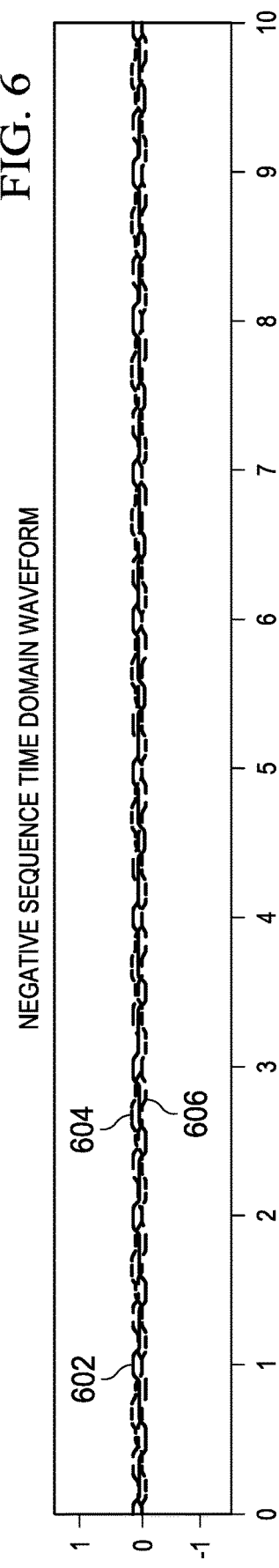
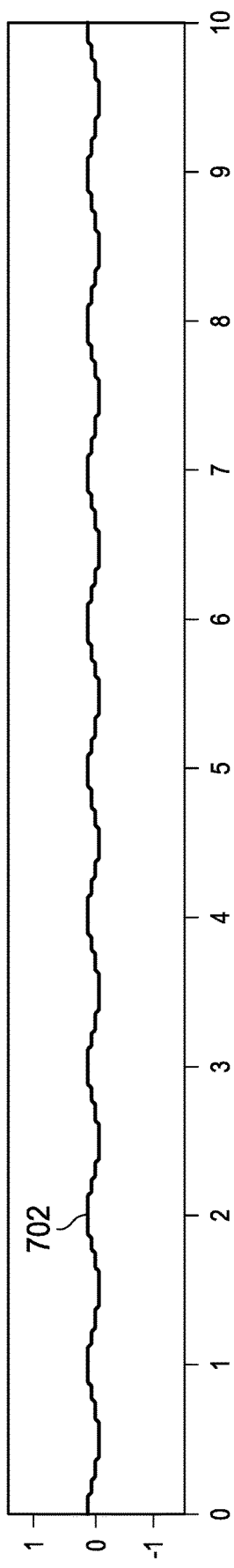

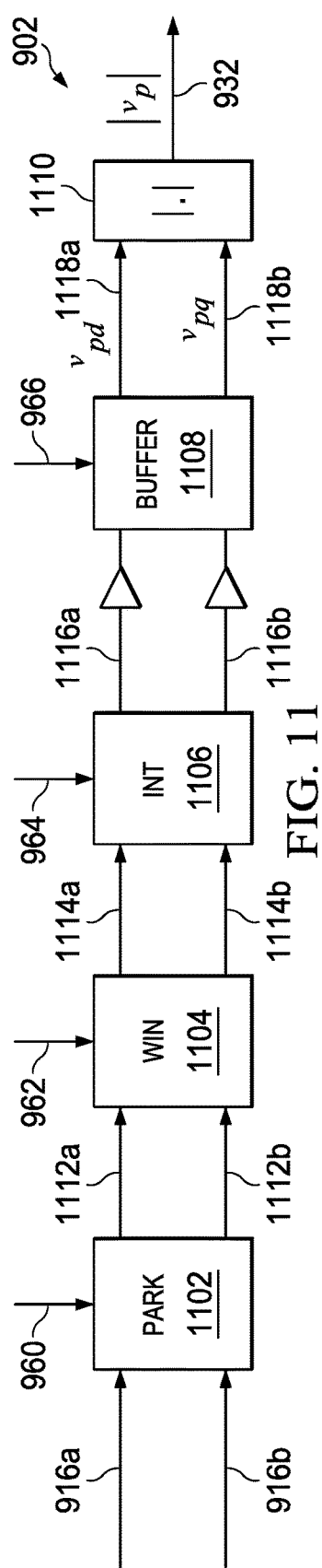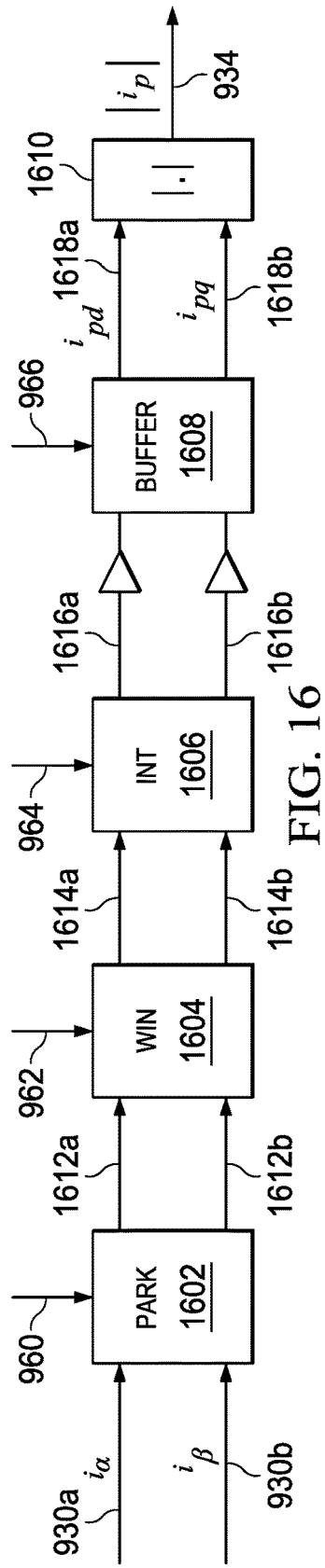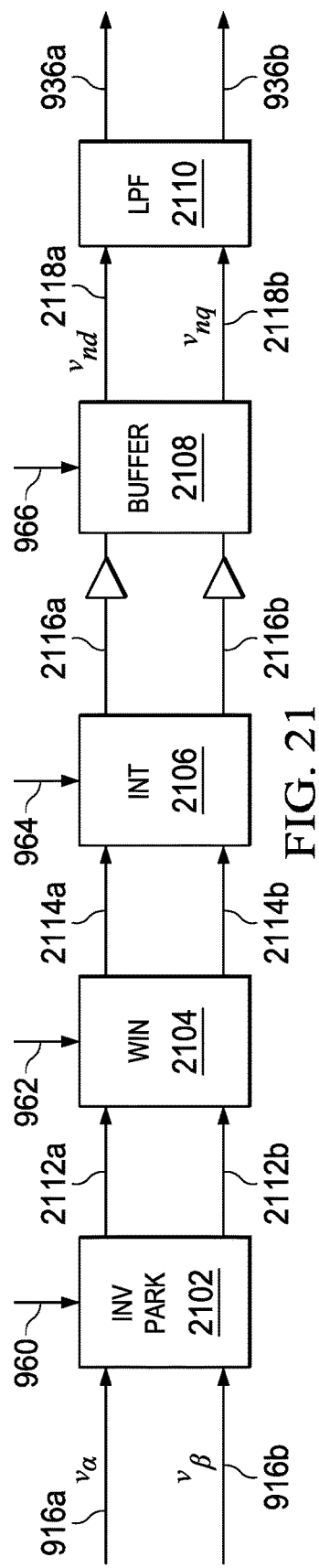

MOTOR WINDING FAULT DETECTION CIRCUITS AND METHODS TO DETECT MOTOR WINDING FAULTS

CROSS-REFERENCE TO RELATED APPLICATION

This application is a continuation of U.S. patent application Ser. No. 14/755,069 filed Jun. 30, 2015, which is fully incorporated herein by reference.

BACKGROUND

This relates generally to motor fault detection, and more particularly to motor winding fault detection circuits and methods to detect motor winding faults.

In a three-phase motor, a winding fault occurs when a portion of insulation surrounding individual windings wears down and a short circuit occurs between conductors. A winding fault effectively reduces the number of turns in the affected phase of the three-phase motor, which can unbalance the motor, reduce the performance of the motor, and/or damage the motor.

SUMMARY

In described examples of motor winding fault detection circuits and methods to detect motor winding faults, an example motor winding fault detection circuit includes a positive sequence voltage calculator, a positive sequence current calculator, an interpolator, a negative sequence voltage calculator, and a fault detector. The positive sequence voltage calculator calculates a positive sequence voltage value for a three-phase motor. The positive sequence current calculator calculates a positive sequence current value for the three-phase motor. The interpolator calculates an expected negative sequence voltage value based on the positive sequence voltage value, the positive sequence current value, and measured characteristics of the three-phase motor. The negative sequence voltage calculator calculates a measured negative sequence voltage value for the three-phase motor. The fault detector detects that a winding fault exists in the three-phase motor when a difference between the expected negative sequence voltage value and the measured negative sequence voltage value satisfies a threshold.

A described example method includes calculating a positive sequence voltage value for a three-phase motor, calculating a positive sequence current value for the three-phase motor, and calculating an expected negative sequence voltage value based on the positive sequence voltage value, the positive sequence current value, and measured characteristics of the three-phase motor. The example method also includes calculating a measured negative sequence voltage value for the three-phase motor, and detecting that a winding fault exists in the three-phase motor when a difference between the expected negative sequence voltage value and the measured negative sequence voltage value satisfies a threshold.

A described example fault detection circuit includes a first Clarke transformer, a positive sequence voltage calculator, a negative sequence voltage calculator, a second Clarke transformer, a positive sequence current calculator, an interpolator, a first subtractor, a second subtractor, an amplitude calculator, and a fault detector. The first Clarke transformer has three-phase voltage signals as a first input and has an alpha voltage signal as a first output and a beta voltage signal as a second output. The positive sequence voltage calculator has the alpha voltage signal as a second input and the beta voltage signal as a third input, and has a positive sequence voltage value as a third output. The negative sequence voltage calculator has the alpha voltage signal as a fourth input and the beta voltage signal as a fifth input, and has a direct negative sequence voltage value as a fourth output and a quadrature negative sequence voltage value as a fifth output. The second Clarke transformer has three-phase current signals as a sixth input and has an alpha current signal as a sixth output and a beta current signal as a seventh output. The positive sequence current calculator has the alpha current signal as a seventh input and the beta current signal as an eighth input, and has a positive sequence current value as an eighth output. The interpolator has the positive sequence voltage value as a ninth input, the positive sequence current value as a tenth input, and a baseline table as an eleventh input, the interpolator to generate, based on training data stored in the baseline table, the positive sequence voltage value, and the positive sequence current value, an expected direct negative sequence voltage value as a ninth output and an expected quadrature negative sequence voltage value as a tenth output. The first subtractor has the direct negative sequence voltage value as a twelfth input and the expected direct negative sequence voltage value as a thirteenth input, the first subtractor to determine a first difference value between the direct negative sequence voltage value and the expected direct negative sequence voltage value as an eleventh output. The second subtractor has the quadrature negative sequence voltage value as a fourteenth input and the expected quadrature negative sequence voltage value as a fifteenth input, the second subtractor to determine a second difference value between the quadrature negative sequence voltage value and the expected quadrature negative sequence voltage value as an twelfth output. The amplitude calculator has the first difference value as a sixteenth input and the second difference value as a seventeenth input, the amplitude calculator to output an amplitude of the first difference value and the second difference value as a thirteenth output. The fault detector has the amplitude as a eighteenth input and to output a fault detection signal as a fourteenth output when the amplitude satisfies a threshold.

BRIEF DESCRIPTION OF THE DRAWINGS

FIG. 3 is a block diagram of a three-phase motor connected to an example winding fault detection circuit constructed in accordance with the teachings of this disclosure.

FIG. 4 illustrates example time domain signals that may be observed in the phase windings of the three-phase motors of FIGS. 1, 2, and/or 3.

FIGS. 5-7 illustrate example positive sequence, negative sequence, and zero sequence signals that may be calculated from the example time domain signal of FIG. 2.

FIG. 11 illustrates a more detailed block diagram of the example positive sequence voltage magnitude calculator of FIGS. 9 and 10.

FIG. 16 illustrates a more detailed block diagram of the example positive sequence current magnitude calculator of FIGS. 9 and 10.

FIG. 21 illustrates a more detailed block diagram of the example negative sequence voltage calculator of FIGS. 9 and 10.

DETAILED DESCRIPTION OF EXAMPLE EMBODIMENTS

Figure 1:
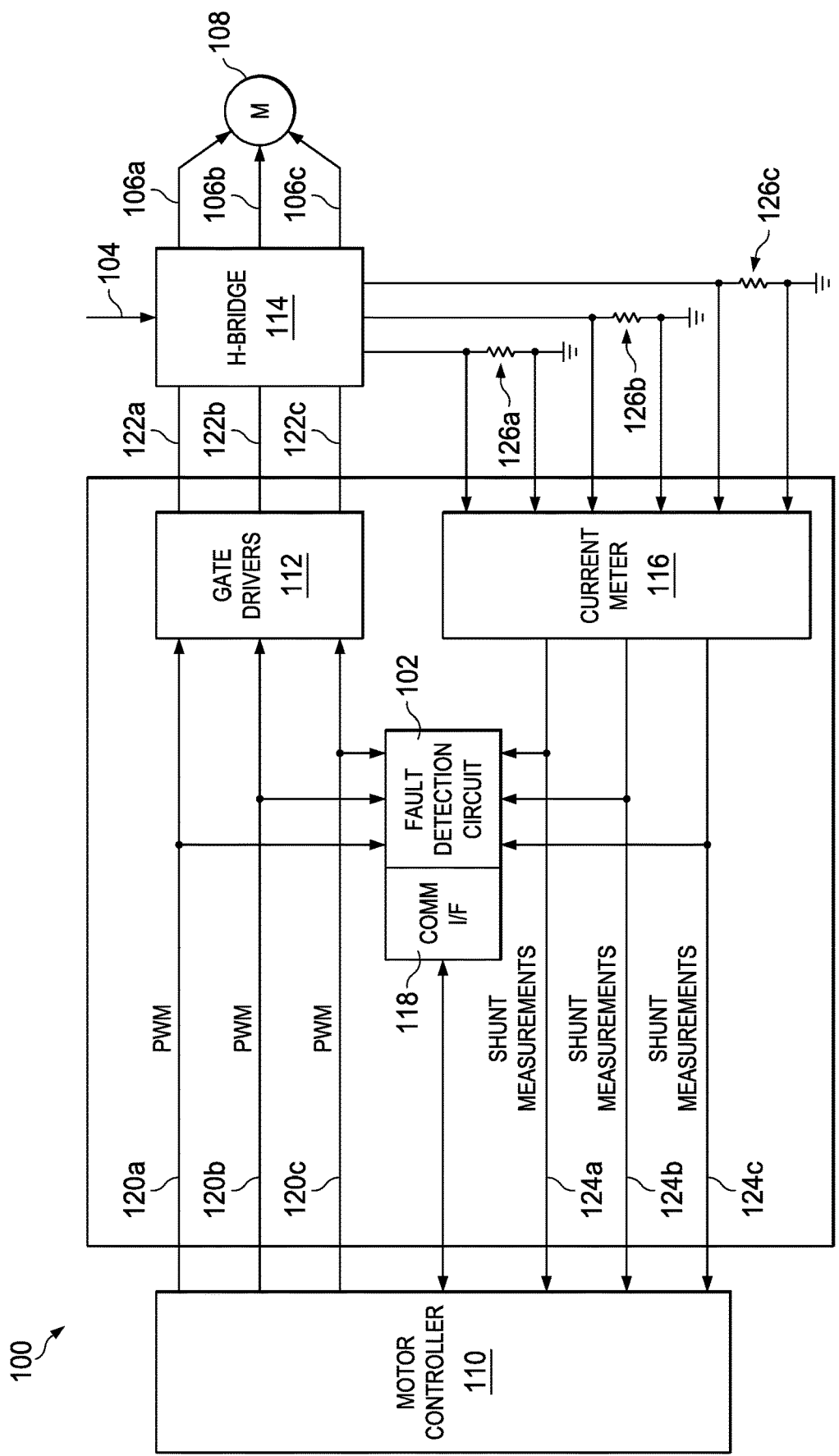
FIG. 1 is a block diagram of a three-phase motor control device including an example winding fault detection circuit constructed in accordance with the teachings of this disclosure.

The drawings are not to scale. Wherever appropriate, the same reference numbers will be used throughout the drawing(s) and accompanying written description to refer to the same or like parts.

When a motor experiences a turn-to-turn stator fault, the impedance of the phase leg on which the fault occurred will be reduced. If the motor is driven by a three-phase inverter in current mode, the control loop will compensate for the impedance change by applying less voltage to the faulty phase leg to keep the currents in balance. However, less voltage will be required to sustain a given current in the phase leg that is experiencing the fault, and the voltages will consequently go out of balance.

Three-phase motors are driven using a combination of three electrical signals having different phases. In a three-phase system, the signal components can be converted into a "positive sequence" (e.g., forward rotating), "negative sequence" (e.g., reverse rotating), and a "zero sequence" (e.g., common or shared) component. When a winding fault occurs in a three-phase motor, the primary positive sequence component is diminished, while negative sequence and/or zero sequence current components are increased. Although the presence of negative sequence and/or zero sequence current components may be good indicators of a winding fault, real-world three-phase systems are rarely (if ever) perfectly balanced. As a result, a certain amount of positive sequence and/or zero sequence current components exist.

An out-of-balance condition can be detected by a method known as sequence analysis, in which the three phase voltages are converted into the positive sequence component, the negative sequence component, and the zero sequence component. In an ideal (i.e., perfectly balanced) forward rotating system, the negative sequence and zero sequence components are zero. However, if the system is slightly out of balance, as in real-world motors, the positive sequence component will dominate, but small amounts of the negative sequence and/or zero sequence components will exist.

If the motor is healthy (i.e., no winding faults) and forward rotating, the positive sequence component will dominate, and the negative and zero sequences will be negligible. When a winding fault occurs, the positive sequence component magnitude will decrease, and the negative sequence component and/or the zero sequence component increase. In a Y-connected motor, there is no zero sequence current component and only the negative sequence component will increase.

Example methods and apparatus disclosed herein distinguish negative sequence components that are intrinsic to a particular motor and negative sequence components indicative of a winding fault.

Example methods and apparatus disclosed herein receive as inputs two phase current inputs and three phase voltage (or pulse width modulated (PWM) duty cycle) signals. Disclosed example methods and apparatus do not require a priori knowledge of machine parameters or field orientation information for the motor. Disclosed example methods and apparatus can be implemented separately from the motor, motor control circuitry, and/or motor power circuitry, and can be used to monitor electric machines at any power level. Additionally or alternatively, example methods and apparatus disclosed herein may be implemented by a motor control device, a power device, and/or a motor protection device, where the example methods and apparatus have access to the control signals or phase voltage and have access to the phase currents.

In real-world motors, construction asymmetries and non-uniformities in sensor gain can result in a motor producing negative sequence voltage components even when there are no winding faults in the motor. Disclosed example methods and apparatus establish a baseline across multiple speeds and/or loads for an individual motor drive system under protection of a fault detection circuit. Disclosed example methods and apparatus indicate or identify a fault when a measured negative sequence deviates from an expected negative sequence value determined from the baseline values. The negative sequence value, and deviations from the negative sequence values of a healthy motor, are functions of speed and load.

FIG. 1 is a block diagram of a three-phase motor control device 100 including an example fault detection circuit 102. The example motor control device 100 of FIG. 1 receives input power 104 and generates three-phase power signals 106a, 106b, 106c to drive a three-phase motor 108. In the example of FIG. 1, the three-phase motor control device 100 is a three-phase inverter.

In addition to the fault detection circuit 102, the example three-phase motor control device 100 includes a motor controller 110, gate drivers 112 that drive an H-bridge 114 (e.g., transistor gates in the H-bridge), a current meter 116, and a communications interface 118.

The example gate drivers 112 convert PWM signals 120a-120c to gate control signals 122a-122c. The example H-bridge 114 includes three H-bridges that are respectively controlled by the gate control signals 122a-122c to generate the three-phase power signals 106a-106c. The example gate drivers 112 may be a conventional gate driver and/or the example H-bridge 114 may be a conventional H-bridge.

The example motor controller 110 generates the PWM signals 120a-120c based on a desired motor speed. The motor controller 110 receives three-phase current measurements 124a-124c corresponding to the three phases of the motor 108. The three-phase current measurements 124a-124c are measured by the current meter 116 and fed back to the motor controller 110, which adjusts the PWM signals 120a-120c (e.g., the pulse widths) to attempt to have balanced currents in the motor 108. The example current meter 116 measures the currents using voltage drop measurements 126a-126c, in which the current meter 116 divides a measured voltage difference by a known resistance value over which the voltage difference is measured.

In combination, the example motor controller 110, the example gate drivers 112, the example H-bridge 114, and the example current meter 116 implement a PWM DC-to-AC three-phase inverter.

The example fault detection circuit 102 of FIG. 1 detects winding faults, such as inter-turn winding faults, in the motor 108 based on the PWM signals 120a-120c and the current measurements 124a-124c. When the fault detection circuit 102 detects a winding fault, the example fault detection circuit 102 communicates the detection of the fault to the motor controller 110 via the communications interface 118, which can take appropriate action such as powering down the motor and/or generating an alert to a person responsible for the operation of the motor 108. The example communications interface 118 may also be used to configure the gate drivers 112. Example implementations of the fault detection circuit 102 are described below with reference to FIGS. 9-36.

Figure 2:
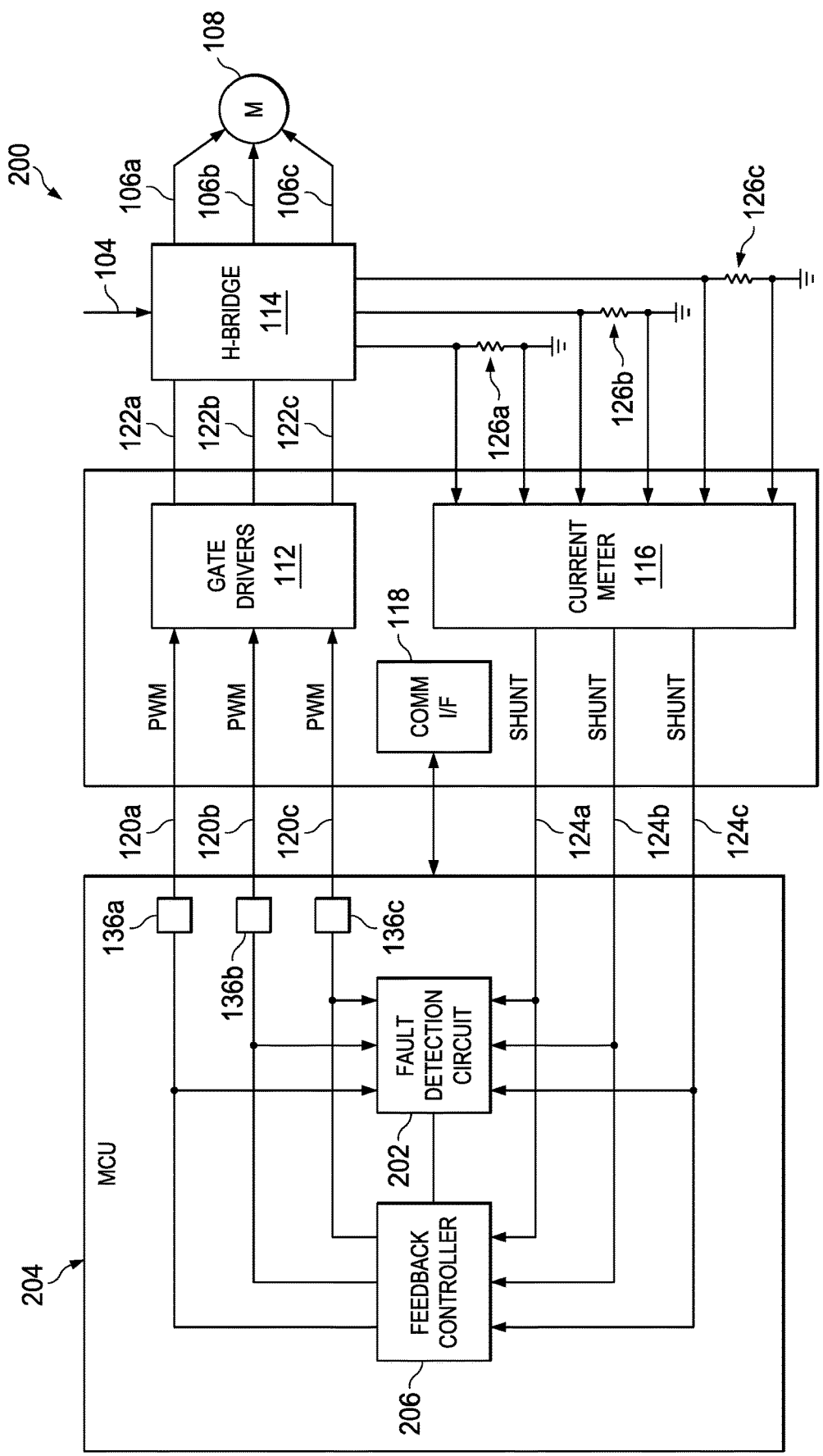
FIG. 2 is a block diagram of another three-phase motor control device including an example winding fault detection circuit constructed in accordance with the teachings of this disclosure.

FIG. 2 is a block diagram of another three-phase motor control device 200 to control the example motor 108 of FIG. 1. The example motor control device 200 of FIG. 2 includes another example fault detection circuit 202.

In contrast with the fault detection circuit 102 of FIG. 1, the example fault detection circuit 202 of FIG. 2 is implemented in a motor controller 204 (instead of separately from the motor controller 110 as in FIG. 1). The example motor controller 204 also includes a feedback controller 206 and PWM generators 208a, 208b, 208c. The feedback controller 206 receives the current measurements 124a-124c from the current meter and generates the PWM signals 120a-120c via the PWM generators 208a, 208b, 208c to control the motor 108. The example three-phase motor control device 200 also includes the gate drivers 112 (e.g., which receives the PWM signals 120a-120c and generates the gate control signals 122a-122c), the H-bridge 114 (e.g., which receives the gate control signals 122a-122c and generates the three-phase power signals 106a-106c), the current meter 116, the communications interface 118, and the voltage drop measurements 126a-126c.

FIG. 3 is a block diagram of a fault detection device 300 including an example fault detection circuit 302. The example fault detection device 300 of FIG. 3 is separate from any motor control circuitry for the motor 108, and includes a signal meter 304 to measure voltages 306a-306c and currents 308a-308c of the three-phase power signals 106a-106c that drive the motor 108. The example fault detection device 300 includes the communications interface 118 of FIGS. 1 and/or 2.

The example signal meter 312 measures the voltages 306a-306c and/or the currents 308a-308c, and provides measured voltage signals 310a-310c and/or measured current signals 312a-312c to the fault detection circuit 310. As explained in more detail below, the signal meter 304 may provide the three measured voltage signals 310a-310c and two of the measured current signals 312a-312c (e.g., in a wye-connected motor) or provide two of the measured voltage signals 310a-310c and the three current signals 312a-312c (e.g., in a delta-connected motor).

FIG. 4 illustrates example time domain components 402, 404, 406 that may be observed in the phase windings of the three-phase motors 108 of FIGS. 1, 2, and/or 3. The example time domain components 402-406 correspond to the phase power signals 106a-106c (e.g., the voltages of the phase power signals 106a-106c and/or the currents of the phase power signals 106a-106c).

FIG. 5 illustrates example positive sequence components 502, 504, 506 that may be calculated from the example time domain components 402-406 of FIG. 4. FIG. 6 illustrates an example negative sequence components 602, 604, 606 that may be calculated from the example time domain components 402-406 of FIG. 4. FIG. 7 illustrates example a zero sequence component 702 that may be calculated from the example time domain components 402-406 of FIG. 4.

The example positive sequence components 502-506, the example negative sequence components 602-606, and the example zero sequence component 702 are representative of an example motor that is non-ideal but healthy (e.g., does not have any winding faults). For instance, while the negative sequence components 602-606 are typically zero in an ideal motor, non-ideal motors have small negative sequence components due to small variations in geometry or resistance between the different phases. Therefore, the example fault detection circuits 102, 202, and 300 of FIGS. 1-3 do not rely on the mere existence of the negative sequence components 602-606 to detect winding faults. Instead, the example fault detection circuits 102, 202, and 300 measure and account for the presence of the negative sequence components 602-606, which may be unique to the specific motor 108 being protected.

Figure 8:
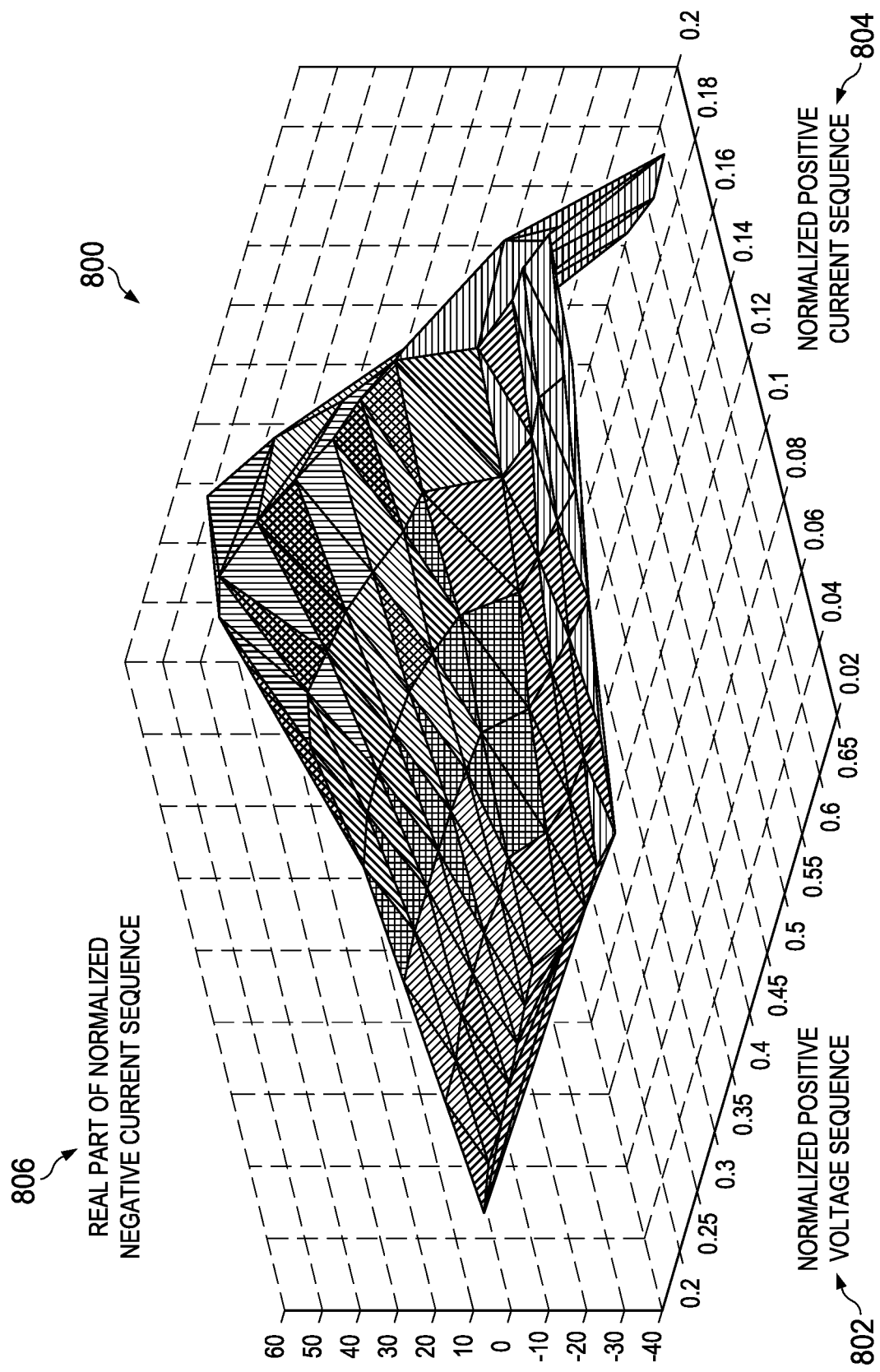
FIG. 8 illustrates an example relationship between a positive sequence voltage magnitude, a positive sequence current magnitude, and a negative sequence voltage for the three-phase motors of FIGS. 1 and/or 2.

FIG. 8 illustrates an example relationship 800 between a positive sequence voltage magnitude 802, a positive sequence current magnitude 804, and a negative sequence voltage 806 for the three-phase motor 108 of FIGS. 1-3. In the example of FIG. 8, the value of the negative sequence voltage 806 in the relationship 800 is dependent on a combination of the value of the positive sequence voltage magnitude 802 and the value of the positive sequence current magnitude 804.

The example relationship 800 partially characterizes the three-phase motor 108 for use in subsequent detection of winding faults in the three-phase motor 108. By varying the speed of the three-phase motor 108 and/or by varying a load driven by the three-phase motor 108 during a training phase, the example fault detection circuits 102, 202, 300 of FIGS. 1-3 may determine the relationship 800. The example fault detection circuits 102, 202, 300 then use a relationship for the particular motor 108, such as the relationship 800, to detect winding faults by comparing an expected negative sequence voltage 806 (determined from the relationship 800) to a negative sequence component value that is measured or observed during operation of the three-phase motor 108 during a protection phase. Identification using a relationship of the type shown in FIG. 8 is described below in more detail.

Figure 9:
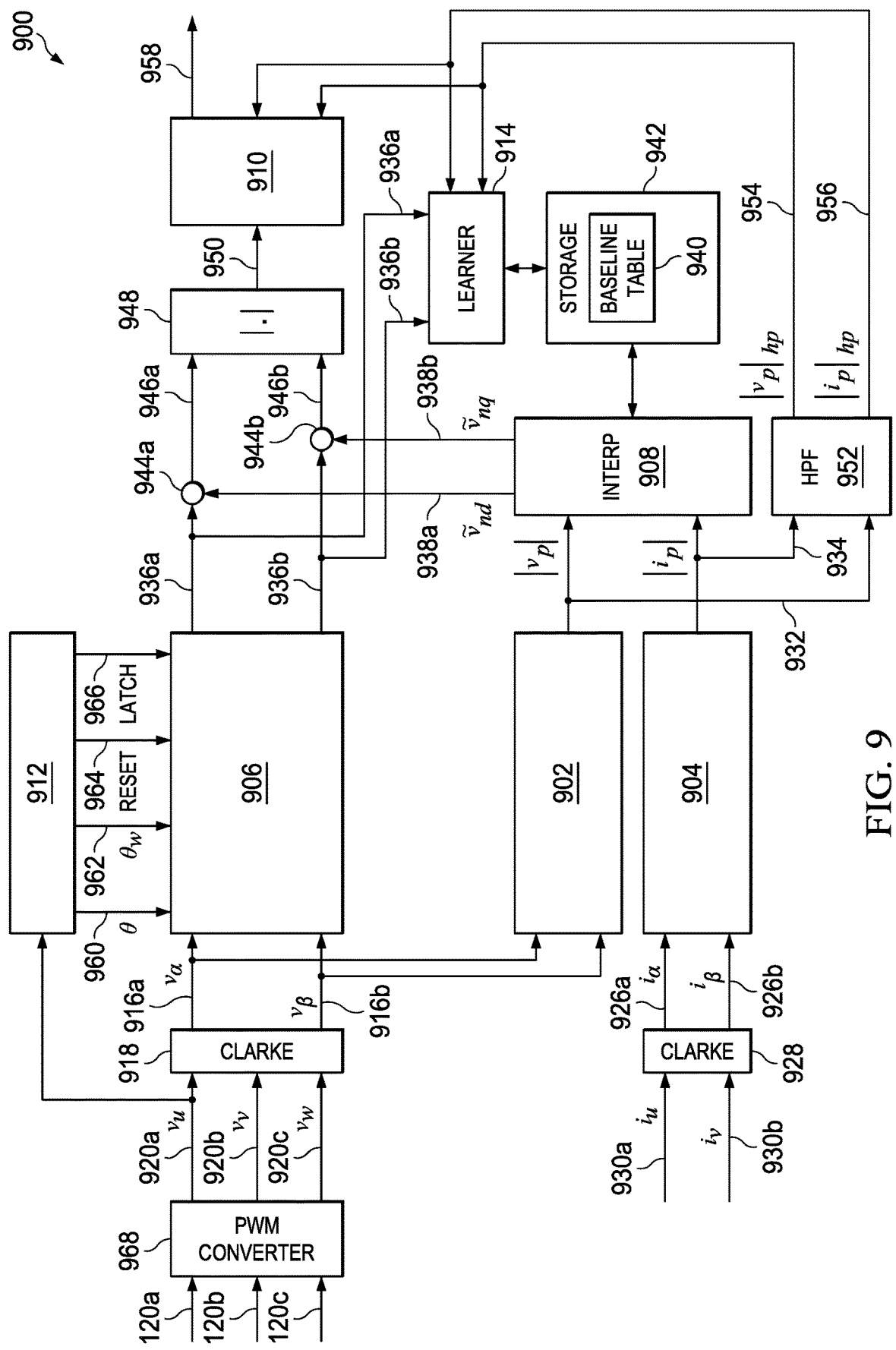
FIG. 9 is a block diagram of an example winding fault detection circuit constructed in accordance with the teachings of this disclosure to detect an winding fault in a wye-connected three-phase motor.
Figure 10:
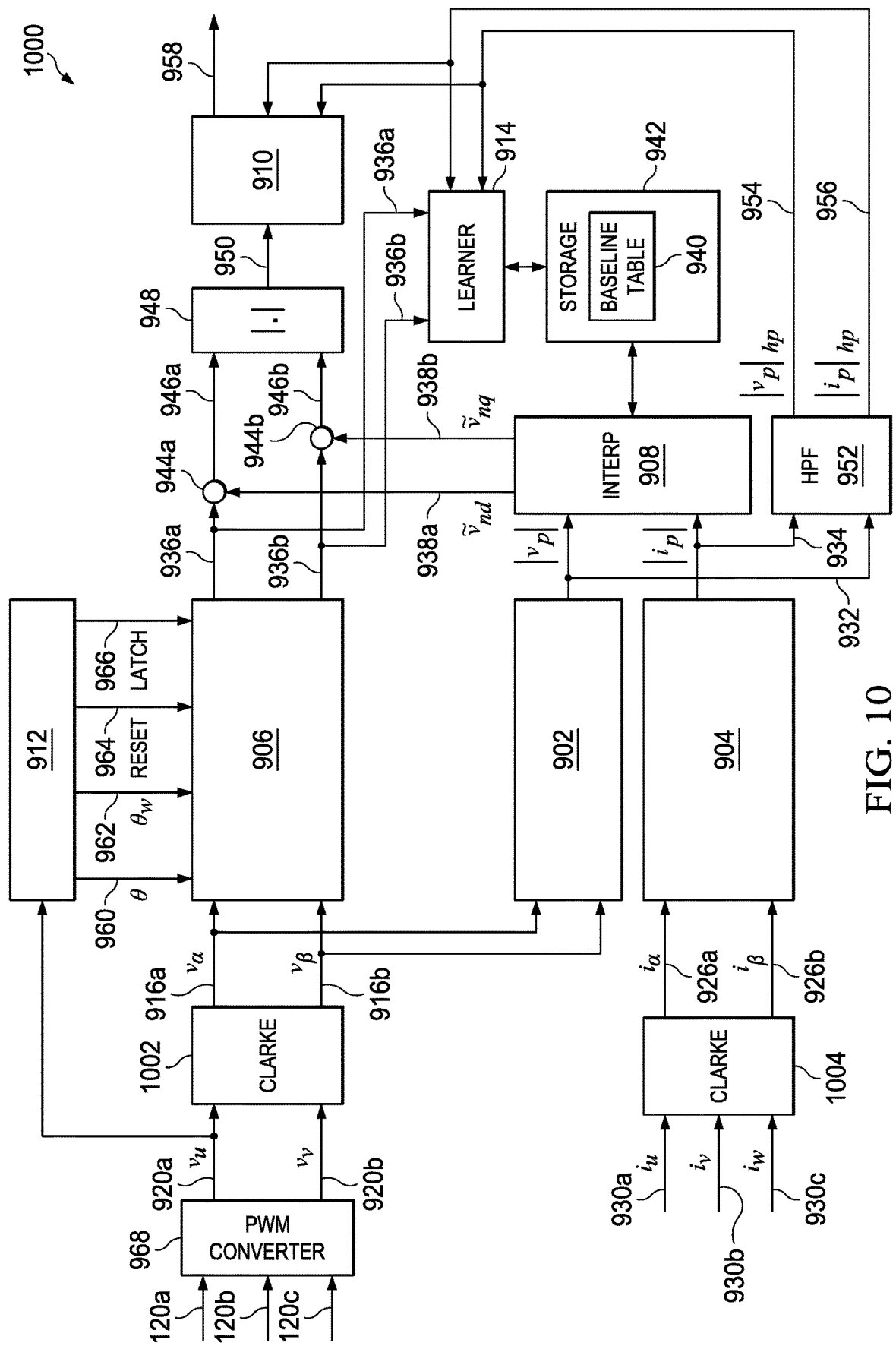
FIG. 10 is a block diagram of an example winding fault detection circuit constructed in accordance with the teachings of this disclosure to detect an winding fault in a delta-connected three-phase motor.

FIG. 9 is a block diagram of an example fault detection circuit 900 to detect a winding fault in a wye-connected three-phase motor. FIG. 10 is a block diagram of an example winding fault detection circuit 1000 to detect an winding fault in a delta-connected three-phase motor. Both of the example fault detection circuits 900, 1000 of FIGS. 9 and 10 include a positive sequence voltage magnitude calculator 902, a positive sequence current magnitude calculator 904, a negative sequence voltage calculator 906, an interpolator 908, a fault detector 910, a data acquisition controller 912, and a learner 914.

Figure 12:
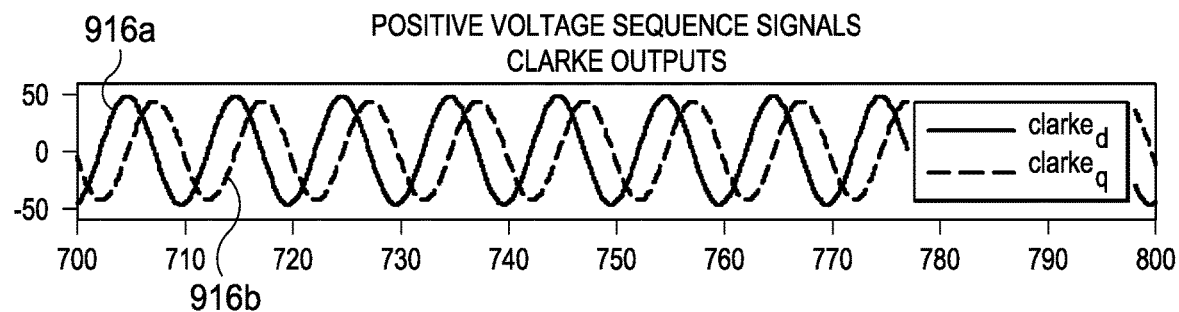
FIGS. 12-15 illustrate example signals that are generated within the example positive sequence voltage magnitude calculator of FIGS. 9, 10 and 11 while calculating a positive sequence voltage magnitude value for a three-phase motor.
Figure 22:
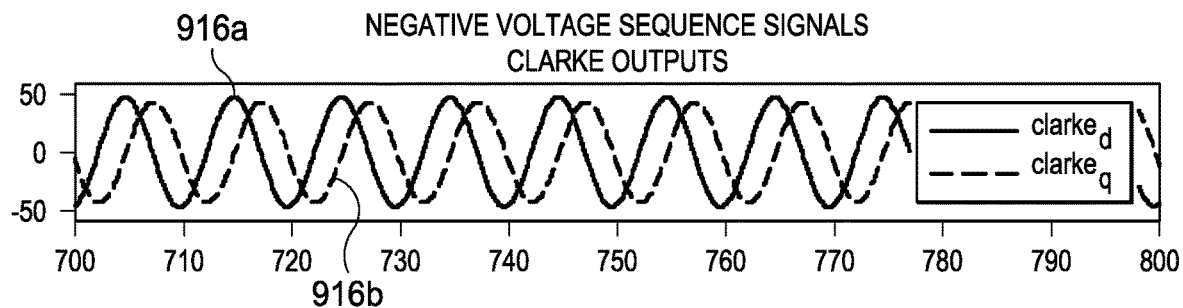
FIGS. 22-25 illustrate example signals that are generated within the example positive sequence voltage magnitude calculator of FIGS. 9, 10, and/or 21 while calculating a positive sequence voltage magnitude value for a three-phase motor.

The example positive sequence voltage magnitude calculator 902 and the example negative sequence voltage calculator 906 receive an alpha voltage signal 916a and a beta voltage signal 916b, which are generated by a Clarke transformer 918 in FIG. 9. In the example of FIG. 9, the Clarke transformer 918 receives three phase voltages 920a, 920b, 920c corresponding to the phase voltages of the motor (e.g., the voltages 306a-306c of FIG. 3), and converts the phase voltages 920a-920c to the alpha voltage signal 916a and the beta voltage signal 916b using the Clarke transform (also referred to as the alpha-beta transform). The example fault detection circuit 1000 of FIG. 10 also includes a Clarke transformer 1002, which receives two of the phase voltages 920a, 920b, 920c (e.g., 920a and 920b, 920b and 920c, or 920a and 920c) instead of the three phase voltages 920a, 920b, 920c received by the Clarke transformer 918 of FIG. 9. FIGS. 12 and 22 described below illustrate examples of the alpha voltage signal 916a and a beta voltage signal 916b generated by the Clarke transformers 918, 1002 of FIGS. 9 and/or 10.

In some examples, the fault detection circuits 900, 1000 include a PWM converter 968 that converts PWM signals to the phase voltages 920a-920c. For example, the PWM converter 968 may receive the PWM signals 120a-120c of FIGS. 1 and/or 2 and generate the phase voltages 920a-920c from the PWM signals 120a-120c (e.g., based on a voltage supply to the fault detection circuit 900 and based on the widths of the pulses as a fraction of a pulse period). In some other examples, the Clarke transformer 918 obtains the phase voltages 920a-920c by sampling the three-phase power signals 106a-106c (or two of the three-phase power signals 106a-106c for the Clarke transformer 1004) as shown in FIG. 3.

Similarly, the example positive sequence current magnitude calculator 904 of FIG. 9 receives an alpha current signal 926a and a beta current signal 926b generated by a Clarke transformer 928. The Clarke transformer 928 receives at least two phase currents 930a, 930b because, in the wye-connected motor, the third phase current 930c can be calculated from the two phase currents 930a, 930b. The example phase currents 930a, 930b may be, for example, two of the currents 124a-124c of FIGS. 1 and/or 2, and/or two of the currents 308a-308c of FIG. 3. However, in some other examples, the Clarke transformer 928 receives all three of the phase currents. The Clarke transformer 928 converts the two phase currents 930a, 930b to the alpha current signal 926a and the beta current signal 926b by determining the third phase current (e.g., by calculating a third current that balances the two phase currents 930a, 930b causing the sum of the three currents to be 0) and then using the Clarke transform.

Figure 17:
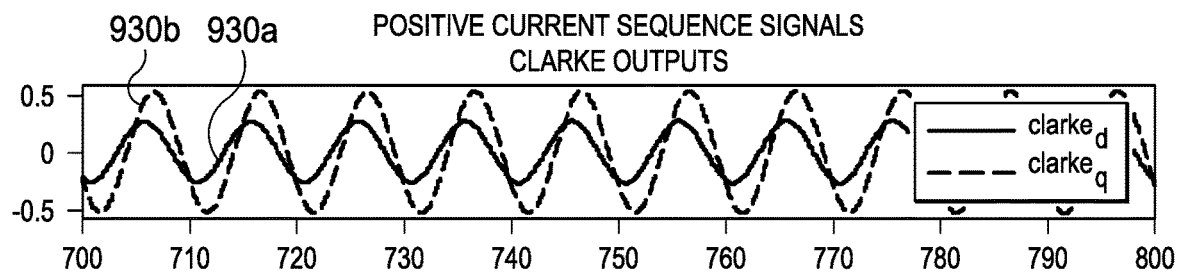
FIGS. 17-20 illustrate example signals that are generated within the example positive sequence current magnitude calculator of FIGS. 9, 10, and/or 16 while calculating a positive sequence voltage magnitude value for a three-phase motor.

Like the fault detection circuit 900, the example fault detection circuit 1000 of FIG. 10 includes a Clarke transformer 1004, which receives all three phase currents 930a, 930b, 930c instead of the two phase currents 930a, 930b received by the Clarke transformer 928 of FIG. 9. The example Clarke transformer 1004 converts the phase currents 930a, 930b, 930c to the alpha current signal 926a and the beta current signal 926b. FIG. 17 described below illustrates examples of the alpha current signal 926a and the beta current signal 926b.

Other than the difference in the number of phase voltage inputs to the Clarke transformers 918, 1002 and the difference in the number of phase current inputs to the Clarke transformers 928, 1004 of FIGS. 9 and 10, the example fault detection circuits 900, 1000 are identical. Any modifications that can be made to one of the fault detection circuits 900, 1000 are also applicable to the other. The remainder of the fault detection circuits 900, 1000 of FIGS. 9 and 10 are described below with reference to FIG. 9, and use the same reference indicators except where noted above.

The example positive sequence voltage magnitude calculator 902 receives the alpha voltage signal 916a and the beta voltage signal 916b generated by the Clarke transformer 918, and calculates a positive sequence voltage magnitude value 932 for the three-phase motor under protection by the fault detection circuit 900 (e.g., the three-phase motor 108 of FIGS. 1-3). The example positive sequence voltage magnitude calculator 902 is described in more detail below with reference to FIGS. 11-15.

The example positive sequence voltage magnitude calculator 902 generates the positive sequence voltage magnitude value 932 during the training phase of the fault detection circuit 900 to provide baseline values for determining the characteristics of the motor with respect to negative sequence voltages. The example positive sequence voltage magnitude calculator 902 also generates the positive sequence voltage magnitude value 932 during the protection phase to determine an expected negative sequence voltage.

The example positive sequence current magnitude calculator 904 receives the alpha current signal 926a and the beta current signal 926b, and calculates a positive sequence current magnitude value 934 for the three-phase motor. The example positive sequence current magnitude calculator 904 is described in more detail below with reference to FIGS. 16-20. The example positive sequence current magnitude calculator 904 generates the positive sequence current magnitude value 934 during the training phase of the fault detection circuit 900 to provide baseline values for determining the characteristics of the motor with respect to negative sequence voltages. The example positive sequence current magnitude calculator 904 also generates the positive sequence current magnitude value 934 during the protection phase to determine an expected negative sequence voltage.

The example negative sequence voltage calculator 906 receives the alpha voltage signal 916a and the beta voltage signal 916b generated by the Clarke transformer 918, and calculates a negative sequence voltage value (e.g., a direct negative sequence voltage value 936a and a quadrature negative sequence voltage value 936b) for the three-phase motor. The example negative sequence voltage calculator 906 is described in more detail below with reference to FIGS. 21-25. The example negative sequence voltage calculator 906 generates the negative sequence voltage values 936a, 936b during the training phase of the fault detection circuit 900 to provide baseline values for determining the characteristics of the motor. The example negative sequence voltage calculator 906 also generates the negative sequence voltage values 936a, 936b during the protection phase for comparison with an expected negative sequence voltage.

The example fault detection circuit 900 operates in two phases: 1) a training phase, in which the learner 914 measures and stores the characteristics of the three-phase motor; and 2) a protection phase, in which the interpolator 908 uses the stored characteristics to determine the expected direct negative sequence voltage signal 938a and/or the expected quadrature negative sequence voltage signal 938b based on received values for the positive sequence voltage magnitude value 932 and the positive sequence current magnitude value 934. During a protection phase of the fault detection circuit 900, the example interpolator 908 calculates an expected negative sequence voltage value (e.g., an expected direct negative sequence voltage signal 938a and/or an expected quadrature negative sequence voltage signal 938b) based on the positive sequence voltage magnitude value 932, the positive sequence current magnitude value 934, and characteristics of the three-phase motor measured during the training phase.

The example interpolator 908 of FIGS. 9 and 10 may determine the expected direct negative sequence voltage signal 938a and/or the expected quadrature negative sequence voltage signal 938b using an interpolation equation method, a mesh method, and/or any other suitable interpolation method.

In the interpolation equation method, the example learner 914 fits a set of training data to an interpolation equation, such as the following example quadratic polynomial of Equation 1:

$$\hat{v}_{ns} = a_0 + a_1 v_p + a_2 i_p + a_3 v_p^2 + a_4 i_p^2 + a_5 v_p i_p + a_6 v_p^2 i_p + a_7 i_p^2 v_p + a_8 v_p^2 i_p^2 \qquad \text{Equation 1}$$

In the example Equation 1, $v_p$ is the positive sequence voltage magnitude value 932 obtained from the positive sequence voltage magnitude calculator 902, $i_p$ is the positive sequence current magnitude value 934 obtained from the positive sequence current magnitude calculator 904. The learner 914 calculates the coefficients $a_0$-$a_8$ during a training phase to most closely approximate the characteristics of the three-phase motor based on a set of measured combinations of the positive sequence voltage magnitude value 932, the positive sequence current magnitude value 934, and the negative sequence voltage value(s) 936a, 936b. During the protection phase after the training phase, the interpolator 908 inputs a current operating point into the interpolation equation determined by the learner 914 to determine the expected negative sequence voltage value(s) 938a, 938b. The example learner 914 may incrementally update the coefficients $a_0$-$a_8$ during operation of the fault detection circuit 900.

Additionally or alternatively, the example learner 914 may use a recursive method to calculate the coefficients $a_0$-$a_8$. For example, the learner 914 may update the coefficients $a_0$-$a_8$ each time a data point is collected. The recursive method reduces or avoids the need to store a table of data points, but the learner 914 is unable to determine the boundaries of the operating space being explored.

In the mesh method, the example interpolator 908 determines a plane or other function based on stored set of points measured during the training phase. The example interpolator 908 determines the nearest neighboring points (e.g., 3 points) to the current operating point (e.g., combination of positive sequence voltage magnitude value 932 and positive sequence current magnitude value 934) measured during the protection phase to create the plane, and then locates the current operating point within the calculated plane to determine the expected negative sequence voltage value(s) 938a, 938b.

The interpolation equation method has the advantages (over the mesh method) that the interpolation equation method may be used for any combination of positive sequence voltage magnitude value 932 and positive sequence current magnitude value 934. Additionally, the interpolation equation method is efficient to determine the coefficients $a_0$-$a_8$, and storage requirements are reduced compared to the mesh method. However, the interpolation equation method does not necessarily retain information to enable the interpolator 908 to determine whether a current operating point is close to an operating point observed during the training phase.

The example mesh method has the advantages (over the interpolation equation method) of having a lower error between the expected negative sequence voltage value(s) 938a, 938b and the actual negative sequence voltage value(s) during normal operation of the three-phase motor. The mesh method also enables the interpolator 908 to efficiently determine the expected negative sequence voltage value(s) 938a, 938b. Additionally, because the training data is stored, the interpolator 908 is able to determine whether the current operating point is in an "unexplored" region that was not substantially evaluated during the training phase. However, the mesh method has a higher data storage requirement to implement than the interpolation equation method. Overall, the example mesh method disclosed herein provides higher detection sensitivities to winding faults than the interpolation equation method.

The following example discusses the mesh method in more detail. During the training phase, the example learner 914 receives combinations of the positive sequence voltage magnitude value 932, the positive sequence current magnitude value 934, the direct negative sequence voltage signal 936a and/or the quadrature negative sequence voltage signal 936b. The learner 914 constructs one or more baseline tables 940 in a storage device 942. The baseline tables 940 function as lookup tables that map combinations of positive sequence voltage magnitude values 932 and positive sequence current magnitude values 934 measured during the training phase to corresponding values of the direct negative sequence voltage signal 936a and/or the quadrature negative sequence voltage signal 936b (or an amplitude calculated from the direct negative sequence voltage signal 936a and the quadrature negative sequence voltage signal 936b).

In the examples of FIGS. 9 and 10, the learner 914 collects a set of combinations of positive sequence voltage magnitude values 932 and positive sequence current magnitude values 934, and the corresponding values of the direct negative sequence voltage signal 936a and/or the quadrature negative sequence voltage signal 936b, where the learner 914 stores a newly measured combination of a positive sequence voltage magnitude value 932 and a positive sequence current magnitude value 934 when the measured combination has at least a threshold distance (e.g., Euclidean distance) from all other combinations of positive sequence voltage magnitude values 932 and positive sequence current magnitude values 934. In some examples, the learner 914 collects the combinations of positive sequence voltage magnitude values 932, positive sequence current magnitude values 934, when the positive sequence voltage magnitude values 932, the positive sequence current magnitude values 934, have less than threshold variations over a time duration (e.g., when the motor is in a steady state).

When a sufficient number of combinations of positive sequence voltage magnitude values 932 and positive sequence current magnitude values 934, and the corresponding values of the direct negative sequence voltage signal 936a and/or the quadrature negative sequence voltage signal 936b, have been collected and stored in the baseline table(s) 940, the example learner 914 stops collecting the combinations of the positive sequence voltage magnitude values 932 and the positive sequence current magnitude values 934.

During the protection phase, the example interpolator 908 receives the positive sequence voltage magnitude values 932 and the positive sequence current magnitude values 934. The interpolator 908 uses the baseline table(s) 940 and the received positive sequence voltage magnitude values 932 and the received positive sequence current magnitude values 934 to determine the expected direct negative sequence voltage signal 938a and the expected quadrature negative sequence voltage signal 938b.

To determine the expected direct negative sequence voltage signal 938a and the expected quadrature negative sequence voltage signal 938b, the example interpolator 908 selects a number of the stored points in the baseline table(s) 940 that are nearest to the current operating point, as defined by the positive sequence voltage magnitude value 932 and the positive sequence current magnitude value 934 (e.g., the nearest neighbors to the current operating point). The example interpolator 908 determines distances between the current operating point and the stored points in the baseline table(s) 940 using, for example, the Euclidean distance. In the examples of FIGS. 9 and 10, the interpolator 908 determines the 4 nearest neighbors in the baseline table(s) 916.

If the nearest neighbor is more than a threshold distance away from the current operating point, the interpolator 908 is inactivated and does not detect winding faults in the motor.

When the nearest neighbor is less than the threshold distance from the current operating point, the interpolator 908 selects the 3 nearest neighbors and checks the co-linearity of the selected nearest neighbors using Equations 2-6 below:

$$\Delta x_2 = x_2 - x_1 \quad \text{Equation 2}$$

$$\Delta y_2 = y_2 - y_1 \quad \text{Equation 3}$$

$$\Delta x_3 = x_3 - x_1 \quad \text{Equation 4}$$

$$\Delta y_3 = y_3 - y_1 \quad \text{Equation 5}$$

$$d = \Delta x_2 \Delta y_3 - \Delta x_3 \Delta y_2 \quad \text{Equation 6}$$

In Equations 2-6 above and this example in general, the x variable refers to the positive sequence voltage magnitude value 932 (or the positive sequence current magnitude value 934), and the y variable refers to the positive sequence current magnitude value 934 (or the positive sequence voltage magnitude value 932). The ordered pair ($x_1$, $y_1$) refers to the nearest point to the operating point (e.g., by Euclidean distance), ($x_2$, $y_2$) refers to the second nearest point to the operating point (e.g., by Euclidean distance), and ($x_3$, $y_3$) refers to the third nearest point to the operating point (e.g., by Euclidean distance). The co-linearity is determined by comparing d in Equation 6 to a threshold.

If the interpolator 908 determines that the selected nearest neighbors are too close being co-linear (e.g., a third one of the three selected points is less than a threshold distance from a line between the other two of the points), the interpolator 908 selects the second, third, and fourth nearest neighbor, and repeats the calculations of Equations 2-6 using the second, third, and fourth nearest neighbor instead of the first, second, and third nearest neighbors. When the interpolators 908 determines that one of the selected groups of 3 neighbors is acceptable, the interpolator 908 fits a plane to the points of the selected group using Equations 7-10 below:

$$\Delta z_2 = z_2 - z_1 \qquad \text{Equation 7}$$

$$\Delta z_3 = z_3 - z_1 \qquad \text{Equation 8}$$

$$G_x = \frac{\Delta z_2 \Delta y_3 - \Delta z_3 \Delta y_2}{\Delta x_2 \Delta y_3 - \Delta x_3 \Delta y_2} \qquad \text{Equation 9}$$

$$G_y = \frac{\Delta z_3 \Delta x_2 - \Delta z_2 \Delta x_3}{\Delta x_2 \Delta y_3 - \Delta x_3 - \Delta y_2} \qquad \text{Equation 10}$$

In Equations 7-10 above, the z variable refers to the direct negative sequence voltage signal 936a or the quadrature negative sequence voltage signal 936b, $z_1$ refers to the negative sequence voltage (e.g., direct or quadrature) of the nearest neighbor (e.g., corresponding to ($x_1$, $y_1$)), $z_2$ refers to the negative sequence voltage of the second nearest neighbor (e.g., corresponding to ($x_2$, $y_2$)), and $z_3$ refers to the negative sequence voltage of the third nearest neighbor (e.g., corresponding to ($x_3$, $y_3$)). In some other examples, the z variable refers to the amplitude of the phasor form of the negative sequence voltage, which is determined using both the direct negative sequence voltage signal 936a and the quadrature negative sequence voltage signal 936b. In the example of FIGS. 9 and 10, the interpolator 908 performs Equations 7-10 for each of the direct negative sequence voltage signal 936a and the quadrature negative sequence voltage signal 936b.

After calculating the coefficients $G_x$ and $G_y$, the example interpolator 908 calculates the expected negative sequence voltage, which may be the expected direct negative sequence voltage signal 938a, the expected quadrature negative sequence voltage signal 938b, and/or an amplitude from which the direct and quadrature components can be computed, using Equation 11 below:

$$z_e = z_1 + G_x(x_o - x_1) + G_y(y_o - y_1) \qquad \text{Equation 11}$$

In Equation 11, ($x_0$, $y_0$) is the current operating point, and $z_e$ is the expected negative sequence voltage. If both groups of three nearest neighbors selected by the interpolator 908 are too co-linear, the interpolator 908 selects the nearest neighbor point ($x_1$, $y_1$) if the nearest neighbor operating point is within a threshold distance (e.g., Euclidean distance) to the operating point. Otherwise, fault detection by the fault detection circuit 900 is disabled until the operating point ($x_0$, $y_0$) changes.

The example fault detection circuit 900 further includes subtractors 944a, 944b. The example subtractor 944a subtracts the expected direct negative sequence voltage signal 938a from the direct negative sequence voltage signal 936a output by the negative sequence voltage calculator 906 (or the subtracts the direct negative sequence voltage signal 936a from the expected direct negative sequence voltage signal 938a) to generate a direct negative sequence voltage difference value 946a. Similarly, the example subtractor 944b subtracts the expected quadrature negative sequence voltage signal 938b from a filtered quadrature negative sequence voltage signal 936b output by the negative sequence voltage calculator 906 (or the subtracts the quadrature negative sequence voltage signal 936b from the expected quadrature negative sequence voltage signal 938b) to generate a quadrature negative sequence voltage difference value 946b.

The example fault detection circuit 900 includes an amplitude calculator 948 that determines the amplitude of the direct negative sequence voltage difference value 946a and the quadrature negative sequence voltage difference value 946b. For example, the amplitude calculator 948 may convert the difference values 946a and 946b to a phasor (e.g., an amplitude and phase angle notation), and extracts the amplitude portion of the phasor to output a negative sequence voltage difference value 950.

The example fault detection circuit 900 also includes a high pass filter 952 to detect whether the positive sequence voltage magnitude value 932 and/or the positive sequence current magnitude value 934 are changing. For example, the high pass filter 952 is configured with a cutoff frequency, below which changes to the positive sequence voltage magnitude value 932 and/or the positive sequence current magnitude value 934 do not affect fault detection. The example high pass filter 952 outputs a high pass filtered positive sequence voltage magnitude value 954 and a high pass filtered positive sequence current magnitude value 956 to the fault detector 910. As discussed below, the fault detector 910 compares the high pass filtered positive sequence voltage magnitude value 954 and/or the high pass filtered positive sequence current magnitude value 956 to threshold(s) to determine whether to disable fault detection.

The example fault detector 910 detects whether a winding fault exists in the three-phase motor when the negative sequence voltage difference value 950 (e.g., a difference between the expected negative sequence voltage values 938a, 938b and the measured negative sequence voltage values 936a, 936b) satisfies a threshold. In the example of FIG. 9, the fault detector 910 only detects faults when the motor is operating in a steady state (e.g., a substantially steady load and speed). The example fault detector 910 of FIGS. 9 and 10 implements a state machine that monitors whether the three-phase motor is in a transient state (e.g., the load and/or the speed of the motor are changing) or a steady state (e.g., the load and/or the speed of the motor are constant). The example fault detector 910 determines whether the motor is in a transient state by comparing the high pass filtered positive sequence voltage magnitude value 954 and/or the high pass filtered positive sequence current magnitude value 956 to threshold value(s). When the high pass filtered positive sequence voltage magnitude value 954 and the high pass filtered positive sequence current magnitude value 956 are less than the threshold value(s), the example fault detector 910 determines that the three-phase motor is in a steady state.

When the fault detector 910 determines that the three-phase motor is in a steady state, and the negative sequence voltage difference value 950 is more than a threshold, the example fault detector 910 determines that a winding fault has occurred and outputs a fault detection signal 958. The fault detector 910 does not stop asserting the fault detection signal 958 until reset by, for example, an operator of the motor and/or via the motor controller 110 of FIG. 1.

The example positive sequence voltage magnitude calculator 902, the example positive sequence current magnitude calculator 904, and the example negative sequence voltage calculator 906 of FIGS. 9 and 10 are controlled by the data acquisition controller 912 using control signals, including a phase angle signal 960, a window phase angle signal 962, a reset signal 964, and a latch signal 966 as described below. The example data acquisition controller 912 and generation of the control signals 960-966 are described in more detail below with reference to FIG. 26.

FIG. 11 illustrates an example positive sequence voltage magnitude calculator 902 that may implement the example positive sequence voltage magnitude calculator 902 of FIGS. 9 and 10. FIGS. 12-15 illustrate example signals that are generated within the example positive sequence voltage magnitude calculator 902 of FIG. 11 while calculating the positive sequence voltage magnitude value 932 for a three-phase motor.

The example positive sequence voltage magnitude calculator 902 receives the alpha voltage signal 916a and the beta voltage signal 916b generated by the Clarke transformer 918, and calculates a positive sequence voltage magnitude value 932 for the three-phase motor under protection by the fault detection circuit 900 (e.g., the three-phase motor 108 of FIGS. 1-3). The example positive sequence voltage magnitude calculator 902 includes a Park transformer 1102, a windower 1104, an integrator 1106, a positive sequence voltage magnitude buffer 1108, and an amplitude calculator 1110.

Figure 13:
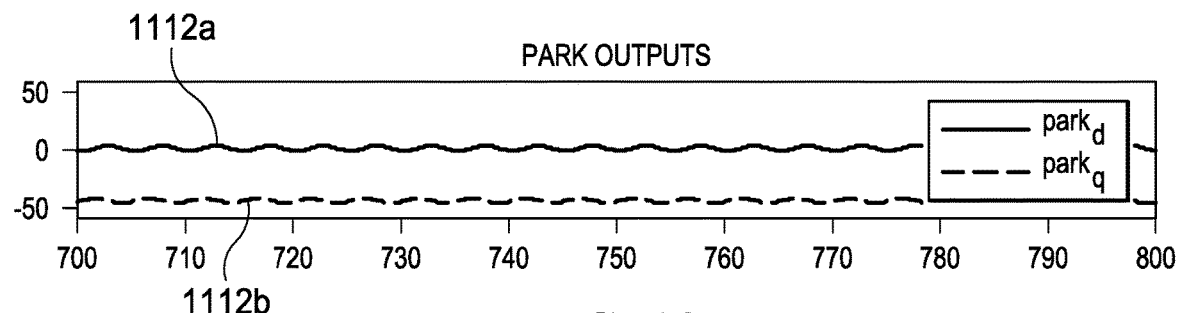

The example Park transformer 1102 performs a Park transform on the alpha voltage signal 916a and the beta voltage signal 916b by converting the alpha voltage signal 916a and the beta voltage signal 916b from a balanced two-phase orthogonal stationary system (e.g., generated using the Clarke transformation) into an orthogonal rotating reference frame determined based on the phase angle signal 960. The example Park transformer 1102 allows the alpha voltage signal 916a and the beta voltage signal 916b to be observed at the positive excitation frequencies. The Park transformer 1102 outputs a direct positive sequence voltage signal 1112a and a quadrature positive sequence voltage signal 1112b. FIG. 12 illustrates examples of the alpha voltage signal 916a and the beta voltage signal 916b input to the positive sequence voltage magnitude calculator 902 from the Clarke transformers 918, 1002 of FIG. 9 or 10. FIG. 13 illustrates examples of the direct positive sequence voltage magnitude signal 1112a and the quadrature positive sequence voltage magnitude signal 1112b that may be generated by the Park transformer 1102 using the signals of FIG. 12.

The example windower 1104 performs windowing on the direct positive sequence voltage magnitude signal 1112a and the quadrature positive sequence voltage magnitude signal 1112b. For example, the windower 1104 may apply a window function to the direct positive sequence voltage signal 1112a and the quadrature positive sequence voltage signal 1112b to generate a windowed direct positive sequence voltage signal 1114a and a windowed quadrature positive sequence voltage signal 1114b. In the example of FIG. 11, the windower 1104 multiplies the direct positive sequence voltage signal 1112a and the quadrature positive sequence voltage signal 1112b by a Kaiser window based on the phase window angle signal 962 to eliminate high frequencies which can be caused by discontinuous boundary conditions.

Figure 14:
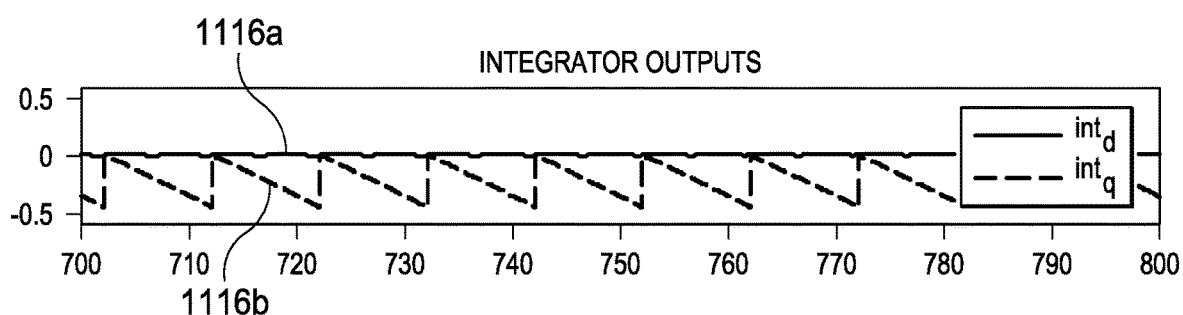

The example integrator 1106 of FIG. 11 integrates the example windowed direct positive sequence voltage signal 1114a and the windowed quadrature positive sequence voltage signal 1114b to generate an integrated direct positive sequence voltage signal 1116a and an integrated quadrature positive sequence voltage signal 1116b. The example integrator 1106 is reset in response to the reset signal 964 from the data acquisition controller 912 of FIGS. 9 and/or 10. FIG. 14 illustrates examples of the integrated direct positive sequence voltage signal 1116a and the integrated quadrature positive sequence voltage signal 1116b that may be generated by the integrator 1106 using windowed versions of the signals of FIG. 13.

Figure 15:
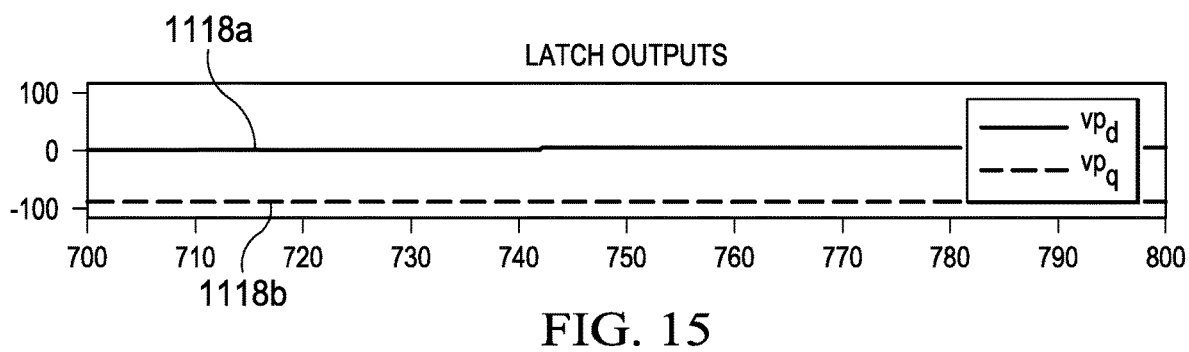

The example positive sequence voltage buffer 1108 of FIG. 11 receives the integrated direct positive sequence voltage signal 1116a and the integrated quadrature positive sequence voltage signal 1116b, and generates a direct positive sequence voltage signal 1118a and a quadrature positive sequence voltage signal 1118b. Examples of the direct positive sequence voltage signal 1118a and the quadrature positive sequence voltage signal 1118b are illustrated in FIG. 15.

In response to the latch signal 966 of FIGS. 9 and/or 10, the example positive sequence voltage buffer 1108 outputs the direct positive sequence voltage signal 1118a and the quadrature positive sequence voltage signal 1118b to the amplitude calculator 1110, which calculates the amplitude of the positive sequence voltage magnitude value 932 using the direct positive sequence voltage signal 1118a and the quadrature positive sequence voltage signal 1118b. For example, the amplitude calculator 1110 may convert the direct positive sequence voltage signal 1118a and the quadrature positive sequence voltage signal 1118b to a phasor notation, which includes the amplitude and phase angle, and then output the amplitude portion as the positive sequence voltage magnitude value 932.

FIG. 16 illustrates an example positive sequence current magnitude calculator 904 that may implement the example positive sequence current magnitude calculator 904 of FIGS. 9 and 10. FIGS. 17-20 illustrate example signals that are generated within the example positive sequence current magnitude calculator 904 of FIG. 16 while calculating a positive sequence voltage magnitude value for a three-phase motor.

The example positive sequence current magnitude calculator 904 calculates a positive sequence current magnitude value 934 for the three-phase motor. The example positive sequence current magnitude calculator 904 includes a Park transformer 1602, a windower 1604, an integrator 1606, a positive sequence current magnitude buffer 1608, and an amplitude calculator 1610. The example Park transformer 1602, the example windower 1604, the example integrator 1606, the example positive sequence current magnitude buffer 1608, and the example amplitude calculator 1610 function in the same ways as the respective ones of the Park transformer 1102, the windower 1104, the integrator 1106, the positive sequence voltage buffer 1108, and the amplitude calculator 1110, except that the Park transformer 1602, the example windower 1604, the example integrator 1606, the example positive sequence current magnitude buffer 1608, and the example amplitude calculator 1610 execute on current values (e.g., the alpha current signal 926a and the beta current signal 926b) instead of voltage values.

Figure 18:
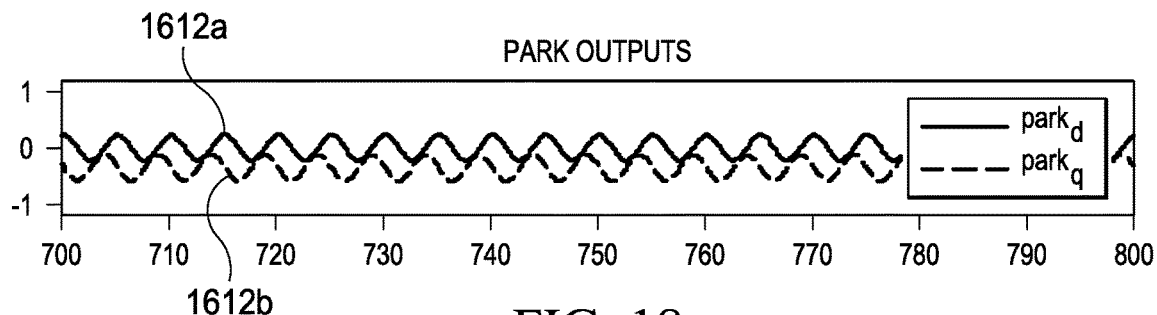

The example Park transformer 1602 receives the alpha current signal 926*a* and the beta current signal 926*b*, and generates a direct positive sequence current signal 1612*a* and a quadrature positive sequence current signal 1612*b* based on the phase angle signal 960 in a similar manner to the operation of the Park transformer 1102 described above. FIG. 17 illustrates examples of the alpha current signal 926*a* and the beta current signal 926*b* input to the positive sequence current magnitude calculator 904 from the Clarke transformers 928, 1004 of FIG. 9 or 10. FIG. 18 illustrates examples of the direct positive sequence current signal 1612*a* and the quadrature positive sequence current signal 1612*b* generated by the example Park transformer 1602.

The example windower 1604 receives the direct positive sequence current signal 1612*a* and the quadrature positive sequence current signal 1612*b*, and generates a windowed direct positive sequence current signal 1614*a* and a windowed quadrature positive sequence current signal 1614*b* based on the window phase angle signal 962 in a similar manner to the operation of the windower 1104 described above.

Figure 19:
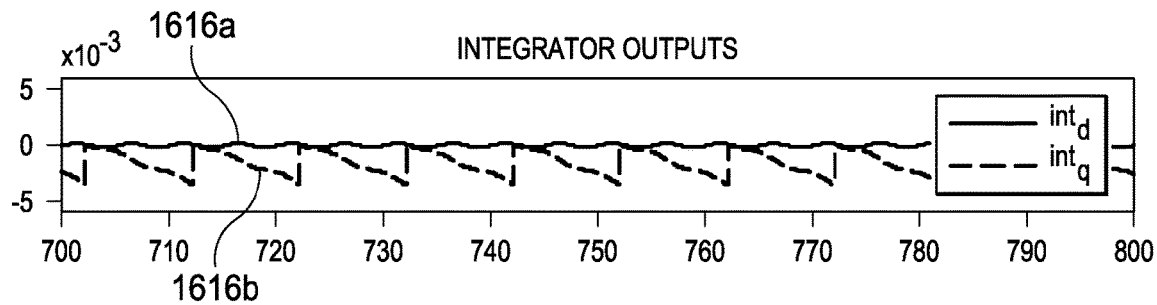

The example integrator 1606 receives the windowed direct positive sequence current signal 1614*a* and the windowed quadrature positive sequence current signal 1614*b*, and generates an integrated direct positive sequence current signal 1616*a* and an integrated quadrature positive sequence current signal 1616*b* in a manner similar to the integrator 1106 described above. The example integrator 1606 is reset (e.g., to an initial value or sum) in response to the reset signal 964 from the data acquisition controller 912 of FIGS. 9 and/or 10. FIG. 19 illustrates examples of the integrated direct positive sequence current signal 1616*a* and the integrated quadrature positive sequence current signal 1616*b* that may be generated by the integrator 1606 using windowed versions of the signals of FIG. 18.

Figure 20:
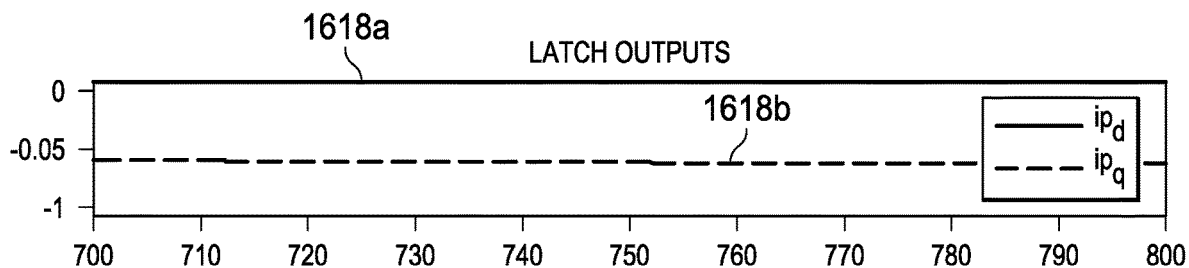

The example positive sequence current buffer 1608 receives the integrated direct positive sequence current signal 1616*a* and the integrated quadrature positive sequence current signal 1616*b*, and generates a direct positive sequence current signal 1618*a* and a quadrature positive sequence current signal 1618*b*. Examples of the direct positive sequence current signal 1618*a* and the quadrature positive sequence current signal 1618*b* are illustrated in FIG. 20.

In response to the latch signal 966, the example positive sequence current buffer 1608 outputs the direct positive sequence current signal 1618*a* and the quadrature positive sequence current signal 1618*b* to the amplitude calculator 1610, which calculates the amplitude of the direct positive sequence current signal 1618*a* and the quadrature positive sequence current signal 1618*b*. For example, the amplitude calculator 1610 may convert the direct positive sequence current signal 1618*a* and the quadrature positive sequence current signal 1618*b* to a phasor notation, which includes the amplitude and phase angle, and then output the amplitude portion as the positive sequence current magnitude value 934 in a manner similar to the amplitude calculator 1110 described above.

FIG. 21 illustrates an example negative sequence voltage calculator 906 that may implement the example negative sequence voltage calculator 906 of FIGS. 9 and 10. FIGS. 22-25 illustrate example signals that are generated within the example negative sequence voltage calculator 906 of FIGS. 9, 10, and/or 21 while calculating a negative sequence voltage value for a three-phase motor.

The example negative sequence voltage calculator 906 calculates measured negative sequence voltage values 936*a*, 936*b* for the three-phase motor. The example negative sequence voltage calculator 906 includes an inverse-Park transformer 2102, a windower 2104, an integrator 2106, a negative sequence voltage buffer 2108, and a low-pass filter 2110.

Figure 23:
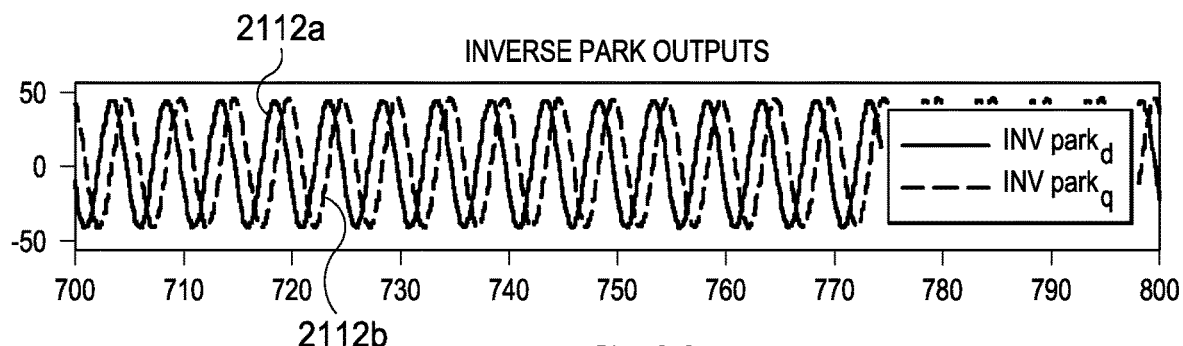

The example inverse-Park transformer 2102 receives the alpha voltage signal 916*a* and the beta voltage signal 916*b* and performs an inverse Park transformation to generate a direct negative sequence voltage signal 2112*a* and a quadrature negative sequence voltage signal 2112*b*. The inverse Park transformer 2102 obtains the voltage at the negative excitation frequency, in contrast with the positive excitation frequency obtained by the Park transformers 1102, 1602. The inverse Park transformer 2102 is controlled via the phase angle signal 960 from the data acquisition controller 912 of FIGS. 9 and/or 10. FIG. 22 illustrates examples of the alpha voltage signal 916*a* and the beta voltage signal 916*b* input to the negative sequence voltage calculator 906 from the Clarke transformers 918, 1002 of FIG. 9 or 10. FIG. 23 illustrates examples of the direct negative sequence voltage signal 2112*a* and the quadrature negative sequence voltage signal 2112*b* based on the alpha voltage signal and the beta voltage signal of FIG. 22.

The example windower 2104 receives the direct negative sequence voltage signal 2112*a* and the quadrature negative sequence voltage signal 2112*b*, and applies a window function to generate a windowed direct negative sequence voltage signal 2114*a* and a windowed quadrature negative sequence voltage signal 2114*b*. The example windower 2104 may apply a similar, identical, or different window function as the windowers 1104, 1604. For example, the windower 2104 applies a Kaiser window based on the window phase angle signal 962 to the direct negative sequence voltage signal 2112*a* and the quadrature negative sequence voltage signal 2112*b*.

Figure 24:
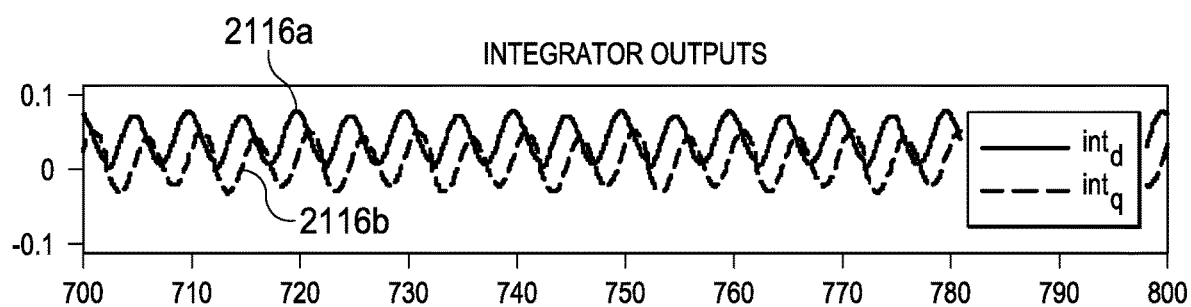

The example integrator 2106 receives the windowed direct negative sequence voltage signal 2114*a* and the windowed quadrature negative sequence voltage signal 2114*b*, and integrates the windowed direct negative sequence voltage signal 2114*a* and the windowed quadrature negative sequence voltage signal 2114*b* to generate an integrated direct negative sequence voltage signal 2116*a* and an integrated quadrature negative sequence voltage signal 2116*b*. The integrator 2106 removes AC component(s) present in the windowed direct negative sequence voltage signal 2114*a* and the windowed quadrature negative sequence voltage signal 2114*b* to produce the negative sequence voltage. The example integrator 2106 is reset in response to the reset signal 964 from the data acquisition controller 912 of FIGS. 9 and/or 10. FIG. 24 illustrates examples of the integrated direct negative sequence voltage signal 2116*a* and the integrated quadrature negative sequence voltage signal 2116*b* based on windowed version of the signals of FIG. 23.

Figure 25:
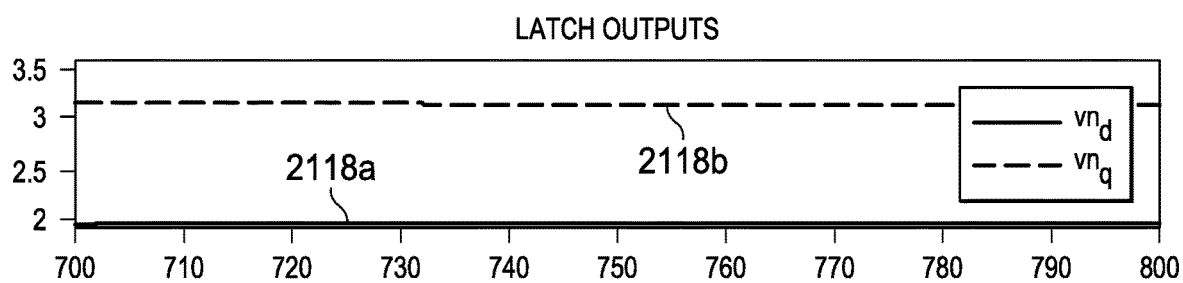

The example negative sequence voltage buffer 2108 of FIG. 21 receives the integrated direct negative sequence voltage signal 2116*a* and the integrated quadrature negative sequence voltage signal 2116*b*, and generates a direct negative sequence voltage signal 2118*a* and a quadrature negative sequence voltage signal 2118*b*. The example negative sequence voltage buffer 2108 outputs the direct negative sequence voltage signal 2118*a* and a quadrature negative sequence voltage signal 2118*b* to the low pass filter 2110 in response to the latch signal 966. Examples of the direct negative sequence voltage signal 2118*a* and the quadrature negative sequence voltage signal 2118*b* are illustrated in FIG. 25.

The example low pass filter 2110 of FIG. 21 filters the direct negative sequence voltage signal 2118a and the quadrature negative sequence voltage signal 2118b to attenuate transients in the direct negative sequence voltage signal 2118a and/or the quadrature negative sequence voltage signal 2118b, and/or to remove cycle-to-cycle variations in the direct negative sequence voltage signal 2118a and/or the quadrature negative sequence voltage signal 2118b. The example low pass filter 2110 outputs the filtered negative sequence voltage signals as the direct negative sequence voltage signal 936a and the quadrature negative sequence voltage signal 936b. As explained in more detail below, relatively stable (e.g., steady state) negative sequence voltage signals are used to detect winding faults instead of transient negative sequence voltage signals.

Figure 26:
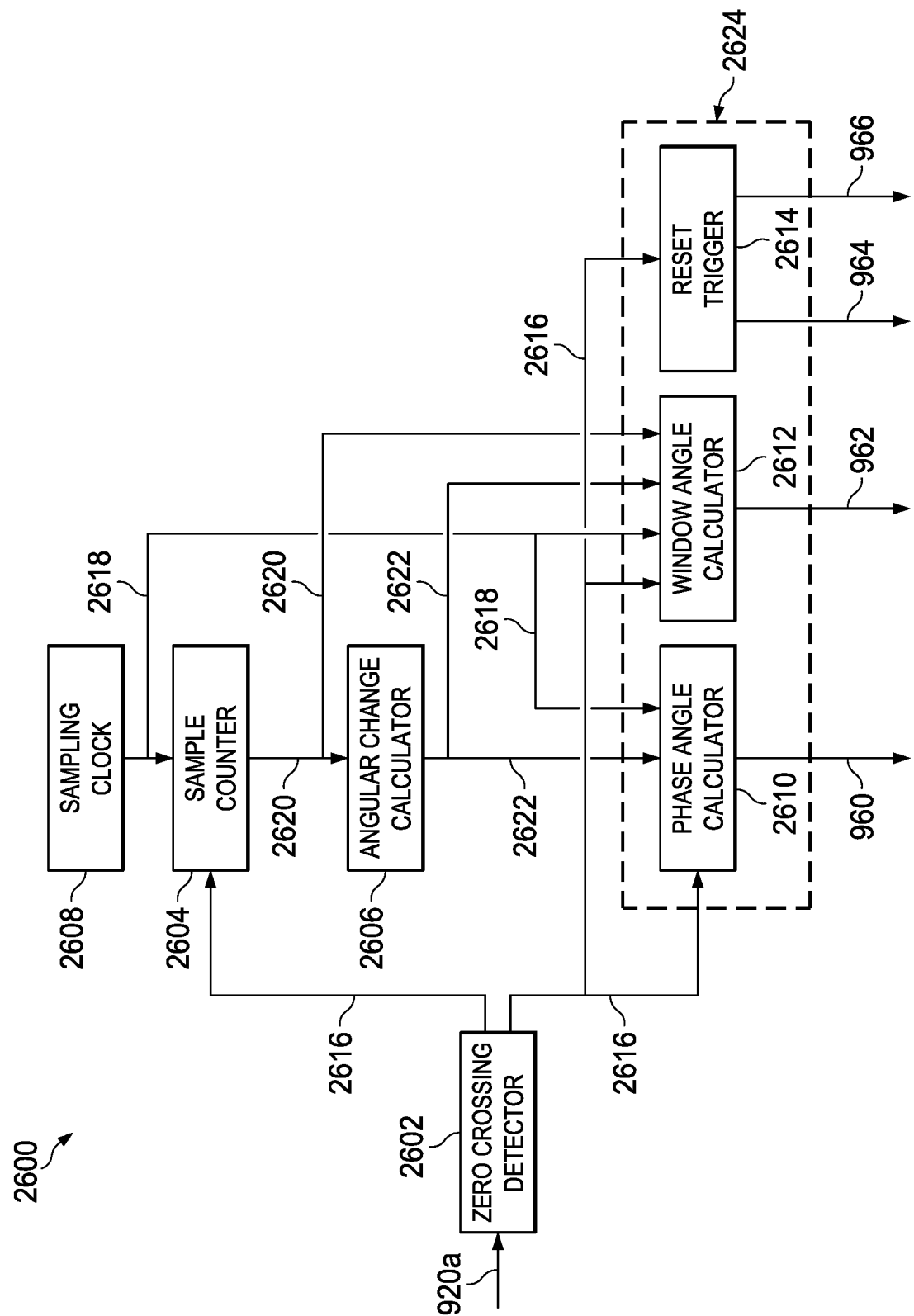
FIG. 26 illustrates a more detailed block diagram of the example data acquisition controller of FIGS. 9 and 10.

FIG. 26 illustrates an example data acquisition controller 2600 that may implement the example data acquisition controller 912 of FIGS. 9 and 10. The example data acquisition controller of FIG. 26 receives a phase voltage signal (e.g., the phase voltage signal 920a of FIGS. 9 and/or 10) and outputs the phase angle signal 960, the phase window angle signal 962, the reset signal 964, and the latch signal 966 of FIGS. 9 and 10 to control the positive sequence voltage calculator 902, the positive sequence current calculator 904, and the negative sequence voltage calculator 906.

The example data acquisition controller 2600 of FIG. 26 includes a zero-crossing detector 2602, a sample counter 2604, an angular change calculator 2606, a sampling clock 2608, a phase angle calculator 2610, a window angle calculator 2612, and a reset trigger 2614.

The example zero crossing detector 2602 receives the phase voltage signal 920a and identifies positive zero crossings in the phase voltage signal 920a (e.g., zero crossings in which the phase voltage signal 920a is changing from a negative voltage to a positive voltage with respect to the zero reference). The example zero crossing detector 2602 outputs a zero crossing signal 2616 in response to identifying a positive zero crossing (e.g., each time the zero crossing detector 2602 detects the positive zero crossing event).

The example sample counter 2604 calculates a number of cycles of the sampling clock 2608 between zero crossings in the phase voltage signal 920a. The sample counter 2604 outputs a zero crossing period (e.g., in samples) of the phase voltage signal 920a. To calculate the zero crossing period, the example sample counter 2604 resets a sampling clock counter and begins counting cycles of a sampling clock signal 2618 when a first zero crossing signal 2616 is received. When a second zero crossing signal 2616 is received, the example sample counter 2604 outputs the counted number of sampling clock cycles 2620 counted by the sampling clock counter. The duration of the sampling cycle is based on the clock signal 2618 received from the sampling clock 2608. In the example of FIG. 26, the frequency of the clock signal 2618 is substantially higher than the frequency of the phase voltage signal 920a (e.g., higher than the Nyquist frequency for the phase voltage signal 920a). For example, the clock signal 2618 may have a 10 kHz frequency when the phase voltage signal 920a has a frequency between 1 Hz and 500 Hz (e.g., 60 Hz).

The example angular change calculator 2606 receives the counted number of sampling clock cycles 2620 and calculates a reciprocal of the counted number of sampling clock cycles 2620, which is an angular rate of change in the phase of the phase voltage signal 920a per sample. The angular change calculator 2606 outputs the calculated angular rate of change 2622.

In some examples, the angular change calculator 2606 repeatedly calculates the angular rate of change 2622, in response to receiving the counted number of sampling clock cycles 2620. The angular change calculator 2606 may low pass filters (e.g., averages) the angular rate of change 2622 prior to outputting the angular rate of change 2622. Additionally or alternatively, the example angular change calculator 2606 converts the angular rate of change 2622 to degrees.

The example phase angle calculator 2610, the example window angle calculator 2612, and the example reset trigger 2614 may implement one or more state machines 2624. An example of such a state machine 2624 is described below with reference to the flowchart of FIG. 36. The example state machine 2624 changes between a "Wait" state and an "Acquisition" state. The transition from the "Wait" state to the "Acquisition" state in the state machine 2624 occurs in response to the zero crossing signal 2616, at which time the phase angle calculator 2610, the example window angle calculator 2612, and the example reset trigger 2614 perform actions as described below. When sample collection has completed in the "Acquisition" state, the state machine 2624 transitions from the "Acquisition" state to the "Wait" state.

The example phase angle calculator 2610 of FIG. 26 receives the zero crossing signal 2616, the sampling clock signal 2618, and the angular rate of change 2622 (e.g., in degrees) as inputs. The phase angle calculator 2610 calculates and outputs the phase angle signal 960. The phase angle signal 960 has a range of 0° to 360°, or an equivalent such as 0 to 2π radians, and changes in value from 0° to 360° over the duration of the phase period 2620. When the phase angle calculator 2610 receives the zero crossing signal 2616, the phase angle calculator 2610 resets the phase angle signal 960 to 0° and increments the phase angle signal 960 by the angular rate of change 2622 each time the sampling clock signal 2618 is received. Assuming a constant frequency of the phase voltage signal 920a, the phase angle calculator 2610 outputs values of the phase angle signal 960 that approach 360° by the time the next zero crossing signal 2616 is received.

The example window angle calculator 2612 of FIG. 26 receives the zero crossing signal 2616, the sampling clock signal 2618, the phase period 2620, and the number of electrical cycles 2622 as inputs. In the example of FIG. 26, sample counter 2604 repeatedly calculates the counted number of sampling clock cycles 2620 and low pass filters (e.g., averages) the counted number of sampling clock cycles 2620 provided to the window angle calculator 2612. The low pass filtering reduces quantization error in the counted number of sampling clock cycles 2620.

The window angle calculator 2612 calculates and outputs the window phase angle signal 962. Like the phase angle signal 960, the window phase angle signal 962 has a range of 0° to 360°, or an equivalent such as 0 to 2π radians. However, in contrast to the phase angle signal 960, the window phase angle signal 962 changes in value from 0° to 360° over the duration of the number of electrical cycles 2622 calculated by the sample counter 2604.

When the window angle calculator 2612 receives a first zero crossing signal 2616 (e.g., while the state machine 2624 is in the "Wait" state), the window angle calculator 2612 resets the window phase angle signal 962 to 0°. The example window angle calculator 2612 calculates an increment value for the window phase angle 962 by calculating a target number of cycles. In the example of FIG. 26, the window angle calculator 2612 calculates the target number of cycles by multiplying the angular rate of change 2622 and a target number of samples 2626, and rounding the product up to a nearest power of 2. The target number of samples may be specified by a variable or otherwise calculated to determine a number of samples to be integrated to obtain accurate measurements via the positive sequence voltage magnitude calculator 902, the positive sequence current magnitude calculator 904, and the negative sequence voltage calculator 906.

During the "Acquisition" state, the example window angle calculator 2612 increments the window phase angle signal 962 each time the sampling clock signal 2618 is received. In the example of FIG. 26, the window angle calculator 2612 calculates the increment value by dividing the angular rate of change 2622 by the calculated target number of cycles. For example, if the angular rate of change 2622 is $\Delta\theta$ and the calculated target number of electrical cycles is N, the window angle calculator 2612 increments the window phase angle signal 962 by $\Delta\theta/N$ each time the sampling clock signal 2618 is received.

In addition to incrementing the window phase angle signal 962, the example window angle calculator 2612 decrements a sample counter in response to the sampling clock signal 2618. The sample counter is set to the target number of samples when the state machine 2624 transitions from the "Wait" state to the "Acquisition" state, and counts down to 0. When the sample counter reaches 0, the example state machine 2624 transitions back to the "Wait" state.

The example reset trigger 2614 of FIG. 26 receives the zero crossing signal 2616 as an input. When the zero crossing signal 2616 is received while the state machine 2624 is in the "Wait" state (e.g., a pulse from the zero crossing detector 2602), the reset trigger 2614 outputs the reset signal 964 (e.g., a pulse) and/or the latch signal 966 (e.g., a pulse).

The example data acquisition controller 912 controls the Park transformers 1102, 1602 of FIGS. 11 and 16 and the inverse Park transformer 2102 of FIG. 21 using the phase angle signal 960. The data acquisition controller 912 controls the windowers 1104, 1604, 2104 using the window phase angle signal 962. The example data acquisition controller 912 controls the integrators 1106, 1606, 2106 using the reset signal 964, and controls the buffer circuits 1108, 1608, 2108 using a latch signal 966. The reset signal 964 may be, for example, a pulse that causes the integrators 1106, 1606, 2106 to reset the current sum to 0, from which the integrator 1106, 1606, 2106 may resume summing.

The latch signal 966 causes the buffers 1108, 1608, 2108 to output the respective values stored in the buffers 1108, 1608, 2108 (e.g., from a previous integration) for calculation of the positive sequence voltage magnitude value 932 (e.g., via the amplitude calculator 1110), the positive sequence current magnitude value 934 (e.g., via the amplitude calculator 1610), the expected direct negative sequence voltage signal 938a (e.g., via the interpolator 908), the expected quadrature negative sequence voltage signal 938b (e.g., via the interpolator 908), the direct negative sequence voltage signal 936a (e.g., via the low pass filter 2110), and/or the quadrature negative sequence voltage signal 936b (e.g., via the low pass filter 2110). The result of the latch signal 966 is to provide the negative sequence voltage difference value 950, the high pass filtered positive sequence voltage magnitude value 954, and the high pass filtered positive sequence current magnitude value 956 to the fault detector 910 for detection of a winding fault in the three-phase motor.

Figure 27:
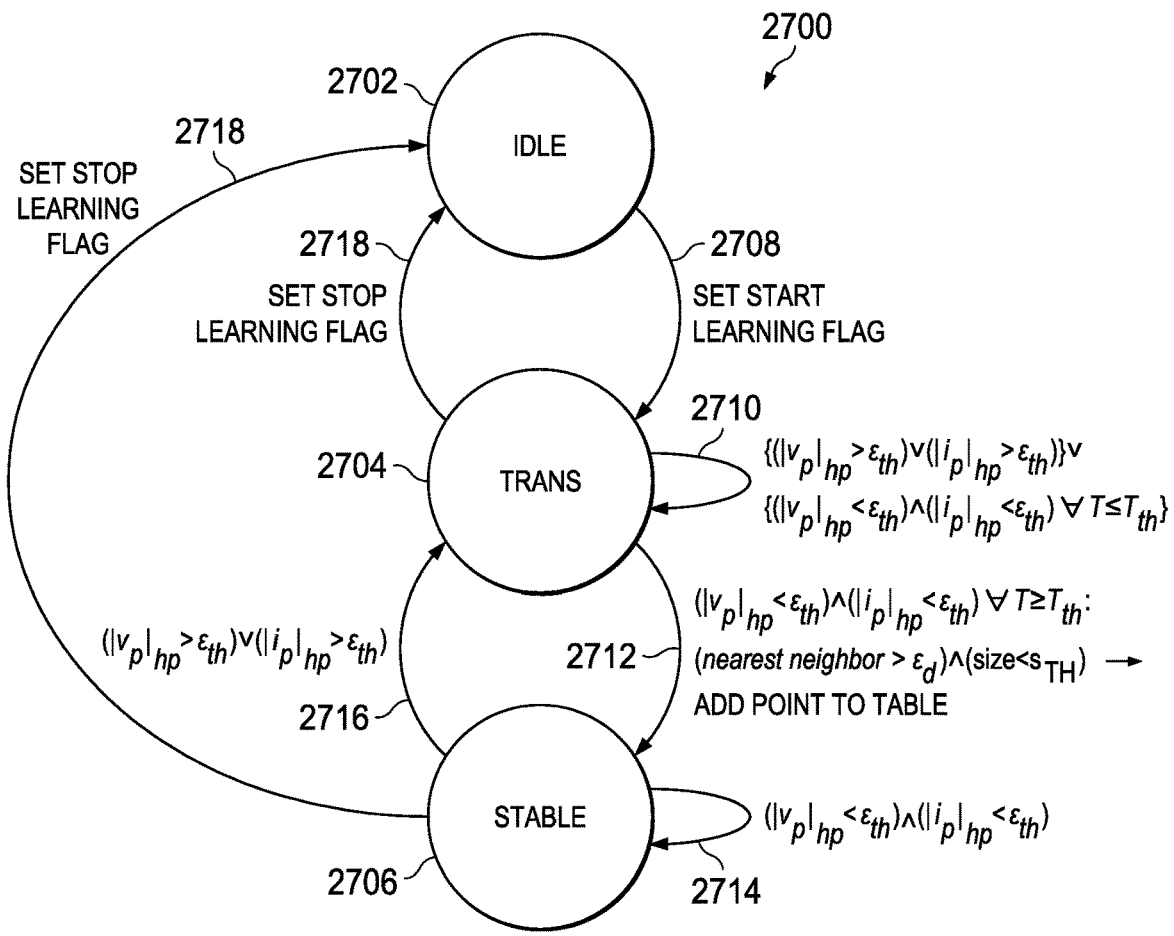
FIG. 27 is an example state machine representative of logic that may be implemented by the fault detection circuits of FIGS. 9 and/or 10 during a training phase of the fault detection circuits to store a set of training negative sequence voltage values corresponding to combinations of training positive sequence voltage magnitude values and training positive sequence current magnitude values.

FIG. 27 is an example state machine 2700 representative of logic that may be implemented by the learner 914 of FIGS. 9 and 10 during a training phase to store a set of training negative sequence voltage values corresponding to combinations of training positive sequence voltage magnitude values and training positive sequence current magnitude values. For example, when in the training phase, the example learner 914 stores the combinations of negative sequence voltage values, positive sequence voltage magnitude values, and positive sequence current magnitude values when a) a combination is at least a threshold distance from all other stored combinations and b) the combination to be stored is sufficiently stable (e.g., non-transient).

The example state machine 2700 includes an idle state 2702, a transient state 2704, and a stable state 2706. The example learner 914 is in the idle state 2702 when the fault detection circuit 900, 1000 are in protection mode.

In some examples, when the fault detection circuit 900, 1000 is initialized (e.g., turned on, started up), the example learner 914 initializes in the transient state 2704. In some other examples, the learner 914 initializes in the idle state 2702 and transitions 2708 to the transient state 2704 in response to a start learning flag. In the transient state 2704, the example learner 914 monitors the high pass filtered positive sequence voltage magnitude value 954 and the high pass filtered positive sequence current magnitude value 956 and compares them to threshold(s) $\varepsilon_{TH}$. The example threshold(s) $\varepsilon_{TH}$ may be, for example, a percentage change. In the example of FIG. 27, the threshold(s) are set to be relatively low values to reflect a low threshold for identifying a transient state in the high pass filtered positive sequence voltage magnitude value 954 and the high pass filtered positive sequence current magnitude value 956.

While either of the high pass filtered positive sequence voltage magnitude value 954 or the high pass filtered positive sequence current magnitude value 956 are greater than the respective threshold(s) $\varepsilon_{TH}$, or if the high pass filtered positive sequence voltage magnitude value 954 and the high pass filtered positive sequence current magnitude value 956 are both less than the respective threshold(s) $\varepsilon_{TH}$ for less than a threshold time $T_{TH}$, the example learner 914 remains in the transient state 2704 via a self-transition 2710.

On the other hand, when the high pass filtered positive sequence voltage magnitude value 954 and the high pass filtered positive sequence current magnitude value 956 are both less than the respective threshold(s) $\varepsilon_{TH}$ for at least the threshold time $T_{TH}$, the example learner 914 transitions 2712 to the stable state 2706.

As part of or in response to the transition 2712, the example learner 914 compares the stored combinations of the positive sequence voltage magnitude value 932 and the positive sequence current magnitude value 934 to the current operating point $(x_0, y_0)$ (e.g., a received positive sequence voltage magnitude value 932 and positive sequence current magnitude value 934 from which the high pass filtered positive sequence voltage magnitude value 954 and the high pass filtered positive sequence current magnitude value 956 are generated by the high pass filter 952) to determine a nearest neighbor $(x_1, y_1)$ to the current operating point. In other words, the learner 914 determines a stored combination that is closest to the current operating point $(x_0, y_0)$. When the nearest neighbor $(x_1, y_1)$ is identified, the example learner 914 determines whether a distance d (e.g., the Euclidean distance) between the current operating point $(x_0, y_0)$ and the nearest neighbor $(x_1, y_1)$ to a threshold distance $d_{TH}$. If the current operating point $(x_0, y_0)$ is less than the threshold distance $d_{TH}$ from the nearest neighbor $(x_1, y_1)$, the example learner 914 directly enters the stable state 2706.

On the other hand, if the current operating point $(x_0, y_0)$ is more than the threshold distance $d_{TH}$ from the nearest neighbor ($x_1$, $y_1$), the example learner 914 compares a size s of the table (e.g., a number of stored combinations in the baseline table 940) to a threshold table size $s_{TH}$. When the distance is more than the threshold distance $d_{TH}$, and the size s of the baseline table 940 is less than threshold table size $s_{TH}$, the example learner 914 stores the current operating point ($x_0$, $y_0$) as a combination in the baseline table 940, in association with the negative sequence voltage values of the current operating point ($x_0$, $y_0$) (e.g., from the negative sequence voltage calculator 906).

The example learner 914 remains in the stable state 2706 while the high pass filtered positive sequence voltage magnitude value 954 and the high pass filtered positive sequence current magnitude value 956 are both less than the respective threshold(s) $\varepsilon_{TH}$ via a self-transition 2714. When either of the high pass filtered positive sequence voltage magnitude value 954 or the high pass filtered positive sequence current magnitude value 956 are greater than the respective threshold(s) $\varepsilon_{TH}$, the example learner 914 transitions 2716 from the stable state 2706 to the transient state 2704.

When the table has at least a threshold number of combinations, the example learner 914 (or the interpolator 908 reading the table) sets a stop learning flag, which causes the learner 914 to transition 2718 from either the transient state 2704 or the stable state 2706 to the idle state 2702.

Figure 28:
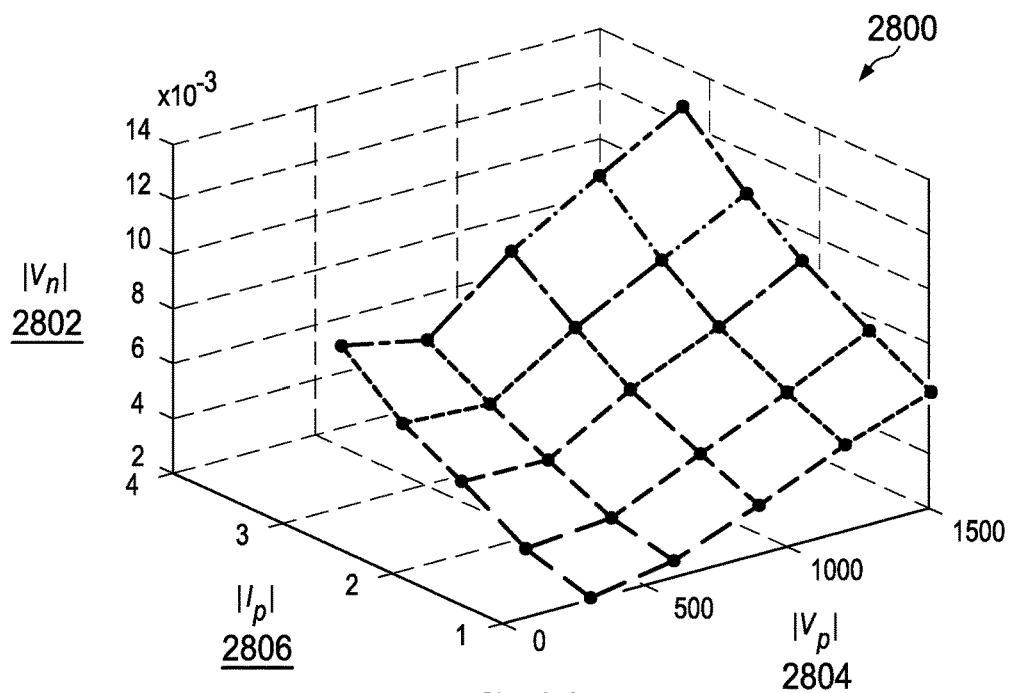
FIG. 28 illustrates an example set of training negative sequence voltage values corresponding to combinations of training positive sequence voltage magnitude values and training positive sequence current magnitude values that may be stored by the example learner of FIGS. 9 and/or 10 while implementing the state machine of FIG. 27 during a training phase of the fault detection circuits.

FIG. 28 is a graph 2800 illustrating an example set of negative sequence voltage values 2802 corresponding to combinations of positive sequence voltage magnitude values 2804 and positive sequence current magnitude values 2806 that may be stored by the example learner 914 of FIGS. 9 and/or 10 while implementing the state machine 2700 of FIG. 27 during a training phase. The example combinations of negative sequence voltage values 2802, positive sequence voltage magnitude values 2804, and positive sequence current magnitude values 2806 are stored in the example baseline table(s) 940 in the storage device 942 of FIGS. 9 and/or 10. The example points in the graph 2800 are example data points representing a combination of a negative sequence voltage value 2802, measured at a corresponding combination of a positive sequence voltage magnitude value 2804 and a positive sequence current magnitude value 2806. Because each motor is different and/or due to variations in construction of the fault detection circuits 900, 1000, the example graph 2800 and the points in the graph 2800 will be different for different implementations, which advantageously increases the sensitivity of the fault detection circuits to low level winding faults.

Figure 29:
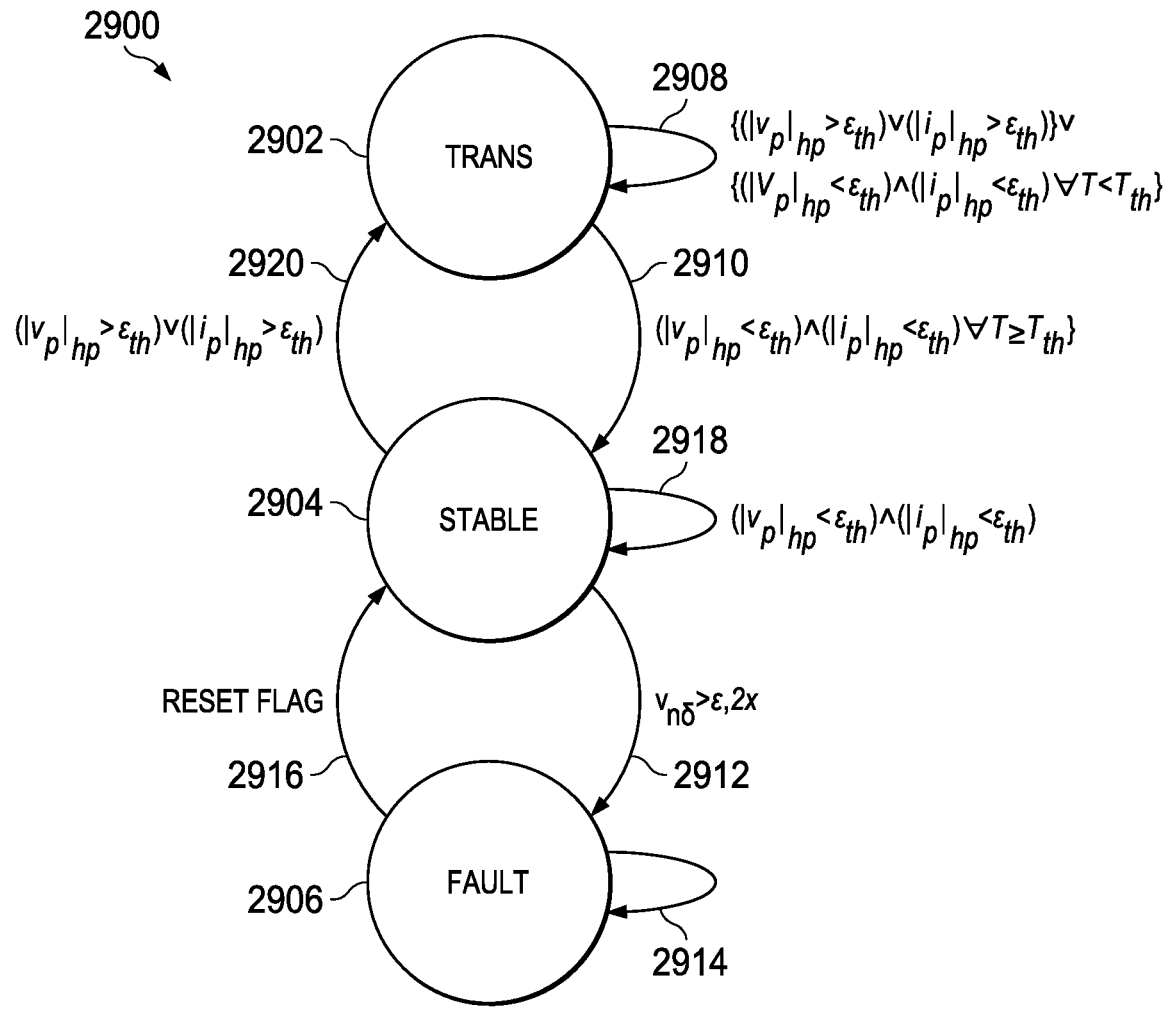
FIG. 29 is an example state machine representative of logic that may be implemented by the fault detection circuits of FIGS. 9 and/or 10 during a protection phase to detect an winding fault in a motor.

FIG. 29 is an example state machine 2900 representative of logic that may be implemented by the fault detector 910 of FIGS. 9 and/or 10 during a protection phase to detect a winding fault in a three-phase motor. As mentioned above, the example fault detector 910 receives the high pass filtered positive sequence voltage magnitude value 954, the high pass filtered positive sequence current magnitude value 956, and a negative sequence voltage difference value 950. The example state machine 2900 of FIG. 29 includes a transition state 2902, a stable state 2904, and a fault state 2906.

The example fault detector 910 is in the transition state 2902 when the high pass filtered positive sequence voltage magnitude value 954 and/or the high pass filtered positive sequence current magnitude value 956 indicate that the three-phase motor is transient (e.g., the speed of the motor is changing and/or the load on the motor is changing). In the example state machine 2900, the fault detector 910 is initialized into the transient state 2902 to avoid an false fault detection upon initialization.

The example transient state 2902 is similar to the transient state 2704 of FIG. 27, and the example stable state 2904 is similar to the example stable state 2706 of FIG. 27. In particular, transitions between the transient state 2902 and the stable state 2904 use a same or similar threshold $\varepsilon_{TH}$ as in the example state machine 2700 of FIG. 27.

While either of the high pass filtered positive sequence voltage magnitude value 954 or the high pass filtered positive sequence current magnitude value 956 are greater than the respective threshold(s) $\varepsilon_{TH}$, or if the high pass filtered positive sequence voltage magnitude value 954 and the high pass filtered positive sequence current magnitude value 956 are both less than the respective threshold(s) $\varepsilon_{TH}$ for less than a threshold time $T_{TH}$, the example fault detector 910 remains in the transient state 2902 via a self-transition 2908.

On the other hand, when the high pass filtered positive sequence voltage magnitude value 954 and the high pass filtered positive sequence current magnitude value 956 are both less than the respective threshold(s) $\varepsilon_{TH}$ for at least the threshold time $T_{TH}$, the example learner 914 transitions 2910 to the stable state 2904. In the stable state 2706, the example fault detector 910 may detect that a fault has occurred based on comparing the negative sequence voltage difference value 950 to a threshold deviation $dev_{TH}$. If the example fault detector 910 determines that the negative sequence voltage difference value 950 is more than the threshold deviation $dev_{TH}$ for at least a threshold number of consecutive samples of the negative sequence voltage difference value 950, the example fault detector 910 transitions to the fault state 2906 via a fault detection transition 2912.

In the fault state 2906, the example fault detector 910 outputs the fault detection signal 958 (e.g., a fault flag), which may be received by an operator of the motor to inform the operator of the potential winding fault condition. The example fault detector 910 remains in the fault state 2906 via a self-transition 2914 until the fault detection signal 958 (e.g., the fault flag) is reset. For example, after investigating the fault detection signal 958, the operator may determine that no fault exists and reset the fault detection signal 958, which causes the fault detector 910 to return to the stable state 2904 via a reset transition 2916.

If no fault is detected while the fault detector 910 is in the stable state 2904, the example fault detector 910 remains in the stable state 2904 via a self-transition 2918 while the high pass filtered positive sequence voltage magnitude value 954 and the high pass filtered positive sequence current magnitude value 956 are both less than the respective threshold(s) $\varepsilon_{TH}$. On the other hand, if either of the high pass filtered positive sequence voltage magnitude value 954 and/or the high pass filtered positive sequence current magnitude value 956 satisfy the respective threshold(s) $\varepsilon_{TH}$, the example fault detector 910 transitions 2920 to the transient state 2902.

Figure 30:
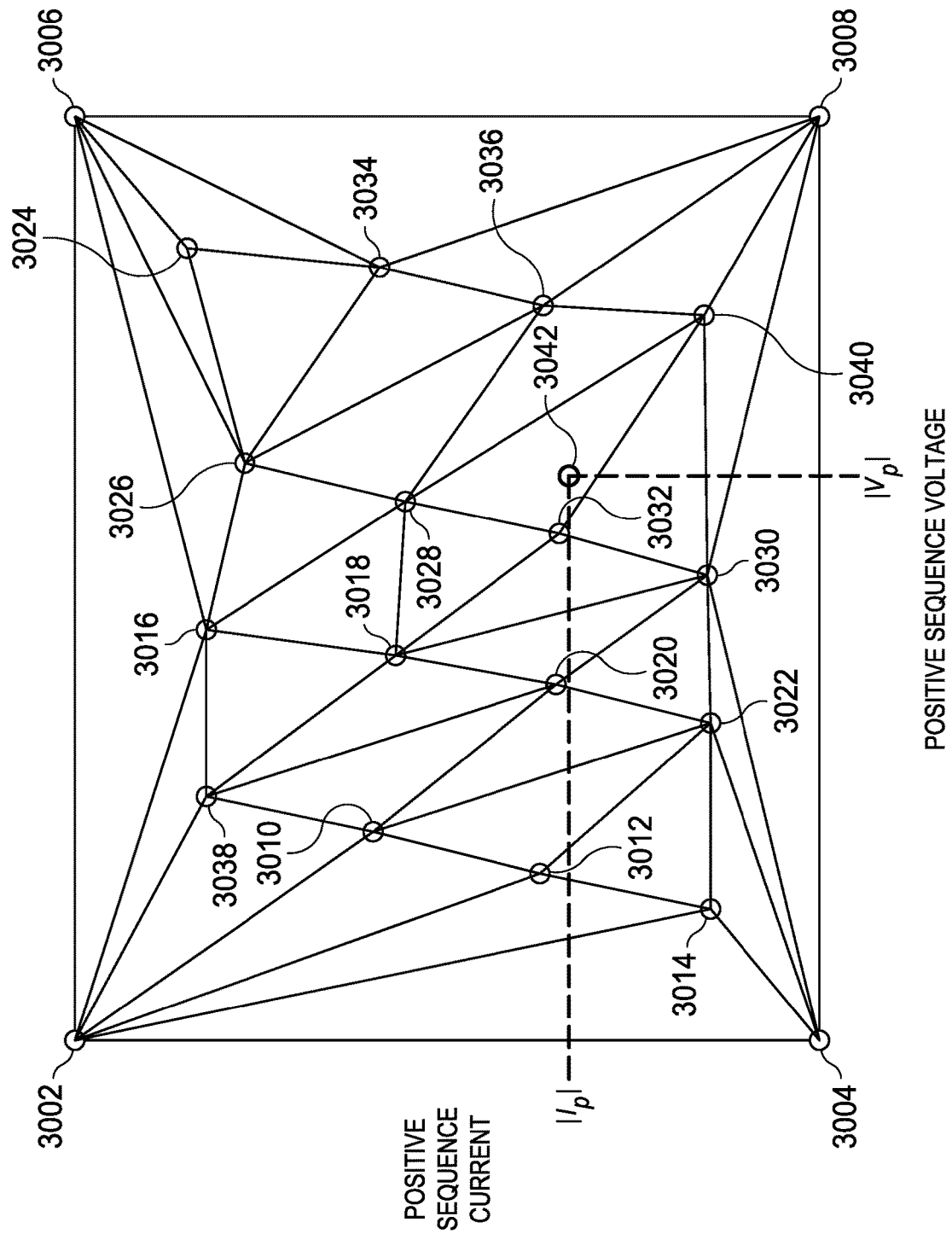
FIG. 30 illustrates an example operating point space including a set of negative sequence voltage values.

FIG. 30 illustrates an example operating point space 3000 including a set of negative sequence voltage values 3002-3040. The negative sequence voltage values 3002-3040 are located within the operating point space 3000 based on combinations of positive sequence voltage magnitude values and positive sequence current magnitude values that correspond to the negative sequence voltage values 3002-3040. The example interpolator 908 of FIGS. 9 and/or 10 determines an expected direct negative sequence voltage signal 938a and/or an expected quadrature negative sequence voltage signal 938b from the negative sequence voltage values 3002-3040. In some examples, the negative sequence voltage values 3002-3040 are amplitudes from which the direct and quadrature components can be calculated.

The example interpolator 908 of FIG. 9 identifies the location of a current operating point 3042 in the operating point space 3000 based on the positive sequence voltage magnitude value 932 (e.g., |Vp|) received from the positive sequence voltage magnitude calculator 902 and the positive sequence current magnitude value 934 (e.g., |Ip|) received from the positive sequence current magnitude calculator 904. As described above, the example interpolator 908 then identifies the four closest ones of the negative sequence voltage values 3002-3040 (e.g., the 4 nearest neighbors) based on Euclidean distance in the operating point space 3000 (e.g., in the positive sequence voltage magnitude, positive sequence current magnitude plane). Of the example negative sequence voltage values 3002-3040, the 4 nearest neighbors to the current operating point 3042 are, from nearest to farthest, the point 3032, the point 3028, the point 3036, and the point 3030.

The example interpolator 908 determines that all 4 of the nearest neighbors 3032, 3028, 3036, 3030 are within the threshold distance from the operating point 3042. Accordingly, the interpolator 908 checks the co-linearity of the three nearest neighbors 3032, 3028, and 3036 using the example Equations 2-6 above, and determines that the points are not too co-linear.

The example interpolator 908 proceeds to fit a plane to the three nearest neighbors 3032, 3028, and 3036 using the example Equations 7-10 above. Using the calculated plane and the nearest point 3032, the example interpolator 908 calculates an expected negative sequence voltage value for the current operating point 3042 using Equation 11 above. When the calculated expected negative sequence voltage value is an amplitude, the example interpolator 908 calculates the direct and quadrature values from the calculated expected negative sequence voltage value using the concurrent phase of the phase signals (e.g., from the data acquisition controller 912).

While example manners of implementing the fault detection circuit 102, 300 of FIGS. 1-3 are illustrated in FIGS. 9 and 10, one or more of the elements, processes and/or devices illustrated in FIGS. 9 and 10 may be combined, divided, re-arranged, omitted, eliminated and/or implemented in any other way. Further, the example positive sequence voltage magnitude calculators 902, the example positive sequence current magnitude calculators 904, the example negative sequence voltage calculators 906, the example interpolator 908, the example fault detector 910, the example data acquisition controllers 912, 2600, the example learner 914, the example Clarke transformers 918, 928, 1002, 1004, the example subtractors 944a, 944b, the example amplitude calculators 948, 1110, 1610, the example high pass filter 952, the example Park transformers 1102, 1602, the example windowers 1104, 1604, 2104, the example integrators 1106, 1606, 2106, the example positive sequence voltage magnitude buffer 1108, the example positive sequence current magnitude buffer 1608, the example negative sequence voltage buffer 2108, the example low pass filter 2110, the example zero crossing detector 2602, the example angular change calculator 2606, the example sample counter 2604, the example sampling clock 2608, the example phase angle calculator 2610, the example window angle calculator 2612, the example reset trigger 2614 and/or, more generally, the example fault detection circuits 102, 300, 900, 1000 of FIGS. 1, 2, 3, 9, and/or 10 may be implemented by hardware, software, firmware and/or any combination of hardware, software and/or firmware. Thus, for example, any of the example positive sequence voltage magnitude calculators 902, the example positive sequence current magnitude calculators 904, the example negative sequence voltage calculators 906, the example interpolator 908, the example fault detector 910, the example data acquisition controllers 912, 2600, the example learner 914, the example Clarke transformers 918, 928, 1002, 1004, the example subtractors 944a, 944b, the example amplitude calculators 948, 1110, 1610, the example high pass filter 952, the example Park transformers 1102, 1602, the example windowers 1104, 1604, 2104, the example integrators 1106, 1606, 2106, the example positive sequence voltage magnitude buffer 1108, the example positive sequence current magnitude buffer 1608, the example negative sequence voltage buffer 2108, the example low pass filter 2110, the example zero crossing detector 2602, the example angular change calculator 2606, the example sample counter 2604, the example sampling clock 2608, the example phase angle calculator 2610, the example window angle calculator 2612, the example reset trigger 2614 and/or, more generally, the example fault detection circuits 102, 300, 900, 1000 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example positive sequence voltage magnitude calculators 902, the example positive sequence current magnitude calculators 904, the example negative sequence voltage calculators 906, the example interpolator 908, the example fault detector 910, the example data acquisition controllers 912, 2600, the example learner 914, the example Clarke transformers 918, 928, 1002, 1004, the example subtractors 944a, 944b, the example amplitude calculators 948, 1110, 1610, the example high pass filter 952, the example Park transformers 1102, 1602, the example windowers 1104, 1604, 2104, the example integrators 1106, 1606, 2106, the example positive sequence voltage magnitude buffer 1108, the example positive sequence current magnitude buffer 1608, the example negative sequence voltage buffer 2108, the example low pass filter 2110, the example zero crossing detector 2602, the example angular change calculator 2606, the example sample counter 2604, the example sampling clock 2608, the example phase angle calculator 2610, the example window angle calculator 2612, and/or the example reset trigger 2614 is/are hereby expressly defined to include a tangible computer readable storage device or storage disk such as a memory, a digital versatile disk (DVD), a compact disk (CD), a Blu-ray disk, etc. storing the software and/or firmware. Further still, the example fault detection circuits 102, 300, 900, 1000 of FIGS. 1, 2, 3, 9, and/or 10 may include one or more elements, processes and/or devices in addition to, or instead of, those illustrated in FIGS. 1, 2, 3, 9, and/or 10, and/or may include more than one of any or all of the illustrated elements, processes and devices.

Flowcharts representative of example machine readable instructions for implementing the fault detection circuits 102, 300, 900, 1000 of FIGS. 1, 2, 3, 9, and/or 10 are shown in FIGS. 31A-31B, 32A-32B, 33A-33B, 34A-34B, 35A-35E, and 36. In this example, the machine readable instructions comprise program(s) for execution by a processor such as the processors 4512, 4612 shown in the example processor platforms 4500, 4600 discussed below in connection with FIGS. 45 and 46. The program(s) may be embodied in software stored on a tangible computer readable storage medium such as a CD-ROM, a floppy disk, a hard drive, a digital versatile disk (DVD), a Blu-ray disk, or a memory associated with the processors 4512, 4612, but the entire program(s) and/or parts thereof could alternatively be executed by a device other than the processors 4512, 4612 and/or embodied in firmware or dedicated hardware. Further, although the example program(s) are described with reference to the flowcharts illustrated in FIGS. 31A-31B, 32A-32B, 33A-33B, 34A-34B, 35A-35E, and 36, many other methods of implementing the example fault detection circuits 102, 300, 900, 1000 of FIGS. 1, 2, 3, 9, and/or 10 may alternatively be used. For example, the order of execution of the blocks may be changed, and/or some of the blocks described may be changed, eliminated, or combined.

As mentioned above, the example processes of FIGS. 31A-31B, 32A-32B, 33A-33B, 34A-34B, 35A-35E, and 36 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and transmission media. As used herein, "tangible computer readable storage medium" and "tangible machine readable storage medium" are used interchangeably. Additionally or alternatively, the example processes of FIGS. 31A-31B, 32A-32B, 33A-33B, 34A-34B, 35A-35E, and 36 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and transmission media. As used herein, when the phrase "at least" is used as the transition term in a preamble of a claim, it is open-ended in the same manner as the term "comprising" is open ended.

Figure 31A:
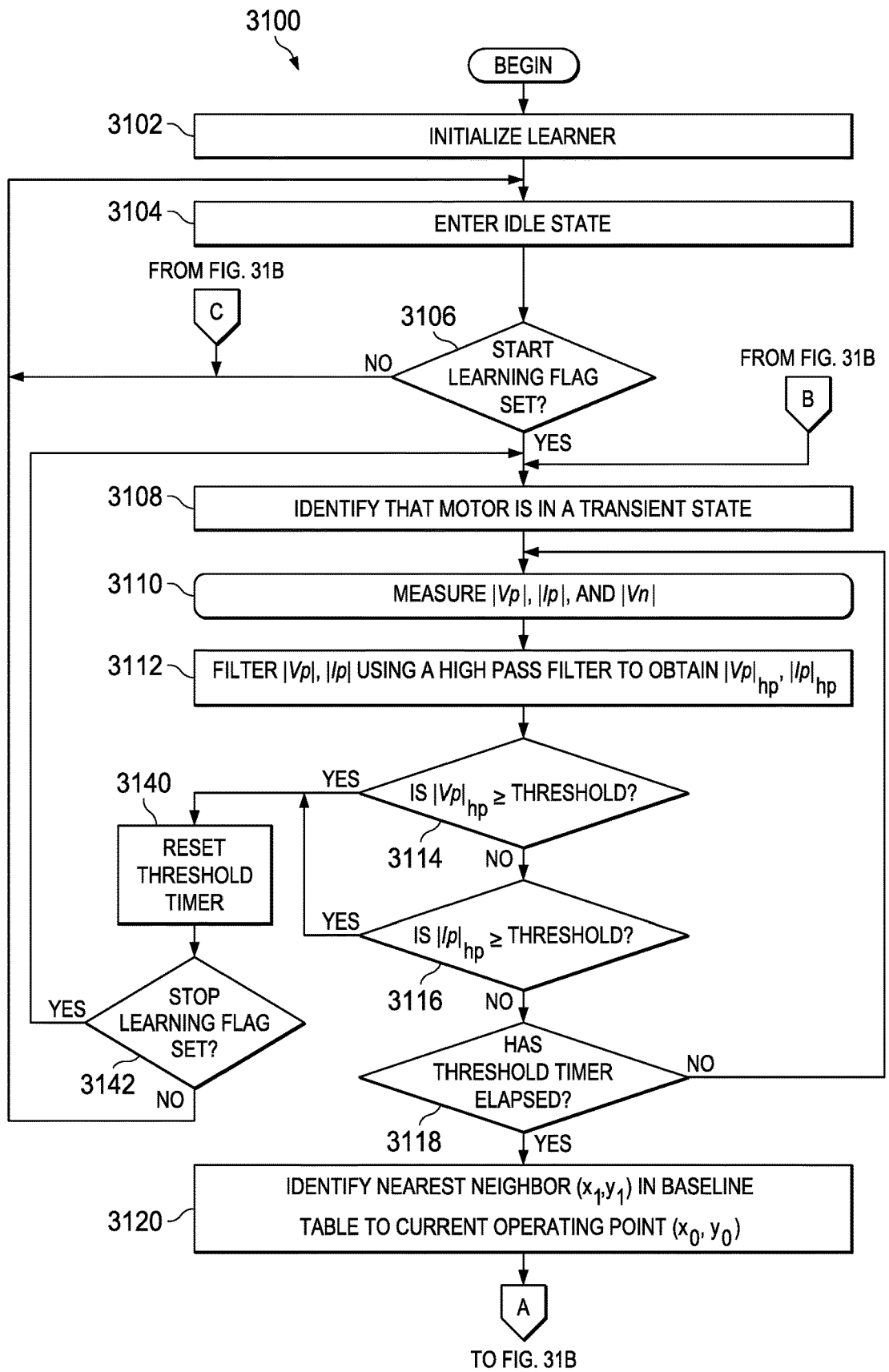
FIG. 31A-31B is a flowchart representative of example machine readable instructions which may be executed to implement the example fault detection circuits of FIGS. 9 and/or 10 to conduct a training phase to store a set of training negative sequence voltage values corresponding to combinations of training positive sequence voltage magnitude values and training positive sequence current magnitude values.
Figure 31B:
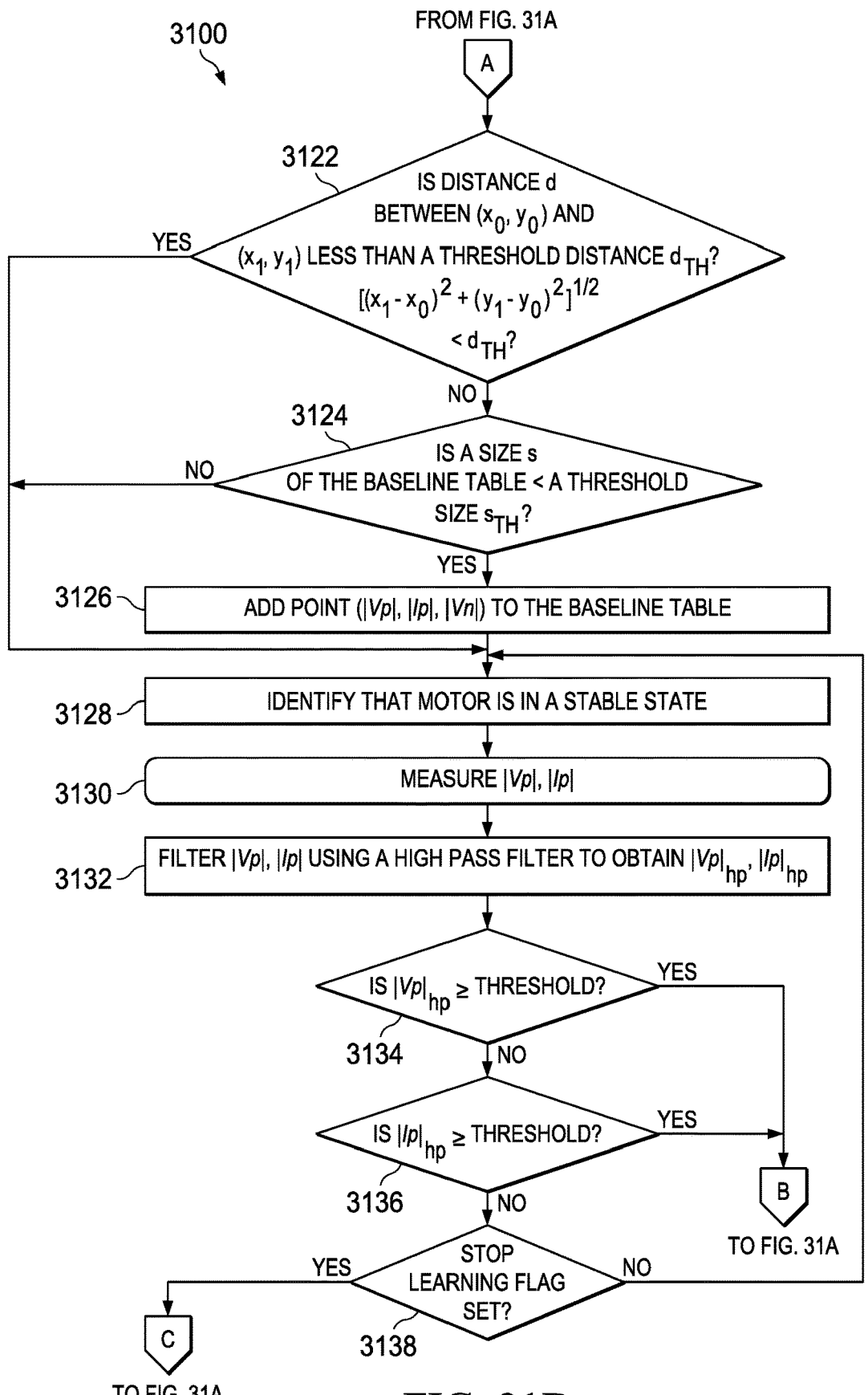

FIG. 31A-31B is a flowchart representative of example machine readable instructions 3100 which may be executed to implement the example learner 914 of FIGS. 9 and/or 10 to conduct a training phase to store a set of training negative sequence voltage values corresponding to combinations of training positive sequence voltage magnitude values and training positive sequence current magnitude values. The example flowchart 3100 of FIG. 31A-31B may be executed to implement the example state machine 2700 of FIG. 27.

The example learner 914 of FIG. 9 is initialized (e.g., turned on, started) (block 3102). At initialization, the example learner 914 enters an idle state (e.g., the idle state 2702 of FIG. 27) (block 3104). In the idle state 2702, a start learning flag is not set. The example learner 914 determines whether the start learning flag has been set (block 3106). If the start learning flag has not been set (block 3106), the example learner 914 returns control to block 3104 to remain in the idle state.

When the start learning flag is set (block 3106), the learner 914 identifies that the motor is in a transient state (e.g., the transient state 2704 of FIG. 27) (block 3108). The motor may, in fact, be in a steady state when the start learning flag is set, but the example learner 914 assumes that the motor is in the transient state 2704.

The example learner 914 measures the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$) (block 3110). For example, the learner 914 may obtain the positive sequence voltage magnitude value 932 (e.g., $|V_p|$) from the positive sequence voltage magnitude calculator 902, the positive sequence current magnitude value 934 (e.g., $|I_p|$) from the positive sequence current magnitude calculator 904, and the negative sequence voltage values 936a, 936b (e.g., $V_{nd}$, $V_{nq}$) from the negative sequence voltage calculator 906, controlled by the data acquisition controller 912. Example instructions to implement block 3110 are described below with reference to FIGS. 35A-35E.

The example high pass filter 952 executes a high pass filter to filter the positive sequence voltage magnitude value 932 (e.g., $|V_p|$) to obtain a filtered positive sequence voltage magnitude value 954 (e.g., $|V_p|_{hp}$) and filters the positive sequence current magnitude value 934 (e.g., $|I_p|_{hp}$) to obtain a filtered positive sequence current magnitude value 956 (block 3112). The example learner 914 determines whether the filtered positive sequence voltage magnitude value 954 (e.g., $|V_p|_{hp}$) is greater than (or equal to) a threshold value (e.g., $\varepsilon_{TH}$) (block 3114). If the filtered positive sequence voltage magnitude value 954 (e.g., $|V_p|_{hp}$) is not greater than (or equal to) the threshold value (e.g., $\varepsilon_{TH}$) (block 3114), the example learner 914 determines whether the positive sequence current magnitude value 956 (e.g., $|I_p|_{hp}$) is greater than (or equal to) a threshold value (e.g., $\varepsilon_{TH}$) (block 3116).

When the filtered positive sequence current magnitude value 956 (e.g., $|V_p|_{hp}$) is not greater than (or equal to) a threshold value (e.g., $\varepsilon_{TH}$) (block 3116), the example learner 914 determines whether a threshold timer has elapsed (block 3118). For example, the learner 914 may determine whether a time T has reached a threshold time $T_{TH}$. If the threshold timer has not elapsed (block 3118), control returns to block 3110 to repeat the measurements of the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$).

On the other hand, if the threshold timer has elapsed (block 3118), the example learner 914 identifies a nearest neighbor ($x_1$, $y_1$) in the a baseline table (e.g., the baseline table 940 of FIGS. 9 and/or 10) to the current operating point ($x_0$, $y_0$) (block 3120). The current operating point used in block 3120 refers to a combination of the positive sequence voltage magnitude value 932 (e.g., $|V_p|$) and the positive sequence current magnitude value 934 (e.g., $|I_p|$) measured in block 3110. The nearest neighbor ($x_1$, $y_1$) refers to a combination of the positive sequence voltage magnitude value 932 (e.g., $|V_p|$) and the positive sequence current magnitude value 934 (e.g., $|I_p|$) stored in the baseline table 940 that has a corresponding negative sequence voltage value and has a shortest Euclidean distance to the current operating point ($x_0$, $y_0$) in the x, y plane.

The example learner 914 determines whether a distance d between the current operating point ($x_0$, $y_0$) and the nearest neighbor ($x_1$, $y_1$) is less than (or equal to) a threshold distance $d_{TH}$ (block 3122). For example, the learner 914 may determine whether the Euclidean distance between the current operating point ($x_0$, $y_0$) and the nearest neighbor ($x_1$, $y_1$) in the x, y plane (e.g., using the Pythagorean theorem) is less than or equal to the threshold distance $d_{TH}$.

If the distance d between the current operating point ($x_0$, $y_0$) and the nearest neighbor ($x_1$, $y_1$) is greater than the threshold distance $d_{TH}$ (block 3122), the example learner 914 determines whether a size s of the baseline table 940 (e.g., in numbers of stored combinations) is less than a threshold size $s_{TH}$ (block 3124). If the size s of the baseline table 940 is less than the threshold size $s_{TH}$ (block 3124), the example learner 914 adds a point to the baseline table 940 that includes the combination of the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$) and/or an amplitude of the negative sequence voltage values 936a, 936b (e.g., $|V_p|$, $|I_p|$, $V_{nd}$, $V_{nq}$ and/or $|V_p|$, $|I_p|$, $|V_n|$) (block 3126).

After storing the point (block 3126), if the size s of the baseline table 940 is at least the threshold size $s_{TH}$ (block 3124), or if the distance d between the current operating point ($x_0$, $y_0$) and the nearest neighbor ($x_1$, $y_1$) is less than or equal to the threshold distance $d_{TH}$ (block 3122), the example learner 914 identifies that the motor is in a stable state (or steady state) (block 3128). The stable state of block 3128 corresponds to the example stable state 2706 of FIG. 27.

The example learner 914 measures the positive sequence voltage magnitude value 932 (e.g., $|V_p|$) and the positive sequence current magnitude value 934 (e.g., $|I_p|$) (block 3130). The example high pass filter 952 executes a high pass filter to filter the positive sequence voltage magnitude value 932 (e.g., $|V_p|$) to obtain a filtered positive sequence voltage magnitude value 954 (e.g., $|V_p|_{hp}$) and filters the positive sequence current magnitude value 934 (e.g., $|I_p|_{hp}$) to obtain a filtered positive sequence current magnitude value 956 (block 3132). The example learner 914 determines whether the filtered positive sequence voltage magnitude value 954 (e.g., $|V_p|_{hp}$) is greater than (or equal to) the threshold value (e.g., $\varepsilon_{TH}$) (block 3134). If the filtered positive sequence voltage magnitude value 954 (e.g., $|V_p|_{hp}$) is not greater than (or equal to) the threshold value (e.g., $\varepsilon_{TH}$) (block 3134), the example learner 914 determines whether the filtered positive sequence current magnitude value 956 (e.g., $|I_p|_{hp}$) is greater than (or equal to) a threshold value (e.g., $\varepsilon_{TH}$) (block 3136).

When either of the filtered positive sequence voltage magnitude value 954 (e.g., $|V_p|_{hp}$) is greater than (or equal to) the threshold value (e.g., $\varepsilon_{TH}$) (block 3134) or the positive sequence current magnitude value 956 (e.g., $|I_p|_{hp}$) is greater than (or equal to) a threshold value (e.g., $\varepsilon_{TH}$) (block 3136), the learner 914 identifies that the motor is in a transient state and returns control to block 3108.

When the filtered positive sequence voltage magnitude value 954 (e.g., $|V_p|_{hp}$) is less than the threshold value (e.g., $\varepsilon_{TH}$) (block 3134) and the filtered positive sequence current magnitude value 956 (e.g., $|I_p|_{hp}$) is less than the threshold value (e.g., $\varepsilon_{TH}$) (block 3136), the example learner 914 determines whether a stop learning flag has been set (block 3138). If the stop learning flag has not been set (block 3138), the learner 914 returns control to block 3128 and remains in the stable state 2706.

On the other hand, if the stop learning flag has been set (block 3138), the example learner 914 returns to the idle state 2702 and returns control to block 3104.

When, in the transient state 2704, either of the filtered positive sequence voltage magnitude value 954 (e.g., $|V_p|_{hp}$) is greater than (or equal to) the threshold value (e.g., $\varepsilon_{TH}$) (block 3114) or the filtered positive sequence current magnitude value 956 (e.g., $|I_p|_{hp}$) is greater than (or equal to) a threshold value (e.g., $\varepsilon_{TH}$) (block 3116), the example learner 914 resets the threshold timer T (block 3140).

The example learner 914 determines whether a stop learning flag has been set (block 3142). If the stop learning flag has not been set (block 3142), the learner 914 returns control to block 3108 and remains in the transient state 2704. On the other hand, if the stop learning flag has been set (block 3138), the example learner 914 returns to the idle state 2702 and returns control to block 3104.

Figure 32A:
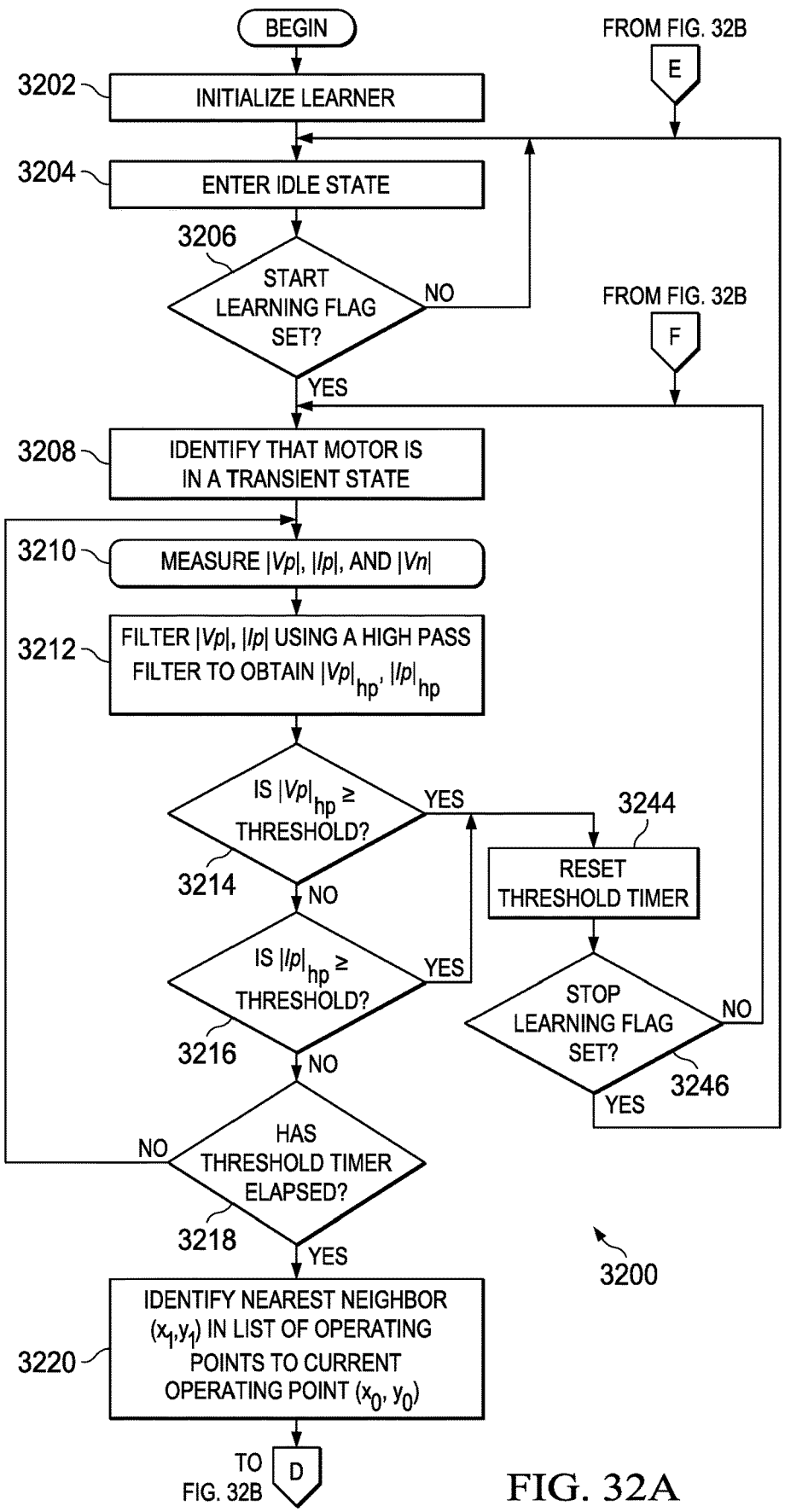
FIG. 32A-32B is a flowchart representative of example machine readable instructions which may be executed to implement the example fault detection circuits of FIGS. 9 and/or 10 to conduct a training phase to calculate weights for an equation to estimate expected negative sequence voltage values based on combinations of positive sequence voltage magnitude values and positive sequence current magnitude values.
Figure 32B:
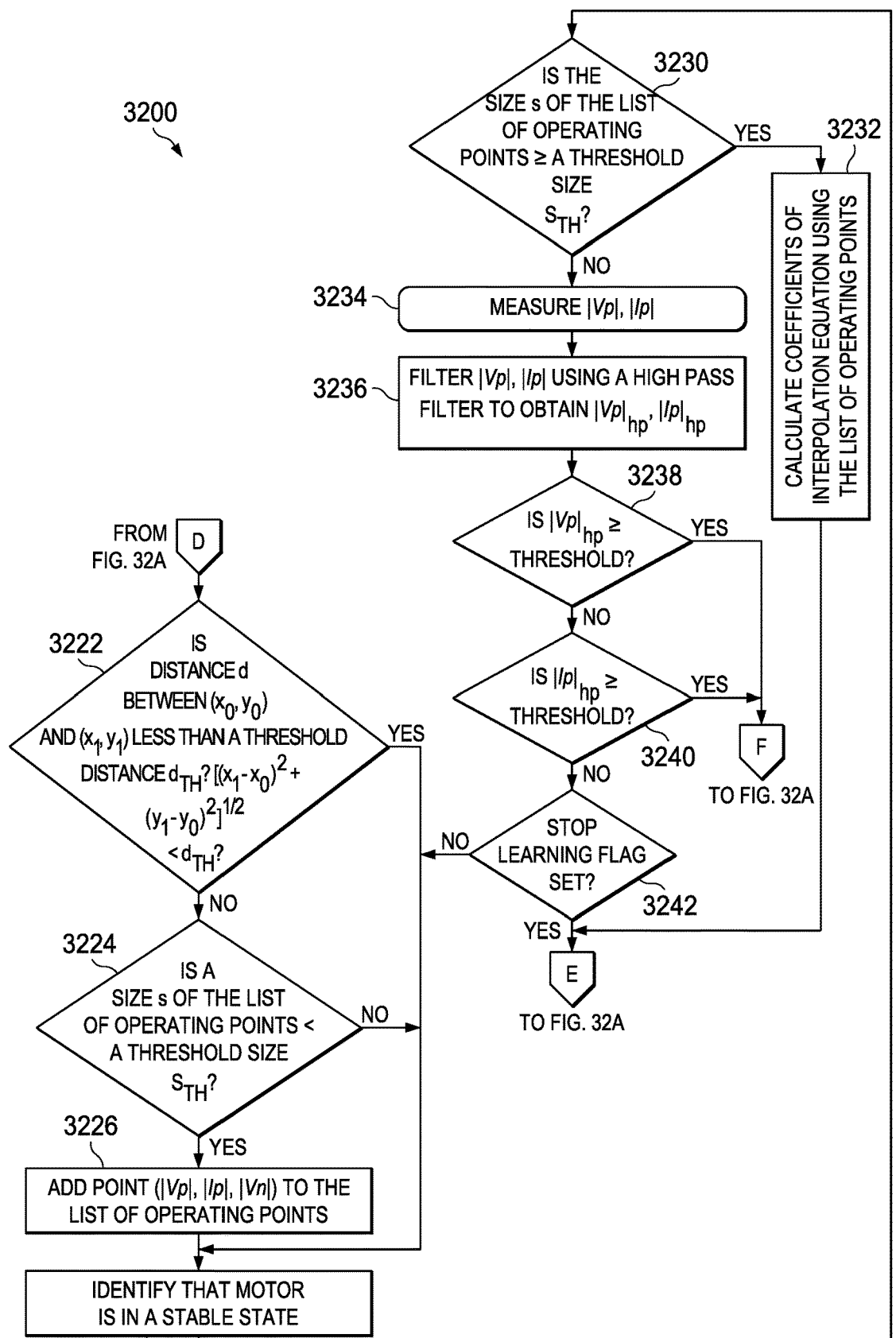

FIG. 32A-32B is a flowchart representative of example machine readable instructions 3200 which may be executed to implement the example learner 914 of FIGS. 9 and/or 10 to conduct a training phase to calculate weights or coefficients for an interpolation equation to estimate expected negative sequence voltage values based on combinations of positive sequence voltage magnitude values and positive sequence current magnitude values.

The example learner 914 of FIG. 9 is initialized (e.g., turned on, started) (block 3202). At initialization, the example learner 914 enters an idle state (e.g., the idle state 2702 of FIG. 27) (block 3204). In the idle state 2702, a start learning flag is not set. The example learner 914 determines whether the start learning flag has been set (block 3206). If the start learning flag has not been set (block 3206), the example learner 914 returns control to block 3204 to remain in the idle state.

When the start learning flag is set (block 3206), the learner 914 identifies that the motor is in a transient state (e.g., the transient state 2704 of FIG. 27) (block 3208). The motor may, in fact, be in a steady state when the start learning flag is set, but the example learner 914 assumes that the motor is in the transient state 2704.

The example learner 914 measures the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$) (block 3210). For example, the learner 914 may obtain the positive sequence voltage magnitude value 932 (e.g., $|V_p|$) from the positive sequence voltage magnitude calculator 902, the positive sequence current magnitude value 934 (e.g., $|I_p|$) from the positive sequence current magnitude calculator 904, and the negative sequence voltage values 936a, 936b (e.g., $V_{nd}$, $V_{nq}$) from the negative sequence voltage calculator 906, controlled by the data acquisition controller 912. Example instructions to implement block 3210 are described below with reference to FIGS. 35A-35E.

The example high pass filter 952 executes a high pass filter to filter the positive sequence voltage magnitude value 932 (e.g., $|V_p|$) to obtain a filtered positive sequence voltage magnitude value 954 (e.g., $|V_p|_{hp}$) and filters the positive sequence current magnitude value 934 (e.g., $|I_p|_{hp}$) to obtain a filtered positive sequence current magnitude value 956 (block 3212). The example learner 914 determines whether the filtered positive sequence voltage magnitude value 954 (e.g., $|V_p|_{hp}$) is greater than (or equal to) a threshold value (e.g., $\varepsilon_{TH}$) (block 3214). If the filtered positive sequence voltage magnitude value 954 (e.g., $|V_p|_{hp}$) is not greater than (or equal to) the threshold value (e.g., $\varepsilon_{TH}$) (block 3214), the example learner 914 determines whether the filtered positive sequence current magnitude value 956 (e.g., $|I_p|_{hp}$) is greater than (or equal to) a threshold value (e.g., $\varepsilon_{TH}$) (block 3216).

When the filtered positive sequence current magnitude value 956 (e.g., $|I_p|_{hp}$) is not greater than (or equal to) a threshold value (e.g., $\varepsilon_{TH}$) (block 3216), the example learner 914 determines whether a threshold timer has elapsed (block 3218). For example, the learner 914 may determine whether a time T has reached a threshold time $T_{TH}$. If the threshold timer has not elapsed (block 3218), control returns to block 3210 to repeat the measurements of the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$).

On the other hand, if the threshold timer has elapsed (block 3218), the example learner 914 identifies a nearest neighbor $(x_1, y_1)$ in a list of operating points (e.g., $(x_a, y_a)$, $(x_b, y_b)$, etc.) to the current operating point $(x_0, y_0)$ (block 3220). Each of the operating points in the list of operating points further corresponds to one or more negative sequence voltage values. The current operating point used in block 3220 refers to a combination of the positive sequence voltage magnitude value 932 (e.g., $|V_p|$) and the positive sequence current magnitude value 934 (e.g., $|I_p|$) measured in block 3210. The nearest neighbor $(x_1, y_1)$ refers to a combination of the positive sequence voltage magnitude value 932 (e.g., $|V_p|$) and the positive sequence current magnitude value 934 (e.g., $|I_p|$) stored in the list of operating points that has a corresponding negative sequence voltage value and has a shortest Euclidean distance to the current operating point $(x_0, y_0)$ in the x, y plane.

The example learner 914 determines whether a distance d between the current operating point $(x_0, y_0)$ and the nearest neighbor $(x_1, y_1)$ is less than (or equal to) a threshold distance $d_{TH}$ (block 3222). For example, the learner 914 may determine whether the Euclidean distance between the current operating point $(x_0, y_0)$ and the nearest neighbor $(x_1, y_1)$ in the x, y plane (e.g., using the Pythagorean theorem) is less than or equal to the threshold distance $d_{TH}$.

If the distance d between the current operating point $(x_0, y_0)$ and the nearest neighbor $(x_1, y_1)$ is greater than the threshold distance $d_{TH}$ (block 3222), the example learner 914 determines whether a size s of the list of operating points (e.g., in numbers of stored combinations) is less than a threshold size $s_{TH}$ (block 3224). If the size s of the list of operating points is less than the threshold size $s_{TH}$ (block 3224), the example learner 914 adds a point to the list of operating points that includes the combination of the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$) and/or an amplitude of the negative sequence voltage values 936a, 936b (e.g., $|V_p|$, $|I_p|$, $V_{nd}$, $V_{nq}$ and/or $|V_p|$, $|I_p|$, $|V_n|$) (block 3226).

After storing the point (block 3226), if the size s of the baseline table 940 is at least the threshold size $s_{TH}$ (block 3224), or if the distance d between the current operating point $(x_0, y_0)$ and the nearest neighbor $(x_1, y_1)$ is less than or equal to the threshold distance $d_{TH}$ (block 3222), the example learner 914 identifies that the motor is in a stable state (or steady state) (block 3228). The stable state of block 3228 corresponds to the example stable state 2706 of FIG. 27.

While in the stable state 2706, the example learner 914 determines whether the size s of the list of operating points is greater than or equal to the threshold size (block 3230). If the size s of the list of operating points is greater than or equal to the threshold size (block 3230), the example learner 914 calculates coefficients of an interpolation equation using the list of operating points (block 3232). For example, the learner 914 may attempt to fit one or more types of equations (e.g., polynomial equations) to the list of operating points, by calculating appropriate coefficients for the polynomial terms (e.g., $a_0$-$a_8$ of Equation 1 above). The example learner 914 attempts to find a best fit equation having less than a threshold error compared to the list of the operating points. After calculating the coefficients (block 3232), the example learner 914 returns control to block 3204 and enters the idle state 3204.

If the size s of the list of operating points is less than the threshold size (block 3230), the example learner 914 measures the positive sequence voltage magnitude value 932 (e.g., $|V_p|$) and the positive sequence current magnitude value 934 (e.g., $|I_p|$) (block 3234). The example high pass filter 952 executes a high pass filter to filter the positive sequence voltage magnitude value 932 (e.g., $|V_p|$) to obtain a filtered positive sequence voltage magnitude value 954 (e.g., $|V_p|_{hp}$) and filters the positive sequence current magnitude value 934 (e.g., $|I_p|_{hp}$) to obtain a filtered positive sequence current magnitude value 956 (block 3236). The example learner 914 determines whether the filtered positive sequence voltage magnitude value 954 (e.g., $|V_p|_{hp}$) is greater than (or equal to) the threshold value (e.g., $\varepsilon_{TH}$) (block 3238). If the filtered positive sequence voltage magnitude value 954 (e.g., $|V_p|_{hp}$) is not greater than (or equal to) the threshold value (e.g., $\varepsilon_{TH}$) (block 3238), the example learner 914 determines whether the filtered positive sequence current magnitude value 956 (e.g., $|I_p|_{hp}$) is greater than (or equal to) a threshold value (e.g., $\varepsilon_{TH}$) (block 3240).

When either of the filtered positive sequence voltage magnitude value 954 (e.g., $|V_p|_{hp}$) is greater than (or equal to) the threshold value (e.g., $\varepsilon_{TH}$) (block 3238) or the filtered positive sequence current magnitude value 956 (e.g., $|I_p|_{hp}$) is greater than (or equal to) a threshold value (e.g., $\varepsilon_{TH}$) (block 3240), the learner 914 identifies that the motor is in a transient state and returns control to block 3208.

When the filtered positive sequence voltage magnitude value 954 (e.g., $|V_p|_{hp}$) is less than the threshold value (e.g., $\varepsilon_{TH}$) (block 3238) and the filtered positive sequence current magnitude value 956 (e.g., $|I_p|_{hp}$) is less than the threshold value (e.g., $\varepsilon_{TH}$) (block 3240), the example learner 914 determines whether a stop learning flag has been set (block 3242). If the stop learning flag has not been set (block 3242), the learner 914 returns control to block 3228 and remains in the stable state 2706.

On the other hand, if the stop learning flag has been set (block 3242), the example learner 914 returns to the idle state 2702 and returns control to block 3204.

When, in the transient state 2704, either of the filtered positive sequence voltage magnitude value 954 (e.g., $|V_p|_{hp}$) is greater than (or equal to) the threshold value (e.g., $\varepsilon_{TH}$) (block 3214) or the filtered positive sequence current magnitude value 956 (e.g., $|I_p|_{hp}$) is greater than (or equal to) a threshold value (e.g., $\varepsilon_{TH}$) (block 3216), the example learner 914 resets the threshold timer T (block 3244).

The example learner 914 determines whether a stop learning flag has been set (block 3246). If the stop learning flag has not been set (block 3246), the learner 914 returns control to block 3208 and remains in the transient state 2704. On the other hand, if the stop learning flag has been set (block 3246), the example learner 914 returns to the idle state 2702 and returns control to block 3204.

FIG. 33 is a flowchart representative of example machine readable instructions 3300 which may be executed to implement the example fault detection circuits 900, 1000 of FIGS. 9 and/or 10 to detect an winding fault in a motor during a protection phase based on a stored set of negative sequence voltage values corresponding to combinations of positive sequence voltage magnitude values and positive sequence current magnitude values. The example instructions 3300 may be partially implemented by the fault detector 910 executing the state machine 1200 of FIG. 12 to perform a protection phase of the fault detection circuit 900, 1000.

The example fault detection circuit 900, 1000 measures the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$) (block 3304). For example, the fault detector 910 may obtain the positive sequence voltage magnitude value 932 (e.g., $|V_p|$) from the positive sequence voltage magnitude calculator 902, the positive sequence current magnitude value 934 (e.g., $|I_p|$) from the positive sequence current magnitude calculator 904, and the negative sequence voltage values 936a, 936b (e.g., $V_{nd}$, $V_{nq}$) from the negative sequence voltage calculator 906, controlled by the data acquisition controller 912. Example instructions to implement block 3304 are described below with reference to FIGS. 35A-35E.

The example high pass filter 952 executes a high pass filter to filter the positive sequence voltage magnitude value 932 (e.g., $|V_p|$) to obtain a filtered positive sequence voltage magnitude value 954 (e.g., $|V_p|_{hp}$) and filters the positive sequence current magnitude value 934 (e.g., $|I_p|_{hp}$) to obtain a filtered positive sequence current magnitude value 956 (block 3306). The example fault detector 910 determines whether the filtered positive sequence voltage magnitude value 954 (e.g., $|V_p|_{hp}$) is greater than (or equal to) a threshold value (e.g., $\varepsilon_{TH}$) (block 3308). If the filtered positive sequence voltage magnitude value 954 (e.g., $|V_p|_{hp}$) is not greater than (or equal to) the threshold value (e.g., $\varepsilon_{TH}$) (block 3308), the example learner 914 determines whether the filtered positive sequence current magnitude value 956 (e.g., $|I_p|_{hp}$) is greater than (or equal to) a threshold value (e.g., $\varepsilon_{TH}$) (block 3310).

When, in the transient state 1202, either of the filtered positive sequence voltage magnitude value 954 (e.g., $|V_p|_{hp}$) is greater than (or equal to) the threshold value (e.g., $\varepsilon_{TH}$) (block 3308) or the positive sequence current magnitude value 956 (e.g., $|I_p|_{hp}$) is greater than (or equal to) a threshold value (e.g., $\varepsilon_{TH}$) (block 3310), the example fault detector 910 resets a threshold timer T (block 3312). The fault detector 910 then returns control to block 3302 to remain in the transient state 1202.

On the other hand, when the filtered positive sequence current magnitude value 956 (e.g., $|I_p|_{hp}$) is not greater than (or equal to) the threshold value (e.g., $\varepsilon_{TH}$) (block 3310), the example fault detector 910 determines whether the threshold timer has elapsed (block 3314). For example, the learner 914 may determine whether a time T counted by the threshold timer has reached a threshold time T. If the threshold timer has not elapsed (block 3314), control returns to block 3304 to repeat the measurements of the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$).

Figure 33A:
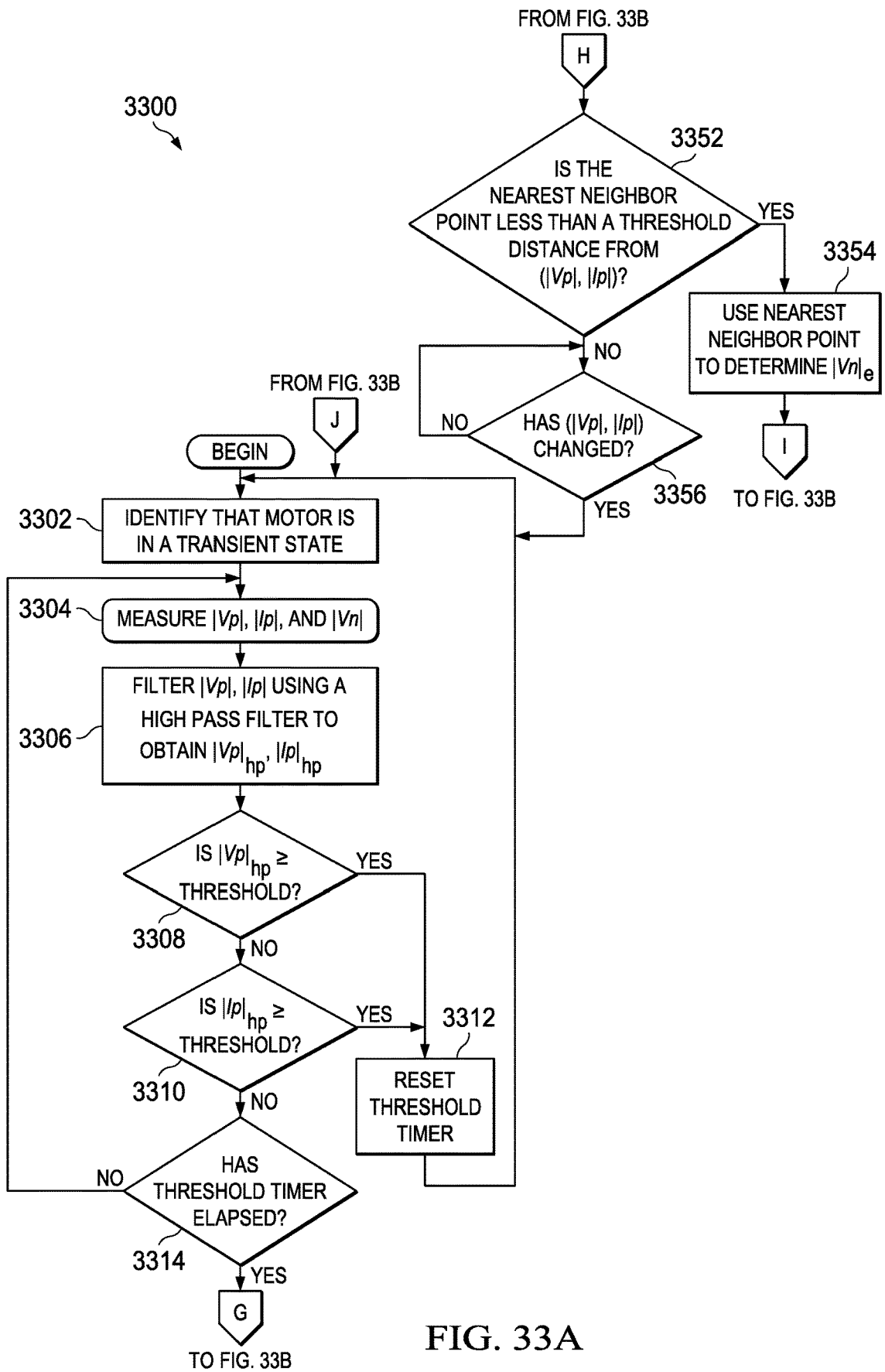
FIG. 33A-33B is a flowchart representative of example machine readable instructions which may be executed to implement the example fault detection circuits of FIGS. 9 and/or 10 to detect an winding fault in a motor during a protection phase based on a set of negative sequence voltage values corresponding to combinations of training positive sequence voltage magnitude values and training positive sequence current magnitude values.
Figure 33B:
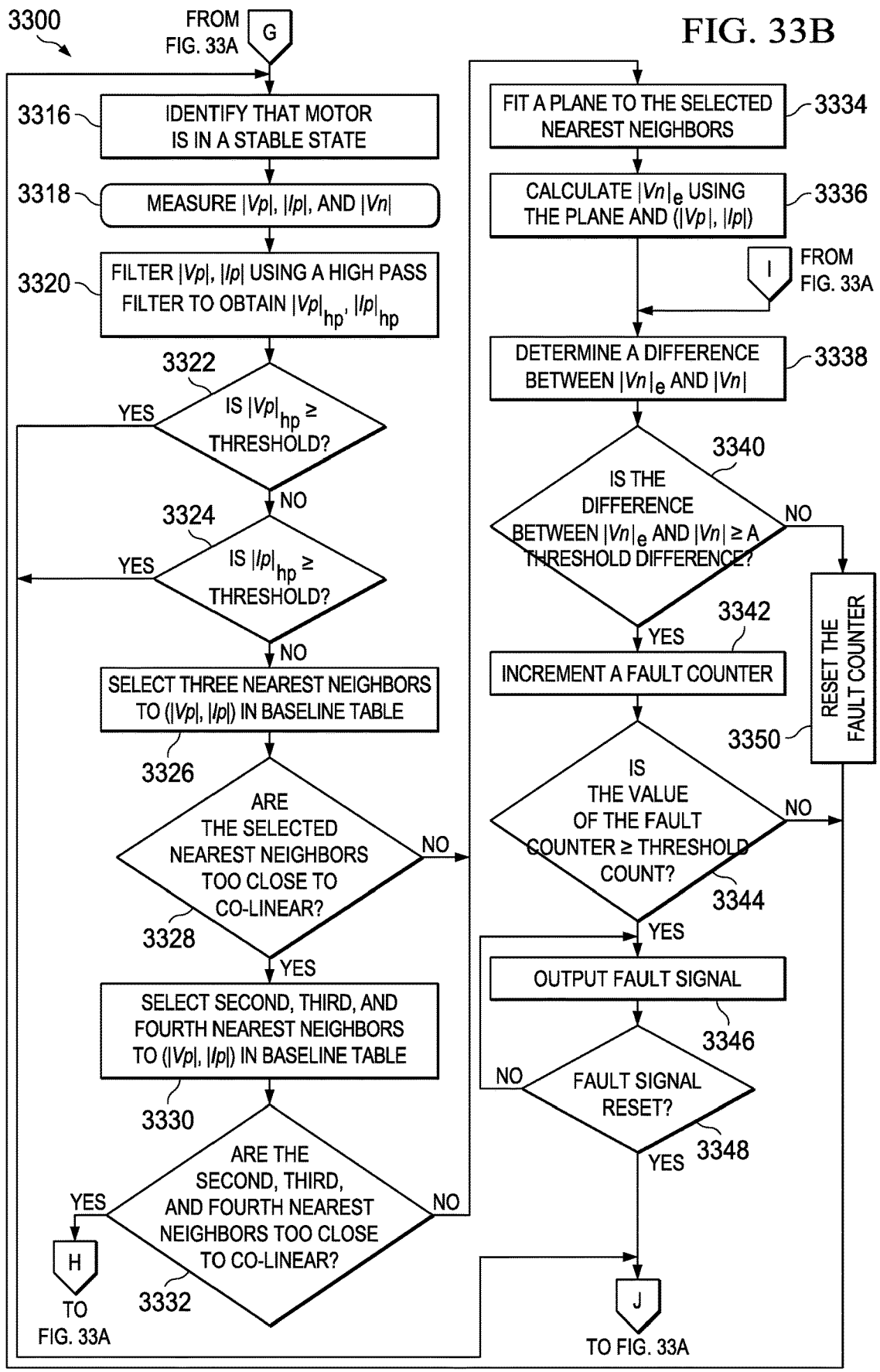

If the threshold timer has elapsed (block 3314), the example fault detector 910 identifies that the motor is in a stable state in block 3316 of FIG. 33B. The stable state of block 3316 corresponds to the stable state 1204 of FIG. 12.

The example fault detection circuit 900, 1000 measures the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$) (block 3318). For example, the fault detector 910 may obtain the positive sequence voltage magnitude value 932 (e.g., $|V_p|$) from the positive sequence voltage magnitude calculator 902, the positive sequence current magnitude value 934 (e.g., $|I_p|$) from the positive sequence current magnitude calculator 904, and the negative sequence voltage values 936a, 936b (e.g., $V_{nd}$, $V_{nq}$) from the negative sequence voltage calculator 906, controlled by the data acquisition controller 912. Example instructions to implement block 3318 are described below with reference to FIGS. 35A-35E.

The example high pass filter 952 executes a high pass filter to filter the positive sequence voltage magnitude value 932 (e.g., $|V_p|$) to obtain a filtered positive sequence voltage magnitude value 954 (e.g., $|V_p|_{hp}$) and filters the positive sequence current magnitude value 934 (e.g., $|I_p|_{hp}$) to obtain a filtered positive sequence current magnitude value 956 (block 3320). The example fault detector 910 determines whether the filtered positive sequence voltage magnitude value 954 (e.g., $|V_p|_{hp}$) is greater than (or equal to) a threshold value (e.g., $\varepsilon_{TH}$) (block 3322). If the filtered positive sequence voltage magnitude value 954 (e.g., $|V_p|_{hp}$) is not greater than (or equal to) the threshold value (e.g., $\varepsilon_{TH}$) (block 3322), the example learner 914 determines whether the filtered positive sequence current magnitude value 956 (e.g., $|I_p|_{hp}$) is greater than (or equal to) a threshold value (e.g., $\varepsilon_{TH}$) (block 3324).

When, in the stable state 1204, either of the filtered positive sequence voltage magnitude value 954 (e.g., $|V_p|_{hp}$) is greater than (or equal to) the threshold value (e.g., $\varepsilon_{TH}$) (block 3322) or the positive sequence current magnitude value 956 (e.g., $|I_p|_{hp}$) is greater than (or equal to) a threshold value (e.g., $\varepsilon_{TH}$) (block 3324), the example fault detector 910 returns control to block 3302 to return to the transient state 1202.

On the other hand, when the filtered positive sequence current magnitude value 956 (e.g., $|I_p|_{hp}$) is not greater than (or equal to) the threshold value (e.g., $\varepsilon_{TH}$) (block 3324), the example interpolator 908 selects the 3 nearest neighbor points to the current operating point ($|V_p|$, $|I_p|$) or ($x_0$, $y_0$) from the baseline table 940 (block 3326). For example, the interpolator 908 may determine Euclidean distances between the current operating point ($x_0$, $y_0$) and the other points in the baseline table 940 and select the 3 points in the baseline table with the shortest distances (e.g., ($x_1$, $y_1$), ($x_2$, $y_2$), and ($x_3$, $y_3$)). The example interpolator 908 determines whether the selected nearest neighbors ($x_1$, $y_1$), ($x_2$, $y_2$), and ($x_3$, $y_3$) are too co-linear (block 3328). For example, the interpolator 908 may use Equations 2-6 above, and/or fit a line between the first nearest neighbor ($x_1$, $y_1$) and the third nearest neighbor ($x_3$, $y_3$), and then determine whether the second nearest neighbor ($x_2$, $y_2$) is less than a threshold distance from the line.

If the selected nearest neighbors are too close to being co-linear (block 3328), the example interpolator 908 selects the $2^{nd}$, $3^{rd}$, and $4^{th}$ nearest neighbor points to the current operating point ($|V_p|$, $|I_p|$) or ($x_0$, $y_0$) from the baseline table 940 (block 3330). For example, the interpolator 908 may determine Euclidean distances between the current operating point ($x_0$, $y_0$) and the other points in the baseline table 940 (or use the distances determined in block 3326) and select the points in the baseline table with the $2^{nd}$, $3^{rd}$, and $4^{th}$ shortest distances (e.g., ($x_2$, $y_2$), ($x_3$, $y_3$), and ($x_4$, $y_4$)). The example interpolator 908 determines whether the selected nearest neighbors ($x_2$, $y_2$), ($x_3$, $y_3$), and ($x_4$, $y_4$) are too co-linear (block 3332). For example, the interpolator 908 may use Equations 2-6 above, and/or fit a line between the second nearest neighbor ($x_2$, $y_2$) and the fourth nearest neighbor ($x_4$, $y_4$), and then determine whether the third nearest neighbor ($x_3$, $y_3$) is less than the threshold distance from the line.

If the first selected nearest neighbors are not too co-linear (block 3328) or the second selected nearest neighbors are not too co-linear (block 3332), the example interpolator 908 fits a plane to the selected nearest neighbors (block 3334). For example, if the first selected nearest neighbors $(x_1, y_1)$, $(x_2, y_2)$, and $(x_3, y_3)$ are not too co-linear (block 3328), the interpolator 908 fits a plane to the first selected nearest neighbors. Alternatively, if the first selected nearest neighbors $(x_1, y_1)$, $(x_2, y_2)$, and $(x_3, y_3)$ are too co-linear (block 3328) but the second selected nearest neighbors $(x_2, y_2)$, $(x_3, y_3)$, and $(x_4, y_4)$ are not too co-linear (block 3332), the interpolator 908 fits a plane to the second selected nearest neighbors. The example interpolator 908 may calculate the plane using the example Equations 7-10 above.

The example interpolator 908 calculates an expected negative sequence voltage value $V_{ne}$ (or a direct expected negative sequence voltage value 938a and quadrature expected negative sequence voltage value 938b, which are the components of the expected negative sequence voltage value $V_{ne}$) using the plane and the current operating point $(|V_p|, |I_p|)$ (block 3336). The calculated plane defines negative sequence voltage values $V_n$ for any point on the plane. For example, the interpolator 908 may determine a negative sequence voltage value corresponding to the point on the plane on which the current operating point $(|V_p|, |I_p|)$ lies. The example interpolator 908 may use the example Equation 11 above to calculate the negative sequence voltage value(s). In some examples, the interpolator 908 determines an amplitude of the expected negative sequence voltage value $V_{ne}$ and calculates the direct and quadrature components of the expected negative sequence voltage value $V_{ne}$ from the amplitude and a phase angle (e.g., the phase angle being determined from the direct and quadrature components of the positive sequence voltage magnitude calculator 902).

The example subtractors 944a, 944b determine a difference value 946 between the expected negative sequence voltage values $V_{nde}$ and $V_{nqe}$ and the measured negative sequence voltage values $V_{nd}$ and $V_{nq}$ (block 3338). The example fault detector 910 determines whether the difference value 946 is greater than or equal to a threshold difference (block 3340). If the difference value 946 is greater than or equal to a threshold difference (block 3340), the example fault detector 910 increments a fault counter (block 3342). The fault detector 910 then determines whether the value of the fault counter is greater than or equal to a threshold count (block 3344).

If the value of the fault counter is greater than or equal to a threshold count (block 3344), the example fault detector 910 outputs the fault signal 958 (block 3346). Outputting the fault signal corresponds to the example fault state 1206 of FIG. 12. The example fault signal 958 may provide an alert to a motor controller (e.g., the motor controller 110 of FIGS. 1 and/or 2) and/or to an output to alert an operator of the detected winding fault. The fault detector 910 determines whether the fault signal has been reset (block 3348). For example, the fault detector 910 may receive an input that resets a fault flag and causes the fault detector 910 to return to the transient state 1202. If the fault signal has not been reset (block 3348), the example fault detector 910 remains in the fault state 1206 and returns control to block 3346. If the fault signal has been reset (block 3348), the example fault detector returns to the transient state 1202 and returns control to block 3302.

If the difference value 946 is less than the threshold difference (block 3340), the example fault detector 910 resets the fault counter (block 3350). After resetting the fault counter (block 3350), or if the value of the fault counter is less than the threshold count (block 3344), the example fault detector 910 returns control to block 3316 and remains in the stable state 1204).

If the $2^{nd}$, $3^{rd}$, and $4^{th}$ nearest neighbors are too close to co-linear (block 3332), the example interpolator 908 determines whether the nearest neighbor point $(x_1, y_1)$ is less than a threshold distance from the current operating point $(|V_p|, |I_p|)$ (block 3352). If the nearest neighbor point $(x_1, y_1)$ is less than a threshold distance from the current operating point $(|V_p|, |I_p|)$, the example interpolator 908 uses the nearest neighbor point $(x_1, y_1)$ to determine the expected negative sequence voltage values 938a, 938b ($V_{nde}$ and $V_{nqe}$) (block 3354). The example interpolator 908 then passes control to block 3338 to determine a difference value 946 between the expected negative sequence voltage values $V_{nde}$ and $V_{nqe}$ and the measured negative sequence voltage values $V_{nd}$ and $V_{nq}$.

If the nearest neighbor point $(x_1, y_1)$ is not less than the threshold distance from the current operating point $(|V_p|, |I_p|)$ (block 3352), the example fault detection circuit 900, 1000 may be disabled until the current operating point changes. The example interpolator 908 determines whether the current operating point $(|V_p|, |I_p|)$ has changed (block 3356). While the current operating point $(|V_p|, |I_p|)$ does not change, the example interpolator 908 loops block 3356. When the current operating point $(|V_p|, |I_p|)$ changes (block 3356), or when the fault signal is reset (block 3348), the example fault detector 910 returns to the transient state 1202 and the fault detection circuit 900, 1000 returns control to block 3302.

FIG. 34 is a flowchart representative of example machine readable instructions which may be executed to implement the example fault detection circuits 900, 1000 of FIGS. 9 and/or 10 to detect an winding fault in a motor during a protection phase using an interpolation equation to estimate expected negative sequence voltage values based on combinations of positive sequence voltage magnitude values and positive sequence current magnitude values. The example instructions 3400 may be partially implemented by the fault detector 910 executing the state machine 1200 of FIG. 12 to perform a protection phase of the fault detection circuit 900, 1000.

The example fault detector 910 initially identifies that the motor under protection (e.g., the three-phase motor 106 of FIGS. 1-3) is in a transient state (block 3402). For example, the fault detector 910 may begin the protection phase in the transient state 1202 of FIG. 12.

The example fault detection circuit 900, 1000 measures the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$) (block 3404). For example, the fault detector 910 may obtain the positive sequence voltage magnitude value 932 (e.g., $|V_p|$) from the positive sequence voltage magnitude calculator 902, the positive sequence current magnitude value 934 (e.g., $|I_p|$) from the positive sequence current magnitude calculator 904, and the negative sequence voltage values 936a, 936b (e.g., $V_{nd}$, $V_{nq}$) from the negative sequence voltage calculator 906, controlled by the data acquisition controller 912. Example instructions to implement block 3404 are described below with reference to FIGS. 35A-35E.

The example high pass filter 952 executes a high pass filter to filter the positive sequence voltage magnitude value 932 (e.g., $|V_p|$) to obtain a filtered positive sequence voltage magnitude value 954 (e.g., $|V_p|_{hp}$) and filters the positive sequence current magnitude value 934 (e.g., $|I_p|_{hp}$) to obtain a filtered positive sequence current magnitude value 956 (block 3406). The example fault detector 910 determines whether the filtered positive sequence voltage magnitude value 954 (e.g., $|V_p|_{hp}$) is greater than (or equal to) a threshold value (e.g., $\varepsilon_{TH}$) (block 3408). If the filtered positive sequence voltage magnitude value 954 (e.g., $|V_p|_{hp}$) is not greater than (or equal to) the threshold value (e.g., $\varepsilon_{TH}$) (block 3408), the example learner 914 determines whether the filtered positive sequence current magnitude value 956 (e.g., $|I_p|_{hp}$) is greater than (or equal to) a threshold value (e.g., $\varepsilon_{TH}$) (block 3410).

When, in the transient state 1202, either of the filtered positive sequence voltage magnitude value 954 (e.g., $|V_p|_{hp}$) is greater than (or equal to) the threshold value (e.g., $\varepsilon_{TH}$) (block 3408) or the positive sequence current magnitude value 956 (e.g., $|I_p|_{hp}$) is greater than (or equal to) a threshold value (e.g., $\varepsilon_{TH}$) (block 3410), the example fault detector 910 resets a threshold timer T (block 3412). The fault detector 910 then returns control to block 3402 to remain in the transient state 1202.

On the other hand, when the filtered positive sequence current magnitude value 956 (e.g., $|I_p|_{hp}$) is not greater than (or equal to) the threshold value (e.g., $\varepsilon_{TH}$) (block 3410), the example fault detector 910 determines whether the threshold timer has elapsed (block 3414). For example, the learner 914 may determine whether a time T counted by the threshold timer has reached a threshold time T. If the threshold timer has not elapsed (block 3414), control returns to block 3404 to repeat the measurements of the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$).

Figure 34A:
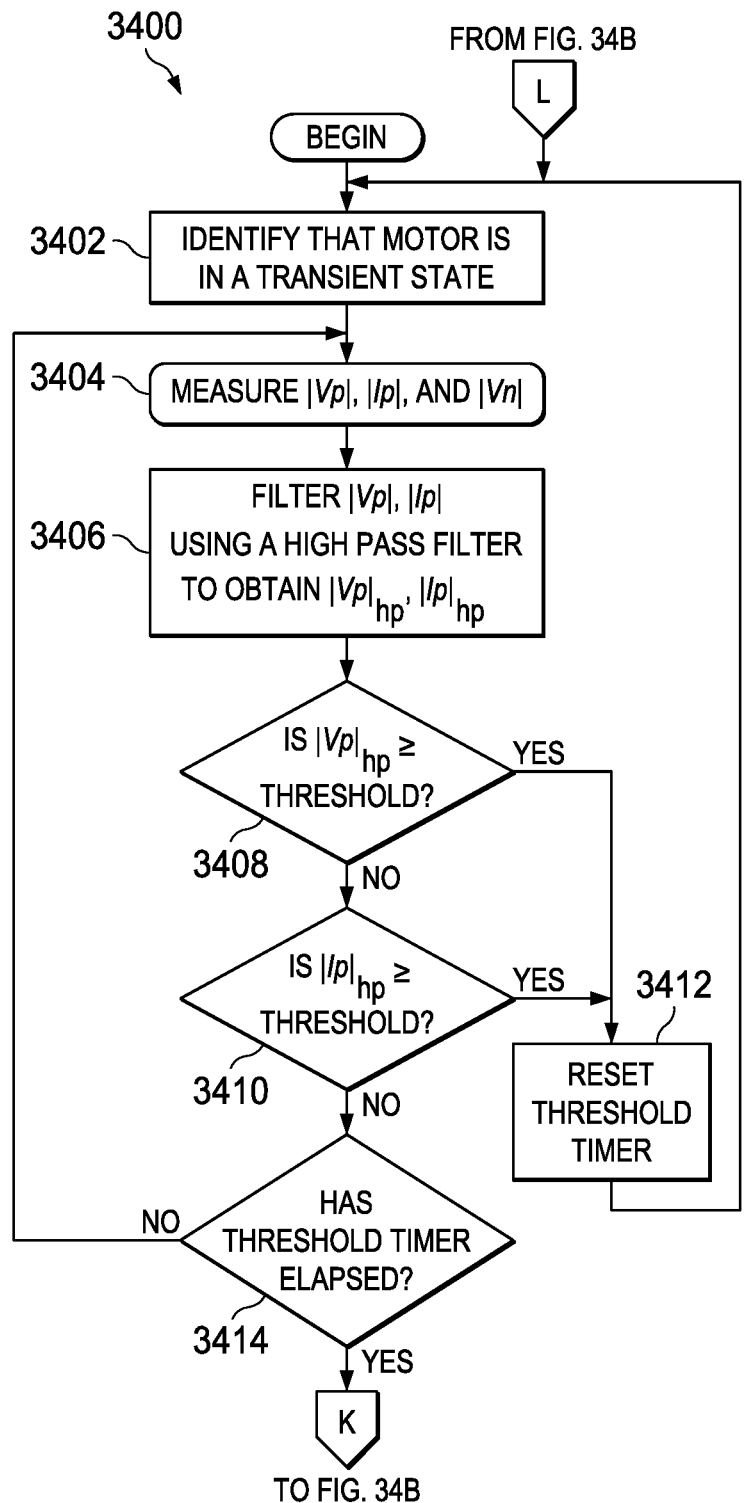
FIG. 34A-34B is a flowchart representative of example machine readable instructions which may be executed to implement the example fault detection circuits of FIGS. 9 and/or 10 to detect an winding fault in a motor during a protection phase using an equation to estimate expected negative sequence voltage values based on combinations of positive sequence voltage magnitude values and positive sequence current magnitude values.
Figure 34B:
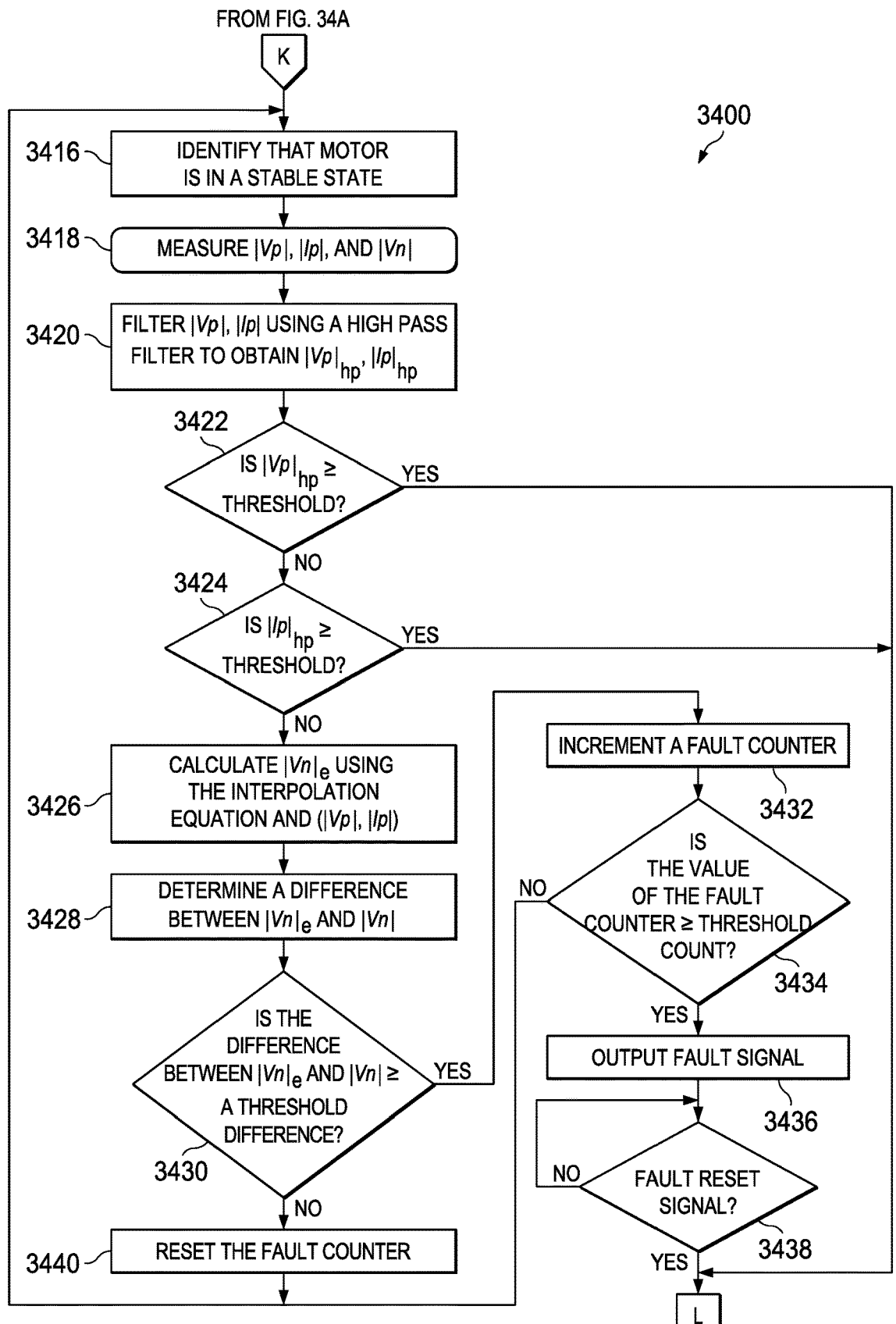

If the threshold timer has elapsed (block 3414), the example fault detector 910 identifies that the motor is in a stable state in block 3416 of FIG. 34B. The stable state of block 3416 corresponds to the stable state 1204 of FIG. 12.

The example fault detection circuit 900, 1000 measures the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$) (block 3418). For example, the fault detector 910 may obtain the positive sequence voltage magnitude value 932 (e.g., $|V_p|$) from the positive sequence voltage magnitude calculator 902, the positive sequence current magnitude value 934 (e.g., $|I_p|$) from the positive sequence current magnitude calculator 904, and the negative sequence voltage values 936a, 936b (e.g., $V_{nd}$, $V_{nq}$) from the negative sequence voltage calculator 906, controlled by the data acquisition controller 912. Example instructions to implement block 3418 are described below with reference to FIGS. 35A-35E.

The example high pass filter 952 executes a high pass filter to filter the positive sequence voltage magnitude value 932 (e.g., $|V_p|$) to obtain a filtered positive sequence voltage magnitude value 954 (e.g., $|V_p|_{hp}$) and filters the positive sequence current magnitude value 934 (e.g., $|I_p|_{hp}$) to obtain a filtered positive sequence current magnitude value 956 (block 3420). The example fault detector 910 determines whether the filtered positive sequence voltage magnitude value 954 (e.g., $|V_p|_{hp}$) is greater than (or equal to) a threshold value (e.g., $\varepsilon_{TH}$) (block 3422). If the filtered positive sequence voltage magnitude value 954 (e.g., $|V_p|_{hp}$) is not greater than (or equal to) the threshold value (e.g., $\varepsilon_{TH}$) (block 3422), the example learner 914 determines whether the filtered positive sequence current magnitude value 956 (e.g., $|I_p|_{hp}$) is greater than (or equal to) a threshold value (e.g., $\varepsilon_{TH}$) (block 3424).

When, in the stable state 1204, either of the filtered positive sequence voltage magnitude value 954 (e.g., $|V_p|_{hp}$) is greater than (or equal to) the threshold value (e.g., $\varepsilon_{TH}$) (block 3422) or the positive sequence current magnitude value 956 (e.g., $|I_p|_{hp}$) is greater than (or equal to) a threshold value (e.g., $\varepsilon_{TH}$) (block 3424), the example fault detector 910 returns control to block 3402 to return to the transient state 1202.

On the other hand, when the filtered positive sequence current magnitude value 956 (e.g., $|I_p|_{hp}$) is not greater than (or equal to) the threshold value (e.g., $\varepsilon_{TH}$) (block 3424), the example interpolator 908 calculates an expected negative sequence voltage value $V_{ne}$ (or a direct expected negative sequence voltage value 938a and quadrature expected negative sequence voltage value 938b, which are the components of the expected negative sequence voltage value $V_{ne}$) using the plane and the current operating point ($|V_p|$, $|I_p|$) (block 3426). For example, the interpolator 908 may calculate a result of the interpolation equation determined by the learner 9124 using the current operating point, including the positive sequence voltage magnitude value 932 (e.g., $|V_p|$) and the positive sequence current magnitude value 934 (e.g., $|I_p|$). In some examples, the interpolator 908 determines an amplitude of the expected negative sequence voltage value $|V_n|_e$ using the interpolation equation and calculates the direct and quadrature components of the expected negative sequence voltage value $|V_n|_e$ from the amplitude and a phase angle (e.g., the phase angle being determined from the direct and quadrature components of the positive sequence voltage magnitude calculator 902).

The example subtractors 944a, 944b determine a difference value 946 between the expected negative sequence voltage values $V_{nde}$ and $V_{nqe}$ and the measured negative sequence voltage values $V_{nd}$ and $V_{nq}$ (block 3428). The example fault detector 910 determines whether the difference value 946 is greater than or equal to a threshold difference (block 3430). If the difference value 946 is greater than or equal to a threshold difference (block 3430), the example fault detector 910 increments a fault counter (block 3432). The fault detector 910 then determines whether the value of the fault counter is greater than or equal to a threshold count (block 3434).

If the value of the fault counter is greater than or equal to a threshold count (block 3434), the example fault detector 910 outputs the fault signal 958 (block 3436). Outputting the fault signal corresponds to the example fault state 1206 of FIG. 12. The example fault signal 958 may provide an alert to a motor controller (e.g., the motor controller 110 of FIGS. 1 and/or 2) and/or to an output to alert an operator of the detected winding fault. The fault detector 910 determines whether the fault signal has been reset (block 3438). For example, the fault detector 910 may receive an input that resets a fault flag and causes the fault detector 910 to return to the transient state 1202. If the fault signal has not been reset (block 3438), the example fault detector 910 remains in the fault state 1206 and returns control to block 3438. If the fault signal has been reset (block 3438), the example fault detector returns to the transient state 1202 and returns control to block 3302.

If the difference value 946 is less than the threshold difference (block 3430), the example fault detector 910 resets the fault counter (block 3440). After resetting the fault counter (block 3440), or if the value of the fault counter is less than the threshold count (block 3434), the example fault detector 910 returns control to block 3416 and remains in the stable state 1204).

FIG. 35A-35E is a flowchart representative of example machine readable instructions 3500 which may be executed by the example fault detection circuits of FIGS. 9 and/or 10 to measure the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$).

The example instructions 3500 of FIGS. 35A-35E may be used to implement any of blocks 3110, 3130, 3210, 3234, 3304, 3318, 3404, and/or 3418 of FIGS. 31A, 31B, 32A, 32B, 33A, 33B, 34A, and/or 34B. The example instructions 3500 are described below with reference to the fault detection circuit 900 of FIG. 9, the positive sequence voltage magnitude calculator 902 of FIG. 11, the positive sequence current magnitude calculator 904 of FIG. 16, and the negative sequence voltage calculator 906 of FIG. 21. However, the example instructions 3500 may also be executed to implement the fault detection circuit 1000 by using 2 phase PWM measurements instead of 3 phase PWM measurements and using 3 phase current measurements instead of 2 phase current measurements.

The example PWM converter 968 of FIG. 9 obtains 3 phase PWM measurements (e.g., the PWM signals 120a-120c of FIGS. 1 and/or 2) (block 3502).

The PWM converter 968 converts the phase PWM measurements (e.g., the PWM signals 120a-120c) to corresponding phase voltage signals (block 3504). For example, the PWM converter 968 generates the phase voltage signals 920a-920c of FIG. 9.

The example Clarke transformer 928 obtains 2 phase current measurements (e.g., 2 of the 3 phase currents 930a, 930b, 930c of FIG. 9) (block 3506).

The example Clarke transformer 918 performs a Clarke transformation on the phase voltage signals 920a-920c to obtain an alpha voltage signal 916a and a beta voltage signal 916b (block 3508).

The example Park transformer 1102 of FIG. 11 receives the alpha voltage signal 916a and the beta voltage signal 916b and performs a Park transformation on the alpha voltage signal 916a and the beta voltage signal 916b based on the phase angle signal 960 (e.g., generated by and received from the data acquisition controller 912 of FIG. 9) to generate a direct positive sequence voltage signal 1112a and a quadrature positive sequence voltage signal 1112b (block 3510).

The example windower 1104 of FIG. 11 applies window function(s) to the direct positive sequence voltage signal 1112a and the quadrature positive sequence voltage signal 1112b based on a window phase angle signal 962 (e.g., generated by and received from the data acquisition controller 912 of FIG. 9) to generate a windowed direct positive sequence voltage signal 1114a and a windowed quadrature positive sequence voltage signal 1114b (block 3512).

The example integrator 1106 of FIG. 11 adds the windowed direct positive sequence voltage signal 1114a to an integrated direct positive sequence voltage signal 1116a (block 3514). The example integrator 1106 of FIG. 11 also adds the windowed quadrature positive sequence voltage signal 1114b to an integrated quadrature positive sequence voltage magnitude signal 1116b (block 3516).

Figure 35A:
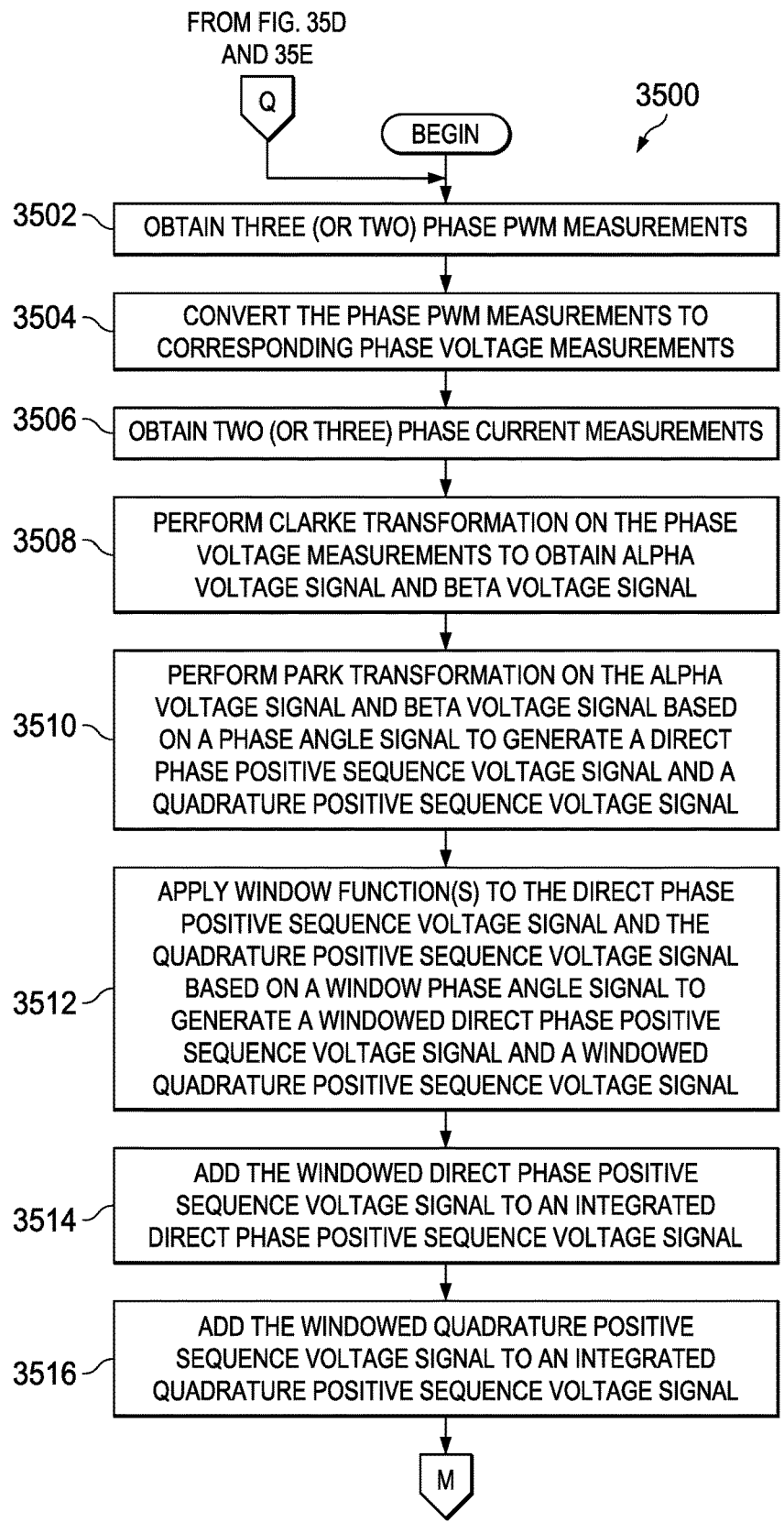
FIG. 35A-35E is a flowchart representative of example machine readable instructions which may be executed by the example fault detection circuits of FIGS. 9 and/or 10 to measure a positive sequence voltage magnitude value, a positive sequence current magnitude value, and a negative sequence voltage value.
Figure 35B:
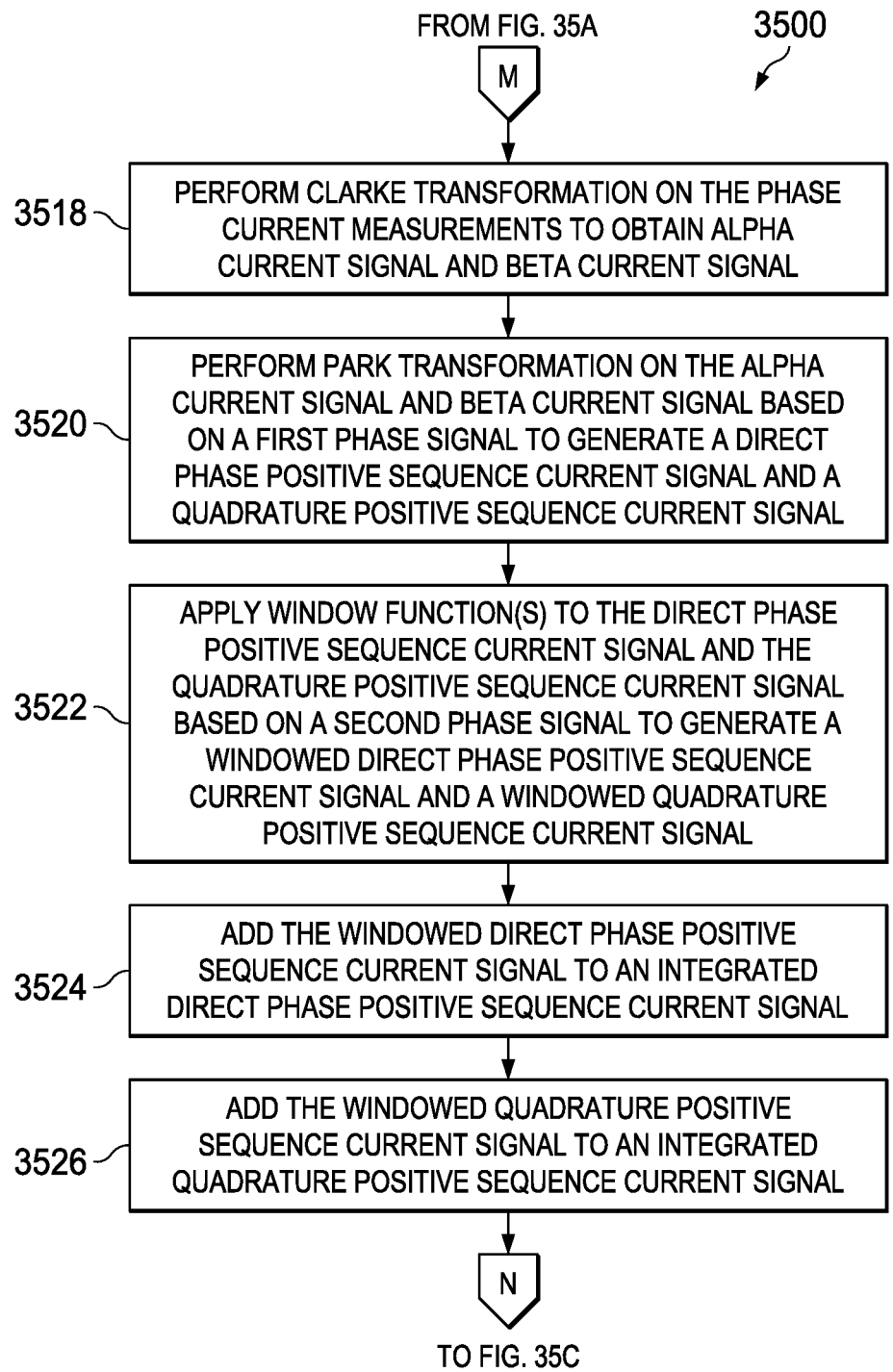

Turning to FIG. 35B, the example Clarke transformer 928 performs a Clarke transformation on the phase current signals 930a, 930b to obtain an alpha current signal 926a and a beta current signal 926b (block 3518).

The example Park transformer 1602 of FIG. 16 receives the alpha current signal 926a and the beta current signal 926b and performs a Park transformation on the alpha current signal 926a and the beta current signal 926b based on the phase angle signal 960 (e.g., generated by and received from the data acquisition controller 912 of FIG. 9) to generate a direct positive sequence current signal 1612a and a quadrature positive sequence current signal 1612b (block 3520).

The example windower 1604 of FIG. 16 applies window function(s) to the direct positive sequence current signal 1612a and a quadrature positive sequence current signal 1612b based on the window phase angle signal 962 (e.g., generated by and received from the data acquisition controller 912 of FIG. 9) to generate a windowed direct positive sequence current signal 1614a and a windowed quadrature positive sequence current signal 1614b (block 3522).

The example integrator 1606 of FIG. 16 adds the windowed direct positive sequence current signal 1614a to an integrated direct positive sequence current signal 1616a (block 3524). The example integrator 1606 of FIG. 16 also adds the windowed quadrature positive sequence current signal 1614b to an integrated quadrature positive sequence current signal 1616b (block 3526).

Figure 35C:
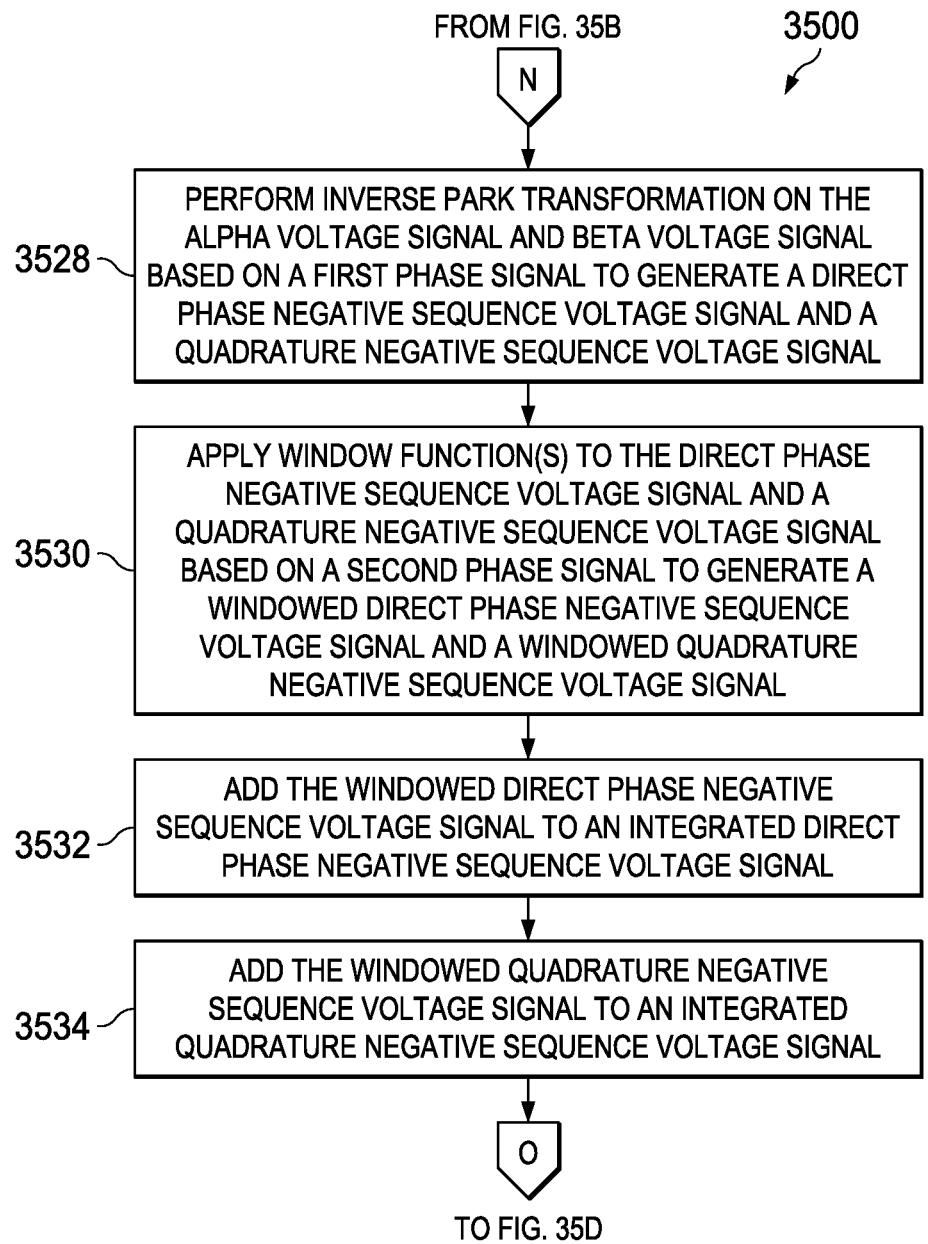

Turning to FIG. 35C, the example inverse Park transformer 2102 of FIG. 21 receives the alpha voltage signal 916a and the beta voltage signal 916b and performs an inverse Park transformation on the alpha voltage signal 916a and the beta voltage signal 916b based on the phase angle signal 960 (e.g., generated by and received from the data acquisition controller 912 of FIG. 9) to generate a direct negative sequence voltage signal 2112a and a quadrature negative sequence voltage signal 2112b (block 3528).

The example windower 2104 of FIG. 21 applies window function(s) to the direct negative sequence voltage signal 2112a and the quadrature negative sequence voltage signal 2112b based on a window phase angle signal 962 (e.g., generated by and received from the data acquisition controller 912 of FIG. 9) to generate a windowed direct negative sequence voltage signal 2114a and a windowed quadrature negative sequence voltage signal 2114b (block 3530).

The example integrator 2106 of FIG. 21 adds the windowed direct negative sequence voltage signal 2114a to an integrated direct negative sequence voltage signal 2116a (block 3532). The example integrator 2106 of FIG. 21 also adds the windowed quadrature negative sequence voltage signal 2114b to an integrated quadrature negative sequence voltage signal 2116b (block 3534).

Figure 35D:
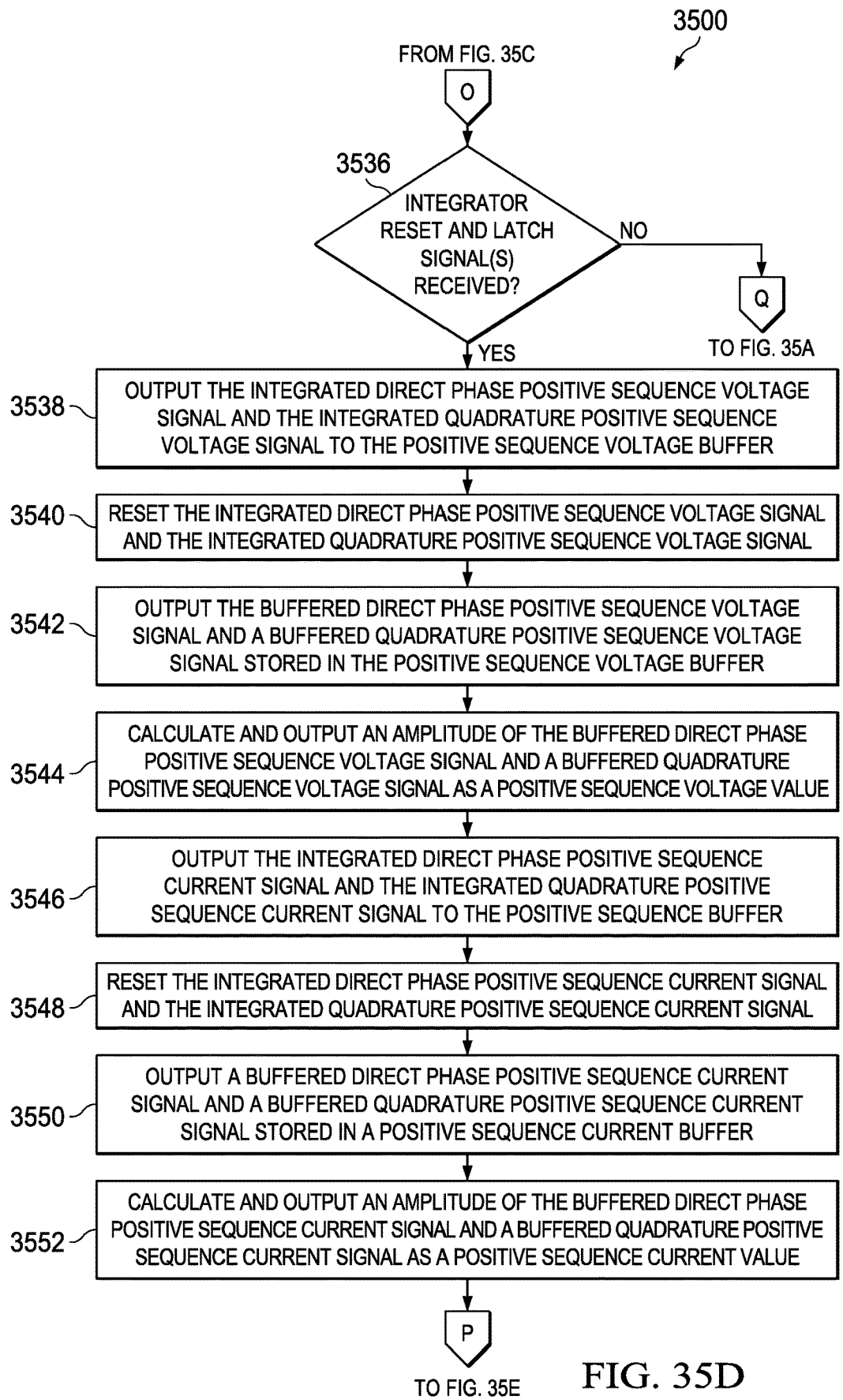

Turning to FIG. 35D, the example positive sequence voltage calculator 902, the example positive sequence current calculator 904, and/or the example negative sequence voltage calculator 906 determine whether the integrator reset signal 964 and/or the latch signal 966 have been received (e.g., from the data acquisition controller 912) (block 3536). If the integrator reset signal 964 and/or the latch signal 966 have not been received (block 3536), the example fault detection circuit 900 returns control to block 3502 to continue collecting samples.

When the integrator reset signal 964 and/or the latch signal 966 have been received (e.g., from the data acquisition controller 912) (block 3536), the example integrator 1106 outputs the integrated direct positive sequence voltage signal 1116a and the integrated quadrature positive sequence voltage signal 1116b to the positive sequence voltage buffer 1108 (block 3538). The example integrator 1106 then resets the integrated direct positive sequence voltage signal 1116a and the integrated quadrature positive sequence voltage signal 1116b (block 3540). The example positive sequence voltage buffer 1108 of FIG. 11 outputs the buffered direct positive sequence voltage signal 1118a and the buffered quadrature positive sequence voltage signal 1118b stored in a positive sequence voltage buffer (block 3542).

The example amplitude calculator 1110 calculates and outputs an amplitude of the buffered direct positive sequence voltage magnitude signal 1118a and a buffered quadrature positive sequence voltage signal 1118b as the positive sequence voltage magnitude value $|V_p|$ 932 (block 3544).

The example integrator 1606 outputs the integrated direct positive sequence current signal 1616a and the integrated quadrature positive sequence current signal 1616b to the positive sequence current buffer 1608 (block 3546). The example integrator 1606 then resets the integrated direct positive sequence current signal 1616a and the integrated quadrature positive sequence current signal 1616b (block 3548).

The example positive sequence current buffer 1608 of FIG. 16 outputs the buffered direct positive sequence current signal 1618a and the buffered quadrature positive sequence current signal 1618b stored in the positive sequence current magnitude buffer 1608 (block 3550). The example amplitude calculator 1610 calculates and outputs an amplitude of the buffered direct positive sequence current signal 1618a and a buffered quadrature positive sequence current signal 1618b as the positive sequence current magnitude value $|I_p|$ 934 (block 3552).

Figure 35E:
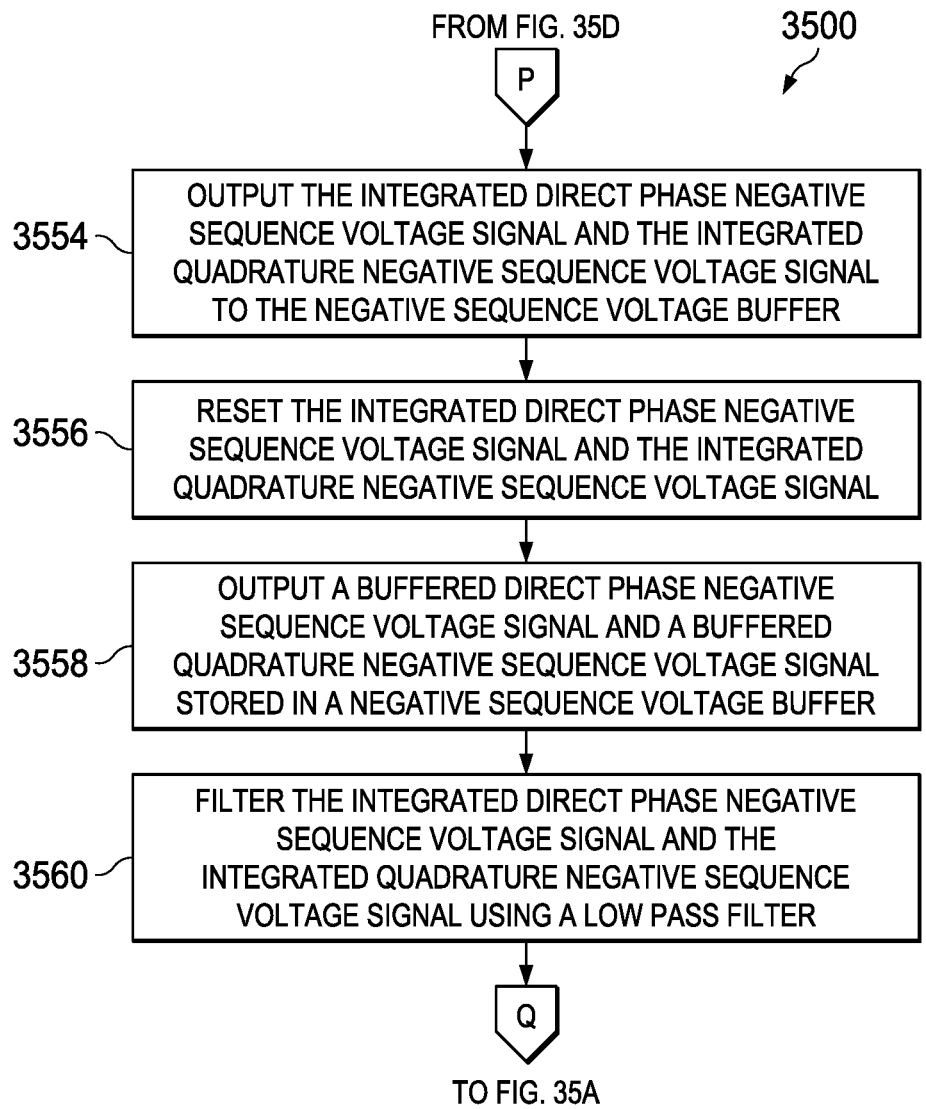

Turning to FIG. 35E, the example integrator 2106 outputs the integrated direct negative sequence voltage signal 2116a and the integrated quadrature negative sequence voltage signal 2116b to the negative sequence voltage buffer 1608 (block 3554). The example integrator 2106 then resets the integrated direct negative sequence voltage signal 2116a and the integrated quadrature negative sequence voltage 2116b (block 3556).

The example negative sequence voltage buffer 2108 of FIG. 21 outputs the buffered direct negative sequence voltage signal 2118a and the buffered quadrature negative sequence voltage signal 2118b stored in the negative sequence voltage buffer 2108 (block 3558). The example low pass filter 2110 filters the buffered direct negative sequence voltage signal 2118a and the buffered quadrature negative sequence voltage signal 2118b (block 3560). For example, the low pass filter 2110 may filter the integrated direct phase negative sequence voltage signal 2116a and the integrated quadrature negative sequence voltage signal 2116b when the signals 2116a, 2116b are obtained at the latch 2108.

The example fault detection circuit 900 returns control to block 3502 of FIG. 35A to continue collecting data.

Figure 36:
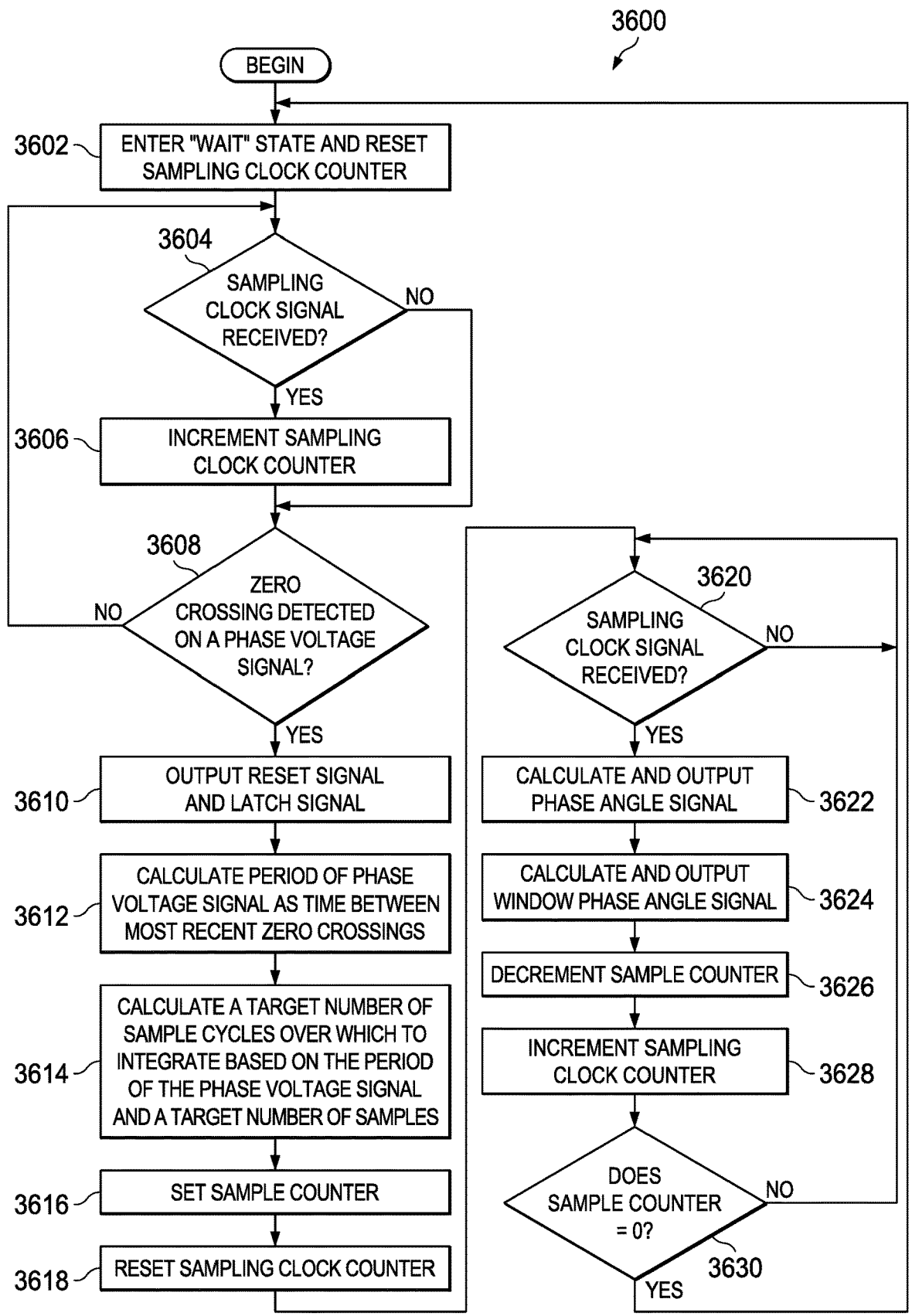
FIG. 36 is a flowchart representative of example machine readable instructions which may be executed to implement the example data acquisition controller of FIGS. 9, 10, and 26 to control measurement of positive sequence voltage magnitude values, a positive sequence current magnitude values, and a negative sequence voltage values.

FIG. 36 is a flowchart representative of example machine readable instructions which may be executed to implement the example data acquisition controller of FIGS. 9, 10, and 26 to control measurement of the positive sequence voltage magnitude value 932 (e.g., $|V_p|$), the positive sequence current magnitude value 934 (e.g., $|I_p|$), and the negative sequence voltage values 936a, 936b (e.g., $V_{nd}$, $V_{nq}$).

The example data acquisition controller 2600 of FIG. 26 enters a "wait" state, in which the data acquisition controller 2600 awaits a zero crossing on an input phase voltage signal (e.g., the phase voltage signal 920a of FIGS. 9, 10, and 26) (block 3602). When entering the "wait" state, the example sample counter 2604 resets (e.g., to a value of "0").

The sample counter 2604 determines whether a sampling clock signal 2618 (e.g., a pulse or rising edge on the sampling clock signal 2618) has been received (block 3604). When the sampling clock signal 2618 is received (block 3604), a sampling clock counter is incremented (block 3606). By incrementing the sampling clock counter, the example sample counter 2604 measures a number of sampling cycles between zero crossings.

After incrementing the sampling clock counter (block 3606), or if a sampling clock signal 2618 has not been received (block 3604), the zero crossing detector 2602 determines whether a zero crossing (e.g., a positive zero crossing) is detected on the phase voltage signal 920a (block 3608). For example, the zero crossing detector 2602 may monitor the phase voltage signal 920a and output a zero crossing signal 2616 in response to identifying a positive zero crossing. If a zero crossing is not detected (block 3608), control iterates to block 3604 to determine whether the sampling clock signal has been received.

When a zero crossing (e.g., a positive zero crossing) is detected on the phase voltage signal 920a (block 3608), the example data acquisition controller 2600 enters a "collect" state and outputs a reset signal 964 and a latch signal 966 to the positive sequence voltage magnitude calculators 902, the example positive sequence current magnitude calculators 904, and/or the example negative sequence voltage calculators 906 (block 3610).

The example angular change calculator 2606 calculates a phase period 2620 of the phase voltage signal 920a as the time (e.g., in cycles of the sampling clock signal 2618) between the two most recent zero crossing signals 2616 from the zero crossing detector 2602 (block 3612). The example window angle calculator 912 calculates a target number of sample cycles over which to integrate based on a period of the phase voltage signal 920a (e.g., calculated by the angle change calculator 2606 of FIG. 26) and a target number of samples (block 3614). In some examples, the sample counter 2604 rounds the calculated number of sample cycles to a nearest power of 2 (e.g., 1, 2, 4, 8, etc.).

The example window angle calculator 2612 sets the sample counter 2604 (block 3616). For example, the window angle calculator 2612 may set the sample counter 2604 to a product of the calculated target number of sample cycles and the number of cycles counted by the sampling clock counter. The sample counter keeps track of a number of cycles of the sampling clock signal 2618 that have occurred. The example sample counter 2604 then resets the sampling clock counter (block 3618).

The phase angle calculator 2610 and/or the window angle calculator 2612 determine whether a sampling clock signal 2618 (e.g., a pulse or rising edge on the sampling clock signal 2618) has been received (block 3620). If the sampling clock signal 2618 has not been received (block 3620), the example phase angle calculator 2610 and/or the window angle calculator 2612 return control to block 3620 to await the sampling clock signal 2618.

When the sampling clock signal 2618 is received (block 3620), the example phase angle calculator 2610 calculates and outputs a phase angle signal 960 (block 3622). For example, the phase angle calculator 2610 may increment the phase angle signal 960 by the angular rate of change 2622 when the sampling clock signal 2618 is received. The phase angle calculator 2610 outputs the phase angle signal 960 to the Park transformers 1102, 1602 of FIGS. 11 and/or 16, and to the inverse Park transformer 2102 of FIG. 21.

The window angle calculator 2612 calculates and outputs a window phase angle signal 962 (block 3624). For example, the window angle calculator 2612 may calculate the an increment value by dividing the angular rate of change 2622 by the calculated target number of cycles, and increment the window phase angle signal 962 by the increment value in response to the sampling clock signal 2618.

The example window angle calculator 2612 decrements the sample counter 2604 (block 3626). The example sample counter 2604 increments the sampling clock counter (block 3628). The example window angle calculator 2612 determines whether a value of the sample counter is equal to 0 (block 3630). If the value of the value of the sample counter is equal to 0 (block 3630), control returns to block 3602 and the data acquisition controller 2600 enters the "wait" state. If the value of the sample counter is not equal to 0 (block 3630), control returns to block 3620 to await a next sampling clock signal 2618.

Figure 37:
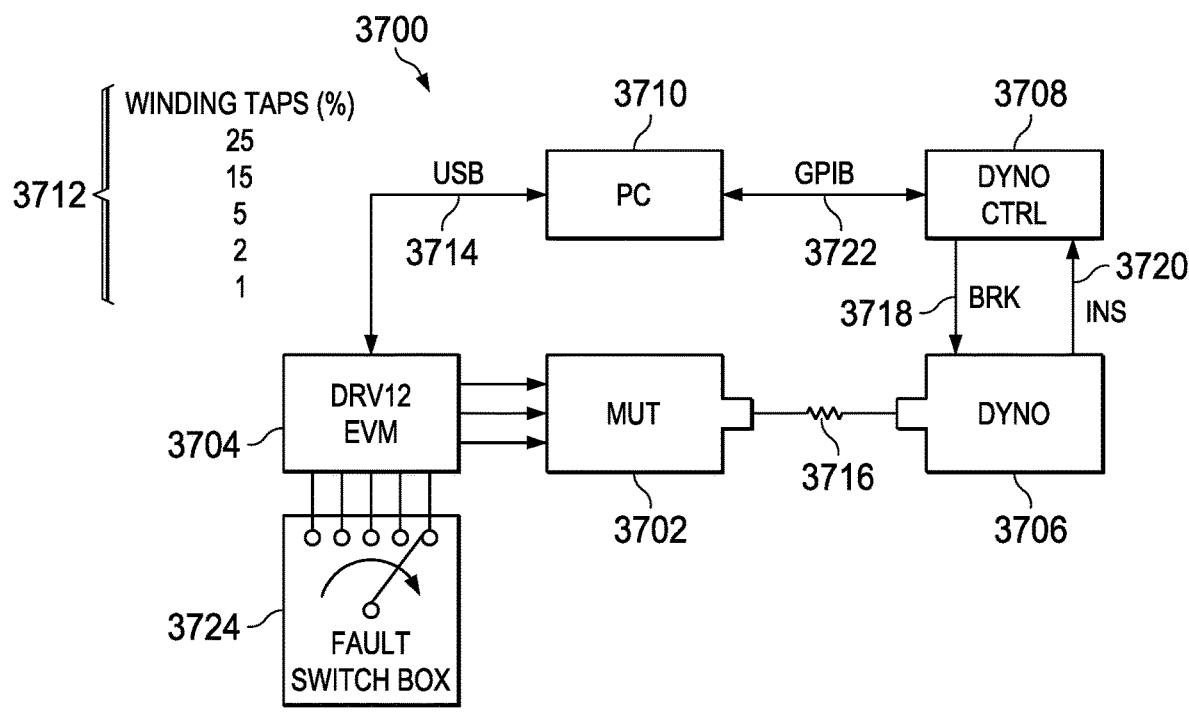
FIG. 37 is a block diagram of an example test apparatus including the example winding fault detection circuit of FIGS. 9 and/or 10 to test times to detect winding faults in a motor.

FIG. 37 is a block diagram of an example test apparatus 3700 including the example fault detection circuit 900, 1000 of FIGS. 9 and/or 10 to test a detection of winding faults in a motor 3702. The example test apparatus 3700 of FIG. 37 includes a motor driver 3704 implementing the fault detection circuit 900, a dynamometer 3706, a dynamometer controller 3708, and a controller 3710.

The example motor 3702 is a wye-connected three-phase brushless direct current (DC) electric motor constructed with multiple winding taps shown in the table 3712 of FIG. 37. These taps represent the number of turns from the neutral point. Besides connecting a tap to neutral, it is possible to connect tap to tap to generate other fault levels. For example, a 3% fault can be created by connecting the 9% to the 2% tap or the 4% tap to the 1% tap. As shown in the table 3712, the motor 3702 has taps at 1%, 2%, 9%, 15%, and 25% of the windings, relative to the neutral point of the three-phases.

The motor driver 3704 is a Texas Instruments' DRV12F642 EVM inverter board, which is connected to the controller 3710 (e.g., a personal computer) via a bus 3714 such as a USB cable. The dynamometer 3706 of FIG. 37 is a Magtrol HD-705-6N dynamometer, which is connected to the motor 3702 via a flexible coupling 3716. A brake port 3718 and an instrumentation port 3720 of the dyno are connected via cables to the dynamometer controller 3708, which is a Magtrol Model DSP6001 dynamometer controller. The dynamometer controller 3708 is connected to the controller through a general purpose interface bus (GPIB) interface 3722.

Speed and load robustness testing was conducted through a LabView-based ATE (Automatic Test Equipment) residing on the controller 3710 (a host PC). The controller 3710 recorded data across 3 speeds (500, 1000, and 1500 RPM) and 16 loads (1, 2, 3, 4, 9, 11, and 16 lb-in). Each data point included the positive sequence current magnitude and positive sequence voltage magnitude magnitudes, and the negative sequence voltage components. To accomplish this, the controller 3710 sent speed commands via the ATE through the USB cable 3714 to the motor driver 3704 and torque commands to the dynamometer 3706 controlled via the GPIB interface 3722. At each load, speed operating point, the controller 3710 would direct the motor driver 3704 to record 11 data points 10 seconds apart. A fault switch 3724 connected to the taps of the motor 3702 enables creation of various faults by connecting one or more of the taps to the neutral reference and/or connecting two or more of the taps together.

Figure 38:
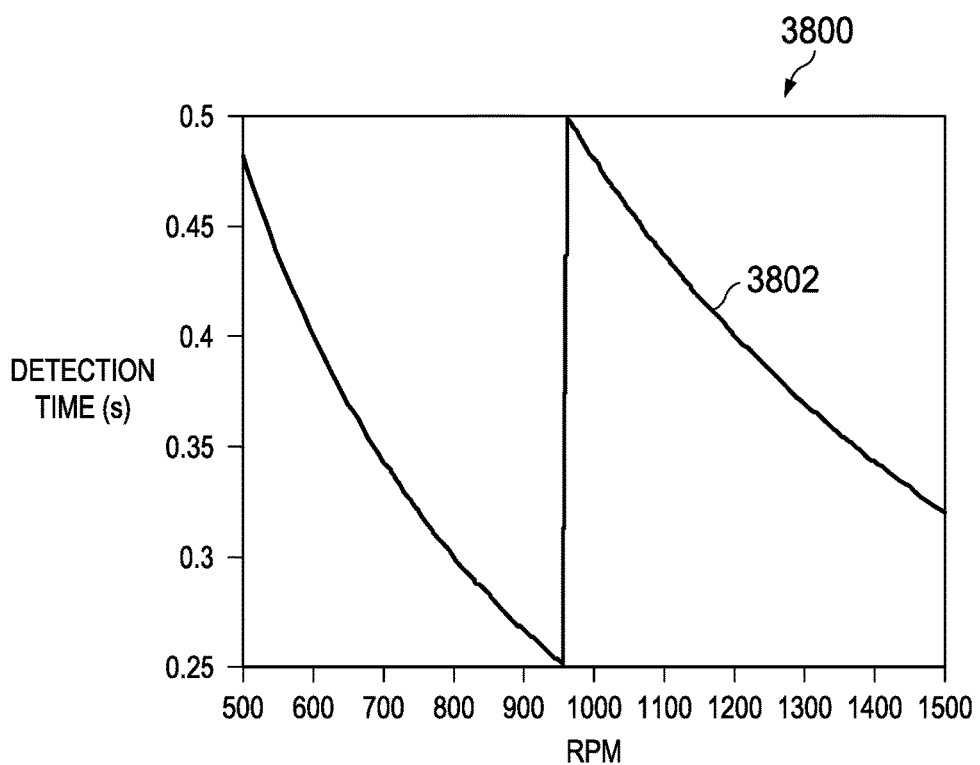
FIG. 38 illustrates example time periods required by the example winding fault detection circuit in the test apparatus of FIG. 37 to detect an winding fault in a motor following simulation of the winding fault in the motor.

FIG. 38 is a graph 3800 of example time periods 3802 required by the example fault detection circuit 900 used in the test apparatus 3700 of FIG. 37 to detect an winding fault in the motor 3702 following simulation of the winding fault in the motor 3702.

The fault detection time is a product of the electrical cycle time and the number of integration cycles used by the fault detection circuit. The number of integration cycles is increased at higher speeds to ensure that a sufficient number are used in the sequence calculation. The detection time $T_d$ is given by the following Equations 12 and 13:

$$T_s = \frac{60 f_{PWM}}{RPM \cdot n_p} \qquad \text{Equation 12}$$

$$T_d = 2 \cdot 2^{\log_2\left(\left\lceil \frac{n_{targ}}{T_s} \right\rceil\right)} \cdot T_s \qquad \text{Equation 13}$$

In Equations 12 and 13, $f_{PWM}$ is the PWM frequency in Hertz, $n_p$ is the motor pole pairs, RPM is the rotations per minute of the motor 3702, $n_{targ}$ is the target number of samples for integration in the fault detection circuit 900, and ⌈ ⌉ refers to the ceiling operator (e.g., round up to nearest integer). The signal detection time for the fault detection circuit 900 in the test setup shown in FIG. 37 is shown in FIG. 38 as a function of the RPM of the motor 3702, and varies between 0.25 and 0.50 seconds. The detection time can be adjusted by varying the target number of samples $n_{targ}$ used by the fault detection circuit 900, at a cost of reduced sensitivity and/or increased false positives.

Figure 39:
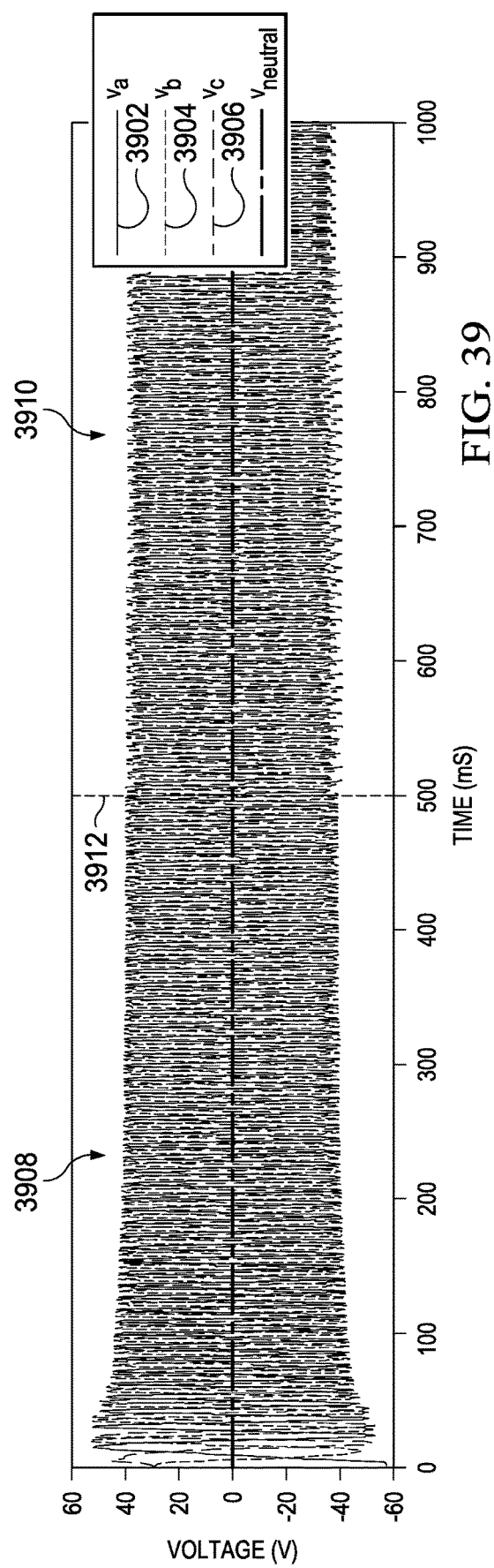
FIG. 39 illustrates example phase voltages of an example three-phase motor before, during, and after an example winding fault is simulated in the example test apparatus of FIG. 37.

FIG. 39 illustrates example phase voltages 3902, 3904, 3906 of the three-phase motor 3702 before 3908 and after 3910 an example winding fault is created in the example test apparatus 3700 of FIG. 37. As shown in FIG. 39, during the period before 3908 the winding fault is invoked at time 3912, the phase voltages 3902, 3904, 3906 are balanced and having nearly identical amplitudes. In the period after 3910 the winding fault is invoked at time 3912, the phase voltages 3902, 3904, 3906 are noticeably unbalanced.

Figure 40:
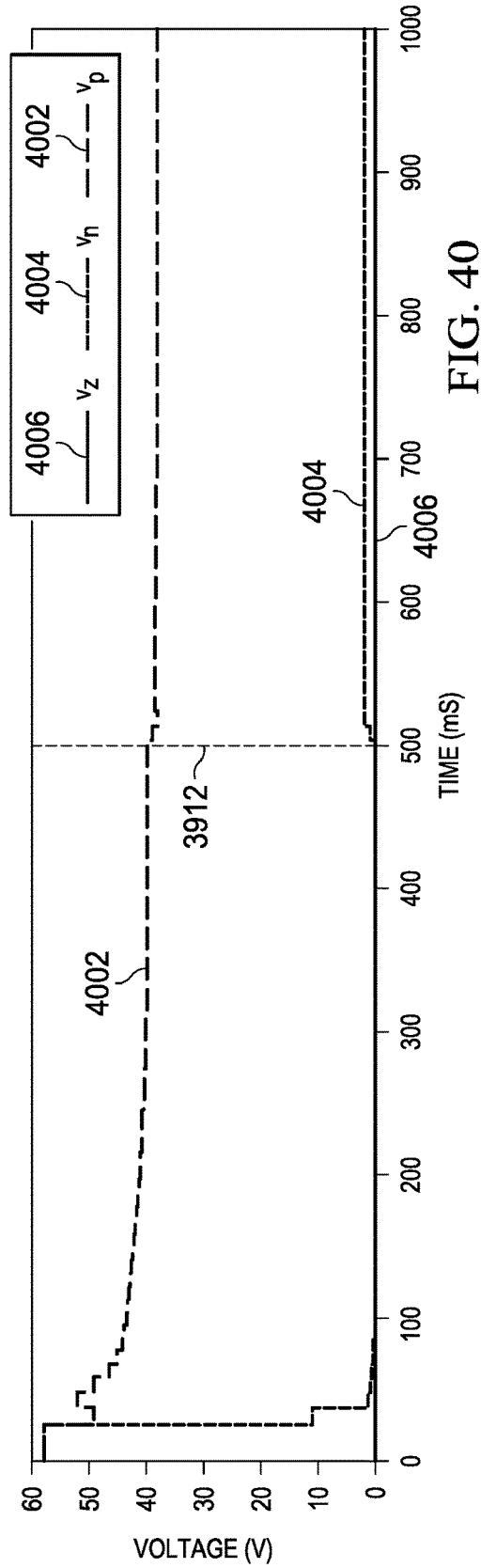
FIG. 40 illustrates example an example positive phase sequence, an example negative phase sequence, and an example zero phase sequence representative of the phase voltages of FIG. 39 before, during, and after the simulated winding fault in the example test apparatus of FIG. 37.

FIG. 40 illustrates example an example positive phase sequence 4002, an example negative phase sequence 4004, and an example zero phase sequence 4006 representative of the phase voltages 3902, 3904, 3906 of FIG. 39 before, during, and after the simulated winding fault at time 3822 in FIG. 39 in the example test apparatus 3700 of FIG. 37. As shown in FIG. 40, at the time 3912 of the winding fault the positive phase sequence 4002 is decreased and the negative phase sequence 4004 is increased due to the winding fault. The example fault detection circuit 900 of FIG. 9 detects the increase in the negative phase sequence 4004 as described herein to detect the winding faults.

Figure 41:
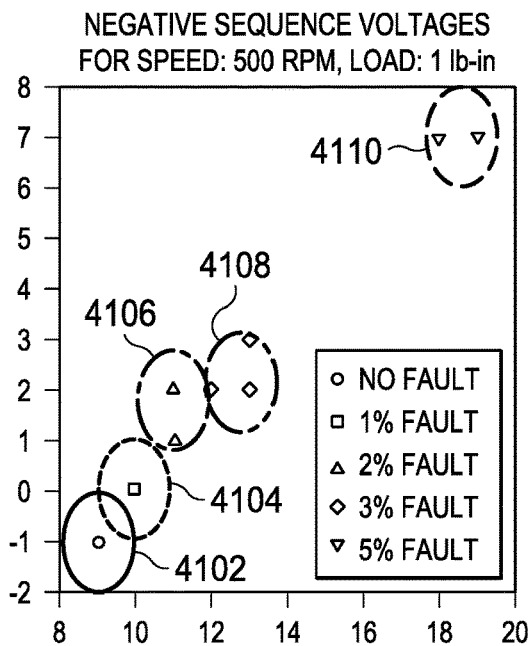
FIGS. 41-44 illustrate example negative sequence voltages at selected motor speeds and motor loads performed using the test apparatus of FIG. 37.

FIGS. 41-44 illustrate example negative sequence voltages at various motor speeds and motor loads performed using the test apparatus of FIG. 37. FIG. 41 illustrates example groups of negative sequence voltages at a motor speed of 500 RPM and a load of 1 lb-in, with no winding faults 4102, a 1% winding fault 4104, a 2% winding fault 4106, a 3% winding fault 4108, and a 5% winding fault 4110. As shown in FIG. 41, the 2% winding fault 4106, the 3% winding fault 4108, and the 5% winding fault 4110 are clearly distinguishable from no winding fault 4102.

Figure 42:
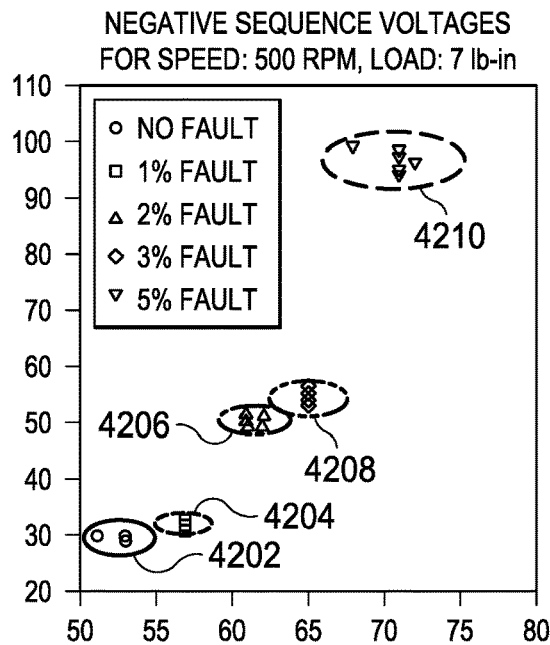

FIG. 42 illustrates example groups of negative sequence voltages at a motor speed of 500 RPM and a load of 16 lb-in, with no winding faults 4202, a 1% winding fault 4204, a 2% winding fault 4206, a 3% winding fault 4208, and a 5% winding fault 4210. As shown in FIG. 42, the 1% winding fault 4204, the 2% winding fault 4206, the 3% winding fault 4208, and the 5% winding fault 4210 are clearly distinguishable from no winding fault 4202.

Figure 43:
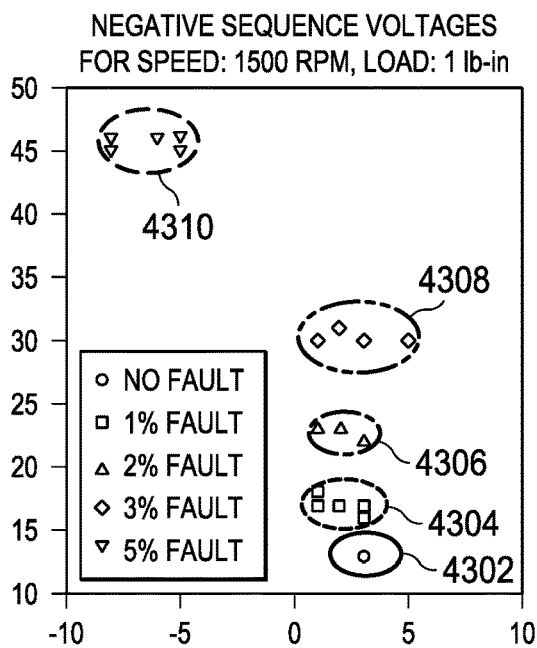

FIG. 43 illustrates example groups of negative sequence voltages at a motor speed of 1500 RPM and a load of 1 lb-in, with no winding faults 4302, a 1% winding fault 4304, a 2% winding fault 4306, a 3% winding fault 4308, and a 5% winding fault 4400. As shown in FIG. 43, the 1% winding fault 4304, the 2% winding fault 4306, the 3% winding fault 4308, and the 5% winding fault 4310 are clearly distinguishable from no winding fault 4302.

Figure 44:
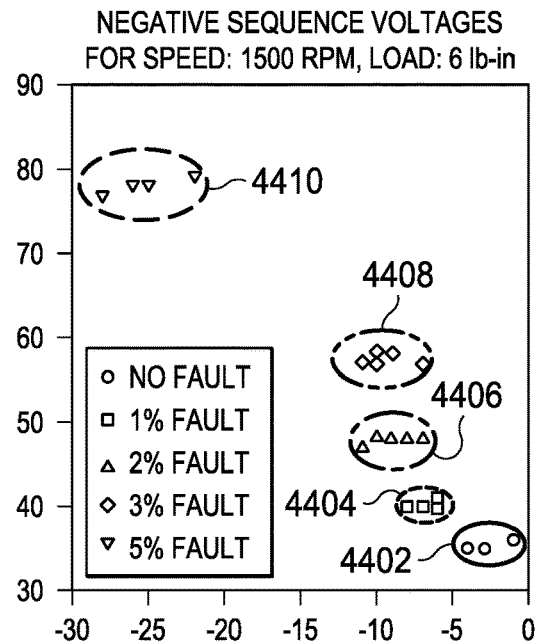

FIG. 44 illustrates example groups of negative sequence voltages at a motor speed of 1500 RPM and a load of 16 lb-in, with no winding faults 4402, a 1% winding fault 4404, a 2% winding fault 4406, a 3% winding fault 4408, and a 5% winding fault 4410. As shown in FIG. 44, the 1% winding fault 4404, the 2% winding fault 4406, the 3% winding fault 4408, and the 9% winding fault 4410 are clearly distinguishable from no winding fault 4402.

Figure 45:
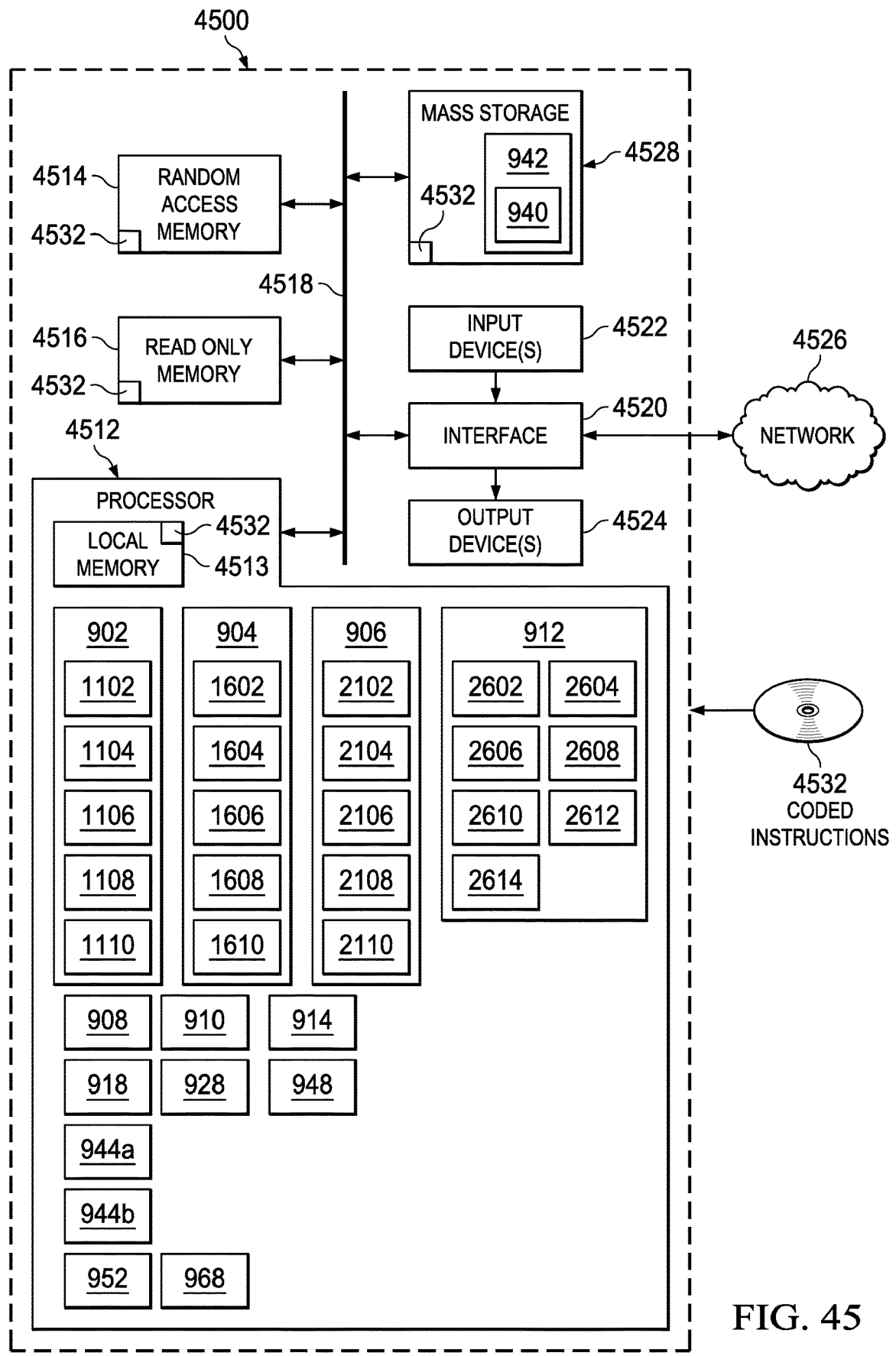
FIG. 45 is a block diagram of an example processor platform capable of executing the instructions of FIGS. 31A-31B, 32A-32B, 33A-33B, 34A-34B, 35A-35E, and 36 to implement the apparatus disclosed in FIGS. 9, 11, 16, 21, and 26.

FIG. 45 is a block diagram of an example processor platform 4500 capable of executing the instructions of FIGS. 31A-31B, 32A-32B, 33A-33B, 34A-34B, 35A-35E, and 36 to implement the positive sequence voltage magnitude calculators 902, the example positive sequence current magnitude calculators 904, the example negative sequence voltage calculators 906, the example interpolator 908, the example fault detector 910, the example data acquisition controllers 912, 2600, the example learner 914, the example Clarke transformers 918, 928, the example baseline table 940, the example storage device 942, the example subtractors 944a, 944b, the example amplitude calculators 948, 1110, 1610, the example high pass filter 952, the example Park transformers 1102, 1602, the example windowers 1104, 1604, 2104, the example integrators 1106, 1606, 2106, the example positive sequence voltage magnitude buffer 1108, the example positive sequence current magnitude buffer 1608, the example negative sequence voltage buffer 2108, the example low pass filter 2110, the example zero crossing detector 2602, the example angular change calculator 2606, the example sample counter 2604, the example sampling clock 2608, the example phase angle calculator 2610, the example window angle calculator 2612, and/or the example reset trigger 2614 of FIGS. 9, 11, 16, 21, and 26. The processor platform 4500 can be, for example, a server, a personal computer, or any other type of computing device.

The processor platform 4500 of the illustrated example includes a processor 4512. The processor 4512 of the illustrated example is hardware. For example, the processor 4512 can be implemented by one or more integrated circuits, logic circuits, microprocessors or controllers from any desired family or manufacturer. The example processor platform 4500 may implement the example positive sequence voltage magnitude calculators 902, the example positive sequence current magnitude calculators 904, the example negative sequence voltage calculators 906, the example interpolator 908, the example fault detector 910, the example data acquisition controllers 912, 2600, the example learner 914, the example Clarke transformers 918, 928, the example subtractors 944a, 944b, the example amplitude calculators 948, 1110, 1610, the example high pass filter 952, the example Park transformers 1102, 1602, the example windowers 1104, 1604, 2104, the example integrators 1106, 1606, 2106, the example positive sequence voltage magnitude buffer 1108, the example positive sequence current magnitude buffer 1608, the example negative sequence voltage buffer 2108, the example low pass filter 2110, the example zero crossing detector 2602, the example angular change calculator 2606, the example sample counter 2604, the example sampling clock 2608, the example phase angle calculator 2610, the example window angle calculator 2612, and/or the example reset trigger 2614

The processor 4512 of the illustrated example includes a local memory 4513 (e.g., a cache). The processor 4512 of the illustrated example is in communication with a main memory including a volatile memory 4514 and a non-volatile memory 4516 via a bus 4518. The volatile memory 4514 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 4516 may be implemented by flash memory and/or any other desired type of memory device. Access to the main memory 4514, 4516 is controlled by a memory controller.

The processor platform 4500 of the illustrated example also includes an interface circuit 4520. The interface circuit 4520 may be implemented by any type of interface standard, such as an Ethernet interface, a universal serial bus (USB), and/or a PCI express interface.

In the illustrated example, one or more input devices 4522 are connected to the interface circuit 4520. The input device(s) 4522 permit(s) a user to enter data and commands into the processor 4512. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 4524 are also connected to the interface circuit 4520 of the illustrated example. The output devices 4524 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 4520 of the illustrated example, thus, typically includes a graphics driver card, a graphics driver chip or a graphics driver processor.

The interface circuit 4520 of the illustrated example also includes a communication device such as a transmitter, a receiver, a transceiver, a modem and/or network interface card to facilitate exchange of data with external machines (e.g., computing devices of any kind) via a network 4526 (e.g., an Ethernet connection, a digital subscriber line (DSL), a telephone line, coaxial cable, a cellular telephone system, etc.).

The processor platform 4500 of the illustrated example also includes one or more mass storage devices 4528 for storing software and/or data. Examples of such mass storage devices 4528 include floppy disk drives, hard drive disks, compact disk drives, Blu-ray disk drives, RAID systems, and digital versatile disk (DVD) drives. The example mass storage devices 4528 of FIG. 45 may implement the example baseline table 940 and/or the example storage device 942.

The coded instructions 4532 of FIGS. 31A-31B, 32A-32B, 33A-33B, 34A-34B, 35A-35E, and 36 may be stored in the mass storage device 4528, in the volatile memory 4514, in the non-volatile memory 4516, and/or on a removable tangible computer readable storage medium such as a CD or DVD.

Figure 46:
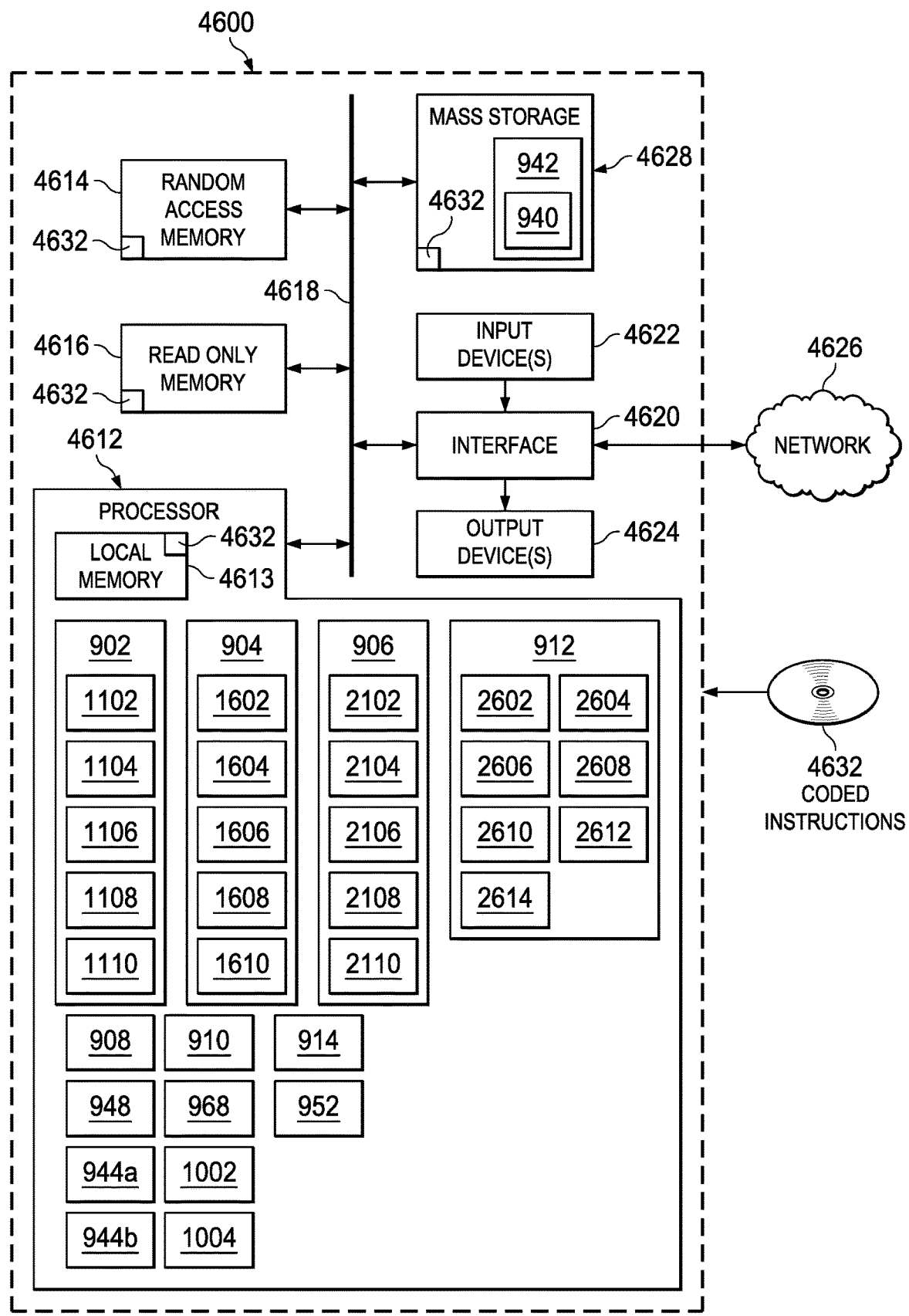
FIG. 46 is a block diagram of another example processor platform capable of executing the instructions of FIGS. 31A-31B, 32A-32B, 33A-33B, 34A-34B, 35A-35E, and 36 to implement the apparatus disclosed in FIGS. 10, 11, 16, 21, and 26.

FIG. 46 is a block diagram of an example processor platform 4600 capable of executing the instructions of FIGS. 31A-31B, 32A-32B, 33A-33B, 34A-34B, 35A-35E, and 36 to implement the positive sequence voltage magnitude calculators 902, the example positive sequence current magnitude calculators 904, the example negative sequence voltage calculators 906, the example interpolator 908, the example fault detector 910, the example data acquisition controllers 912, 2600, the example learner 914, the example Clarke transformers 918, 928, the example baseline table 940, the example storage device 942, the example subtractors 944a, 944b, the example amplitude calculators 948, 1110, 1610, the example high pass filter 952, the example Park transformers 1102, 1602, the example windowers 1104, 1604, 2104, the example integrators 1106, 1606, 2106, the example positive sequence voltage buffer 1108, the example positive sequence current buffer 1608, the example negative sequence voltage buffer 2108, the example low pass filter 2110, the example zero crossing detector 2602, the example angular change calculator 2606, the example sample counter 2604, the example sampling clock 2608, the example phase angle calculator 2610, the example window angle calculator 2612, and/or the example reset trigger 2614 of FIGS. 10, 11, 16, 21, and 26. The processor platform 4600 can be, for example, a server, a personal computer, or any other type of computing device.

The processor platform 4600 of the illustrated example includes a processor 4612. The processor 4612 of the illustrated example is hardware. For example, the processor 4612 can be implemented by one or more integrated circuits, logic circuits, microprocessors or controllers from any desired family or manufacturer.

The processor 4612 of the illustrated example includes a local memory 4613 (e.g., a cache). The processor 4612 of the illustrated example is in communication with a main memory including a volatile memory 4614 and a non-volatile memory 4616 via a bus 4618. The volatile memory 4614 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 4616 may be implemented by flash memory and/or any other desired type of memory device. Access to the main memory 4614, 4616 is controlled by a memory controller.

The processor platform 4600 of the illustrated example also includes an interface circuit 4620. The interface circuit 4620 may be implemented by any type of interface standard, such as an Ethernet interface, a universal serial bus (USB), and/or a PCI express interface.

In the illustrated example, one or more input devices 4622 are connected to the interface circuit 4620. The input device(s) 4622 permit(s) a user to enter data and commands into the processor 4612. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 4624 are also connected to the interface circuit 4620 of the illustrated example. The output devices 4624 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 4620 of the illustrated example, thus, typically includes a graphics driver card, a graphics driver chip or a graphics driver processor.

The interface circuit 4620 of the illustrated example also includes a communication device such as a transmitter, a receiver, a transceiver, a modem and/or network interface card to facilitate exchange of data with external machines (e.g., computing devices of any kind) via a network 4626 (e.g., an Ethernet connection, a digital subscriber line (DSL), a telephone line, coaxial cable, a cellular telephone system, etc.).

The processor platform 4600 of the illustrated example also includes one or more mass storage devices 4628 for storing software and/or data. Examples of such mass storage devices 4628 include floppy disk drives, hard drive disks, compact disk drives, Blu-ray disk drives, RAID systems, and digital versatile disk (DVD) drives. The example mass storage devices 4628 of FIG. 46 may implement the example baseline table 940 and/or the example storage device 942.

The coded instructions 4632 of FIGS. 31A-31B, 32A-32B, 33A-33B, 34A-34B, 35A-35E, and 36 may be stored in the mass storage device 4628, in the volatile memory 4614, in the non-volatile memory 4616, and/or on a removable tangible computer readable storage medium such as a CD or DVD.

Modifications are possible in the described embodiments, and other embodiments are possible, within the scope of the claims.

What is claimed is:

1. A fault detection circuit, comprising:
   first circuitry having voltage inputs, an alpha voltage output and a beta voltage output, the first circuitry configured to provide an alpha voltage signal at the alpha voltage output and a beta voltage signal at the beta voltage output, responsive to a Clarke transform of multi-phase voltage signals at the voltage inputs;
   second circuitry having current inputs, an alpha current output and a beta current output, the second circuitry configured to provide an alpha current signal at the alpha current output and a beta current signal at the beta current output, responsive to a Clarke transform of multi-phase current signals at the current inputs;
   a first calculator having first calculator inputs and a first calculator output, the first calculator inputs coupled to the alpha voltage output and the beta voltage output, and the first calculator configured to provide a positive sequence voltage value at the first calculator output responsive to the alpha voltage signal and the beta voltage signal;
   a second calculator having second calculator inputs and a second calculator output, the second calculator inputs coupled to the alpha current output and the beta current output, and the second calculator configured to provide a positive sequence current value at the second calculator output responsive to the alpha current signal and the beta current signal;
   an interpolator having interpolator inputs and an interpolator output, the interpolator inputs coupled to the first calculator output and the second calculator output, and the interpolator configured to provide an estimated negative sequence voltage value at the interpolator output, responsive to the positive sequence voltage value, the positive sequence current value and measured characteristics;
   a third calculator having third calculator inputs and a third calculator output, the third calculator inputs coupled to the alpha voltage output and the beta voltage output, and the third calculator configured to provide a measured negative sequence voltage value at the third calculator output responsive to the alpha voltage signal and the beta voltage signal; and
   a fault detector having detector inputs and a detector output, the detector inputs coupled to the interpolator output and the third calculator output, and the fault detector configured to detect existence of a motor winding fault responsive to a difference between the estimated negative sequence voltage value and the measured negative sequence voltage value.

2. The fault detection circuit of claim 1, further comprising a learner circuit configured to store training negative sequence voltage values corresponding to combinations of training positive sequence voltage values and training positive sequence current values, the interpolator configured to provide the estimated negative sequence voltage value responsive to the training negative sequence voltage values, the training positive sequence voltage values, and the training positive sequence current values.

3. The fault detection circuit of claim 2, wherein the interpolator is configured to provide the estimated negative sequence voltage value by:
identifying one of the combinations of the training positive sequence voltage values and the training positive sequence current values responsive to the positive sequence voltage value and the positive sequence current value; and
interpolating the estimated negative sequence voltage value responsive to one of the training negative sequence voltage values corresponding to the identified combination.

4. The fault detection circuit of claim 2, wherein the interpolator is configured to provide the estimated negative sequence voltage value by:
identifying three or more of the combinations of the training positive sequence voltage values and the training positive sequence current values responsive to the positive sequence voltage value and the positive sequence current value; and
interpolating the estimated negative sequence voltage value responsive to three or more of the training negative sequence voltage values corresponding to the identified combinations.

5. The fault detection circuit of claim 2, wherein the learner circuit is configured to store the training negative sequence voltage values only while first measured changes in the training positive sequence voltage values are less than a first threshold, and second measured changes in the training positive sequence current values are less than a second threshold.

6. The fault detection circuit of claim 5, wherein the learner circuit is configured to enter a transient state when the first measured changes are greater than the first threshold or when the second measured changes are greater than the second threshold, and is configured to not store training negative sequence voltage values while in the transient state.

7. The fault detection circuit of claim 1, wherein the fault detector is configured to: enter a transient state when first measured changes in a set of positive sequence voltage values are greater than a first threshold or when second measured changes in a set of positive sequence current values are greater than a second threshold; detect existence of the motor winding fault only while the first measured changes are less than the first threshold and the second measured changes are less than the second threshold; and not detect existence of the winding fault while in the transient state.

8. The fault detection circuit of claim 1, further comprising a learner circuit configured to calculate a relationship between negative sequence voltage values, training positive sequence voltage values, and training positive sequence current values, in which detecting existence of the motor winding fault is based on the relationship.

9. The fault detection circuit of claim 8, wherein the interpolator is configured to provide the estimated negative sequence voltage value responsive to the relationship, the positive sequence voltage value, and the positive sequence current value.

10. The fault detection circuit of claim 1, further comprising a data acquisition controller configured to control the first, second and third calculators.

11. The fault detection circuit of claim 10, wherein the data acquisition controller is configured to control a number of samples of a phase voltage used by the first calculator to provide the positive sequence voltage value.

12. The fault detection circuit of claim 1, further comprising a pulse width modulation converter configured to receive a pulse width modulation signal and to generate a phase voltage responsive to the pulse width modulation signal, in which the first calculator is configured to provide the positive sequence voltage value responsive to the phase voltage.

13. The fault detection circuit of claim 1, wherein the estimated negative sequence voltage value is an estimated quadrature negative sequence voltage value.

14. The fault detection circuit of claim 1, wherein the measured negative sequence voltage value is a measured quadrature negative sequence voltage value.

15. The fault detection circuit of claim 1, wherein the estimated negative sequence voltage value is an estimated quadrature negative sequence voltage value, and the measured negative sequence voltage value is a measured quadrature negative sequence voltage value.

16. The fault detection circuit of claim 1, wherein the measured characteristics are training data.

17. A fault detection circuit, comprising:
first Clarke transform circuitry having multi-phase voltage signals as a first input, and having an alpha voltage signal as a first output, and having a beta voltage signal as a second output;
a positive sequence voltage calculator having the alpha voltage signal as a second input, and having the beta voltage signal as a third input, and having a positive sequence voltage value as a third output;
a negative sequence voltage calculator having the alpha voltage signal as a fourth input, and having the beta voltage signal as a fifth input, and having a direct negative sequence voltage value as a fourth output, and having a quadrature negative sequence voltage value as a fifth output;
second Clarke transform circuitry having multi-phase current signals as a sixth input, and having an alpha current signal as a sixth output, and having a beta current signal as a seventh output;
a positive sequence current calculator having the alpha current signal as a seventh input, and having the beta current signal as an eighth input, and having a positive sequence current value as an eighth output;
an interpolator having the positive sequence voltage value as a ninth input, the positive sequence current value as a tenth input, and a baseline table as an eleventh input, the interpolator configured to provide an estimated direct negative sequence voltage value as a ninth output and an estimated quadrature negative sequence voltage value as a tenth output, based on training data stored in the baseline table, the positive sequence voltage value and the positive sequence current value;
a first subtractor having the direct negative sequence voltage value as a twelfth input and the estimated direct negative sequence voltage value as a thirteenth input, the first subtractor configured to provide a first difference value between the direct negative sequence voltage value and the estimated direct negative sequence voltage value as an eleventh output;
a second subtractor having the quadrature negative sequence voltage value as a fourteenth input and the estimated quadrature negative sequence voltage value as a fifteenth input, the second subtractor configured to provide a second difference value between the quadrature negative sequence voltage value and the estimated quadrature negative sequence voltage value as a twelfth output;

an amplitude calculator having the first difference value as a sixteenth input and the second difference value as a seventeenth input, the amplitude calculator configured to provide an amplitude of the first and second difference values as a thirteenth output; and a fault detector having the amplitude as an eighteenth input and configured to provide a fault detection signal as a fourteenth output responsive to the amplitude satisfying a threshold.

* * * * *